(12) United States Patent
Thom et al.

(10) Patent No.: US 8,441,329 B2
(45) Date of Patent: May 14, 2013

(54) INPUT/OUTPUT SYSTEM AND DEVICES FOR USE WITH SUPERCONDUCTING DEVICES

(75) Inventors: Murray C. Thom, Vancouver (CA); Andrew Berkley, Vancouver (CA); Alexander M. Tcaciuc, New Westminster (CA); Mark Johnson, Vancouver (CA); Paul Bunyk, Vancouver (CA); Jaspaul Chung, New Westminster (CA); Jacob Craig Petroff, Vancouver (CA); Florin Cioata, Surrey (CA)

(73) Assignee: D-Wave Systems Inc., Burnaby (CA)

( * ) Notice: Subject to any disclaimer, the term of this patent is extended or adjusted under 35 U.S.C. 154(b) by 1476 days.

(21) Appl. No.: 12/016,801

(22) Filed: Jan. 18, 2008

(65) Prior Publication Data
US 2012/0135867 A1  May 31, 2012

Related U.S. Application Data

(60) Provisional application No. 60/881,358, filed on Jan. 18, 2007.

(51) Int. Cl.
*H01P 1/20* (2006.01)
*H01P 1/203* (2006.01)

(52) U.S. Cl.
USPC .......................... 333/202; 333/99 S; 505/210

(58) Field of Classification Search .............. 333/99 S, 333/167, 185, 202; 505/210, 700, 701
See application file for complete search history.

(56) References Cited

U.S. PATENT DOCUMENTS

| | | | |
|---|---|---|---|
| 5,616,539 A | 4/1997 | Hey-Shipton et al. | 505/210 |
| 5,618,777 A | 4/1997 | Hey-Shipton et al. | 505/210 |
| 5,831,489 A | 11/1998 | Wire | 333/99.008 |
| 5,937,263 A | 8/1999 | Eisenmann et al. | 419/2 |
| 6,347,237 B1 | 2/2002 | Eden et al. | 505/210 |
| 6,686,811 B2 | 2/2004 | Hey-Shipton | 33/99 S |
| 6,838,694 B2 | 1/2005 | Esteve et al. | 257/34 |
| 6,898,450 B2 | 5/2005 | Eden et al. | 505/210 |
| 7,145,415 B2 | 12/2006 | Sengupta et al. | 333/174 |

(Continued)

FOREIGN PATENT DOCUMENTS

| | | |
|---|---|---|
| CA | 2058837 | 7/1992 |
| CA | 2379144 A1 | 2/2001 |

OTHER PUBLICATIONS

U.S. Appl. No. 60/981,764, Uchaykin, filed Oct. 22, 2007.
U.S. Appl. No. 60/988,708, Uchaykin, filed Nov. 16, 2007.

(Continued)

*Primary Examiner* — Dean O Takaoka
(74) *Attorney, Agent, or Firm* — Seed IP Law Group PLLC

(57) ABSTRACT

An I/O system and device for use with superconducting device provides multi-stage filtering using superconducting electrical pathways, while providing good thermal conductivity to maintain low temperature of the various components and allowing the easy mounting and dismounting of a device sample from a refrigerated environment. Filtering may include a lumped element filter assembly including multiple plates each carrying a number of lumped element filters. Filtering may include a metal powder filter assembly including multiple metal power filters formed in passages of a substantially non-magnetic portions. A device sample holder assembly secures a device sample, for example a superconducting quantum processor, and provides signals, ground and good thermal conduction.

20 Claims, 43 Drawing Sheets

U.S. PATENT DOCUMENTS

| | | | | |
|---|---|---|---|---|
| 8,008,991 | B2* | 8/2011 | Tcaciuc et al. | 333/168 |
| 8,159,313 | B2* | 4/2012 | Uchaykin | 333/185 |
| 8,279,022 | B2* | 10/2012 | Thom et al. | 333/168 |
| 2005/0082519 | A1 | 4/2005 | Amin et al. | 257/13 |
| 2006/0147154 | A1 | 7/2006 | Thom et al. | 385/37 |
| 2006/0225165 | A1 | 10/2006 | Maassen van den Brink et al. | 977/933 |

OTHER PUBLICATIONS

U.S. Appl. No. 12/016,709, Tcaciuc et al., filed Jan. 18, 2008.

Berkley, "A Josephson Junction Qubit," Dissertation submitted to the Graduate School of the University of Maryland at College Park, pp. ii-195, 2003.

Bladh et al., "Comparison of cryogenic filters for use in single electronics experiements," *Review of Scientific Instruments 74*(3): 1323-1327, Mar. 2003.

Blatter et al., "Design aspects of superconducting-phase quantum bits," *Physical Review B 63*: 174511-1-174511-9, 2001.

Farhi et al., "Quantum Adiabatic Evolution Algorithms versus Simulated Annealing," Center for Theoretical Physics, MIT-CTP #3228, arXiv:quant-ph/0201031 v1, pp. 1-16, Jan. 8, 2002.

Feynman, "Simulating Physics with Computers," *International Journal of Theoretical Physics 21*(6/7): 467-488, 1982.

Friedman et al., "Quantum superposition of distinct macroscopic states," *Nature 406*: 43-46, Jul. 6, 2000.

Fukushima et al., "Attenuation of Microwave Filters for Single-Electron Tunneling Experiments," *IEEE Transactions on Instrumentation and Measurement 46*(2): 289-293, Apr. 1997.

Il'ichev et al., "Continuous Monitoring of Rabi Oscillations in a Josephson Flux Qubit," *Physical Review Letters 91*(9): 097906-1-097906-4, week ending Aug. 29, 2003.

Jin et al., "Distributed microwave damping filters for superconducting quantum interference devices," *Appl. Phys. Lett. 70*(16):2186-2188, Apr. 21, 1997.

Lukashenko et al., "Improved powder filters for qubit measurements," *Review of Scientific Instruments 79*(014701): 1-4, 2008.

Makhlin et al., "Quantum-state engineering with Josephson-junction devices," *Reviews of Modern Physics 73*(2): 357-400, Apr. 2001.

Milliken et al., "50 $\Omega$ characteristic impedance low-pass metal powder filters," *Review of Scientific Instruments 78*: 024701-1-024701-5, 2007.

Mooij et al., "Josephson Persistent-Current Qubit," *Science 285*: 1036-1039, Aug. 13, 1999.

Nielsen et al., *Quantum Computation and Quantum Information*, Cambridge University Press, Cambridge, 2000, "7.8 Other implementation schemes," pp. 343-345.

Orlando et al., "Superconducting persistent-current qubit," *Physical Review B 60*(22): 15 398-15 413, Dec. 1, 1999.

Pobell, *Matter and Methods at Low Temperatures*, Springer-Verlag Second edition, 1996, pp. 120-156.

Shor, "Introduction to Quantum Algorithms," AT&T Labs—Research, arXiv:quant-ph/0005003 v2, pp. 1-17, Jul. 6, 2001.

Zorin, "The thermocoax cable as the microwave frequency filter for single electron circuits," *Rev. Sci. Instrum. 66*(8): 4296-4300, Aug. 1995.

* cited by examiner

INPUT/OUTPUT SYSTEM AND DEVICES FOR USE WITH SUPERCONDUCTING DEVICES

CROSS REFERENCE TO RELATED APPLICATIONS

This application claims benefit under 35 U.S.C. §119(e) of U.S. provisional patent application Ser. No. 60/881,358, filed Jan. 18, 2007, which is incorporated herein by reference in its entirety.

BACKGROUND

1. Field

This disclosure generally relates to input/output (I/O) systems and devices for use with superconducting devices, and particularly relates to I/O systems for use with superconducting-based computing systems.

2. Description of the Related Art

A Turing machine is a theoretical computing system, described in 1936 by Alan Turing. A Turing machine that can efficiently simulate any other Turing machine is called a Universal Turing Machine (UTM). The Church-Turing thesis states that any practical computing model has either the equivalent or a subset of the capabilities of a UTM.

A quantum computer is any physical system that harnesses one or more quantum effects to perform a computation. A quantum computer that can efficiently simulate any other quantum computer is called a Universal Quantum Computer (UQC).

In 1981 Richard P. Feynman proposed that quantum computers could be used to solve certain computational problems more efficiently than a UTM and therefore invalidate the Church-Turing thesis. See, e.g., Feynman R. P., "Simulating Physics with Computers", International Journal of Theoretical Physics, Vol. 21 (1982) pp. 467-488. For example, Feynman noted that a quantum computer could be used to simulate certain other quantum systems, allowing exponentially faster calculation of certain properties of the simulated quantum system than is possible using a UTM.

Approaches to Quantum Computation

There are several general approaches to the design and operation of quantum computers. One such approach is the "circuit model" of quantum computation. In this approach, qubits are acted upon by sequences of logical gates that are the compiled representation of an algorithm. Circuit model quantum computers have several serious barriers to practical implementation. In the circuit model, it is required that qubits remain coherent over time periods much longer than the single-gate time. This requirement arises because circuit model quantum computers require operations that are collectively called quantum error correction in order to operate. Quantum error correction cannot be performed without the circuit model quantum computer's qubits being capable of maintaining quantum coherence over time periods on the order of 1,000 times the single-gate time. Much research has been focused on developing qubits with coherence sufficient to form the basic information units of circuit model quantum computers. See, e.g., Shor, P. W. "Introduction to Quantum Algorithms", arXiv.org:quant-ph/0005003 (2001), pp. 1-27. The art is still hampered by an inability to increase the coherence of qubits to acceptable levels for designing and operating practical circuit model quantum computers.

Another approach to quantum computation comprises using the natural physical evolution of a system of coupled quantum systems as a computational system. This approach does not make critical use of quantum gates and circuits. Instead, starting from a known initial Hamiltonian, it relies upon the guided physical evolution of a system of coupled quantum systems wherein the problem to be solved has been encoded in the terms of the system's Hamiltonian, so that the final state of the system of coupled quantum systems contains information relating to the answer to the problem to be solved. This approach does not require long qubit coherence times. Examples of this type of approach include adiabatic quantum computation, cluster-state quantum computation, one-way quantum computation, quantum annealing and classical annealing, and are described, for example, in Farhi, E. et al., "Quantum Adiabatic Evolution Algorithms versus Simulated Annealing" arXiv.org:quant-ph/0201031 (2002), pp 1-16.

Qubits

As mentioned previously, qubits can be used as fundamental units of information for a quantum computer. As with bits in UTMs, qubits can refer to at least two distinct quantities; a qubit can refer to the actual physical device in which information is stored, and it can also refer to the unit of information itself, abstracted away from its physical device.

Qubits generalize the concept of a classical digital bit. A classical information storage device can encode two discrete states, typically labeled "0" and "1". Physically these two discrete states are represented by two different and distinguishable physical states of the classical information storage device, such as direction or magnitude of magnetic field, current, or voltage, where the quantity encoding the bit state behaves according to the laws of classical physics. A qubit also contains two discrete physical states, which can also be labeled "0" and "1". Physically these two discrete states are represented by two different and distinguishable physical states of the quantum information storage device, such as direction or magnitude of magnetic field, current, or voltage, where the quantity encoding the bit state behaves according to the laws of quantum physics. If the physical quantity that stores these states behaves quantum mechanically, the device can additionally be placed in a superposition of 0 and 1. That is, the qubit can exist in both a "0" and "1" state at the same time, and so can perform a computation on both states simultaneously. In general, N qubits can be in a superposition of $2^N$ states. Quantum algorithms make use of the superposition property to speed up some computations.

In standard notation, the basis states of a qubit are referred to as the $|0\rangle$ and $|1\rangle$ states. During quantum computation, the state of a qubit, in general, is a superposition of basis states so that the qubit has a nonzero probability of occupying the $|0\rangle$ basis state and a simultaneous nonzero probability of occupying the $|1\rangle$ basis state. Mathematically, a superposition of basis states means that the overall state of the qubit, which is denoted $|\Psi\rangle$ has the form $|\Psi\rangle = a|0\rangle + b|1\rangle$, where a and b are coefficients corresponding to the probabilities $|a|^2$ and $|b|^2$, respectively. The coefficients a and b each have real and imaginary components, which allows the phase of the qubit to be characterized. The quantum nature of a qubit is largely derived from its ability to exist in a coherent superposition of basis states and for the state of the qubit to have a phase. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the $|0\rangle$ basis state or the $|1\rangle$ basis state and thus regaining its similarity to a conventional bit. The actual state of the qubit after it has collapsed depends on the probabilities $|a|^2$ and $|b|^2$ immediately prior to the readout operation.

Superconducting Qubits One hardware approach to quantum computation uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Superconducting qubits can be separated into several categories depending on the physical property used to encode information. For example, they may be separated into charge, flux and phase devices, as discussed in, for example Makhlin et al., 2001, *Reviews of Modern Physics* 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See, e.g., Nielsen and Chuang, *Quantum Computation and Quantum Information*, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See, e.g., U.S. Pat. No. 6,838,694 and U.S. Patent Application No. 2005-0082519.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See, e.g., Mooij et al., 1999, *Science* 285, 1036; and Orlando et al., 1999, *Phys. Rev. B* 60, 15398. Other examples of superconducting qubits can be found, for example, in Il'ichev et al., 2003, *Phys. Rev. Lett.* 91, 097906; Blatter et al., 2001, *Phys. Rev. B* 63, 174511, and Friedman et al., 2000, *Nature* 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. DC-SQUID magnetometers typically include a loop of superconducting material interrupted by at least one Josephson junction.

Quantum Processor

A device sample may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, U.S. Provisional Patent Application Ser. No. 60/872,414 filed Jan. 12, 2007 and entitled "System, Devices and Methods for Interconnected Processor Topology", and U.S. Provisional Patent Application Ser. No. 60/956,104 filed Aug. 15, 2007 and entitled "Systems, Devices, and Methods for Interconnected Processor Topology".

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. Provisional Patent Application 60/886,253 filed Jan. 23, 2007, entitled "Systems, Devices, And Methods For Controllably Coupling Qubits". Respective coupling strengths of the coupling devices may be tuned between zero and a maximum value, for example, to provide ferromagnetic or anti-ferromagnetic coupling between qubits.

A superconducting quantum processor may further include one or more readout devices. Examples of readout devices include dc-SQUIDs. Each superconducting qubit in a quantum processor may have a corresponding readout device or alternatively, there may be fewer readout devices than qubits.

When operating highly sensitive electronics such as superconducting qubits, coupling devices and/or readout devices, it is highly desirable to eliminate or at least reduce any noise which would otherwise adversely affect the operation of such electronics. For example, it is highly desirable to eliminate or reduce noise when operating an analog processor, for instance a quantum processor that includes a number of qubits and coupling devices.

When operating superconducting components in refrigerated environments, it is highly desirable to maintain all various components at suitably low temperatures such that those components operate as superconductors or have superconducting characteristics. For example, it is highly desirable to maintain the qubits and coupling devices of a quantum processor at superconducting temperatures. It may also be highly desirable to maintain the local bias devices and/or read out devices of a quantum processor at superconducting temperatures. Also for example, it is highly desirable to maintain signal paths in an I/O system for the superconducting quantum processor at superconducting temperatures. Further, it may be desirable to provide a structure that allows easy placement and removal of a superconducting processor from a refrigerated environment. Such may allow simplification of testing, analysis, and/or repair.

Maintaining superconducting temperatures may be difficult since many materials that are capable of superconducting do not provide good thermally conductive paths. Such may be particularly difficult with I/O systems since such I/O systems interface with non-refrigerated environments. Such difficulties are compounded where the structure is also to provide for the easy placement and removal of a superconducting processor. The various embodiments discussed herein address these problems.

Superconducting Processor

A device sample may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

According to the present state of the art, a superconducting material may generally only act as a superconductor if it is cooled below a critical temperature that is characteristic of the specific material in question. For this reason, those of skill in the art will appreciate that a computer system that implements superconducting processors may require a refrigeration system for cooling the superconducting materials in the system.

Refrigeration

According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

BRIEF SUMMARY

At least one embodiment may be summarized as a superconducting lumped element filter including a dielectric medium including a first face and a second face; at least one superconducting inductor; a continuous superconducting signal path that includes at least one superconducting trace on the first face of the dielectric medium, wherein the at least one superconducting inductor is superconductingly coupled in series with the continuous superconducting signal path such that the continuous superconducting signal path includes the at least one superconducting inductor; at least one capacitor coupled in parallel with the continuous superconducting signal path; and a ground plane formed by a plane of non-superconducting metal carried by the second face of the dielectric medium; wherein the dielectric medium, the at least one superconducting trace, the at least one superconducting inductor, the at least one capacitor, and the ground plane each include substantially non-magnetic materials. The at least one capacitor may couple the superconducting signal path directly to the ground plane. The dielectric medium may have at least one edge that is plated with a non-superconducting metal that is in electrical and thermal contact with the ground plane. At least a portion of the first face of the dielectric medium may be covered with a non-superconducting metal that is in electrical and thermal contact with the at least one edge of the dielectric medium that is plated.

The superconducting lumped element filter may further include a signal input terminal formed by a superconducting contact pad disposed at a first end of the superconducting signal path. The superconducting lumped element filter may further include a signal output terminal formed by a superconducting contact pad disposed at a second end of the superconducting signal path. The superconducting lumped element filter may further include at least two ground terminals, each of the at least two ground terminals formed by a respective conductive contact pad, wherein at least one ground terminal is proximate the signal input terminal and at least one ground terminal is proximate the signal output terminal. The at least one superconducting inductor may comprise a coil of superconducting wire wound around a core. The superconducting wire may be aluminum wire. The core may include at least one of: air, glass, metglass, fiberglass, epoxy, and a mixture of metal powder and epoxy. The superconducting lumped element filter may further include an epoxy that bounds the coil of superconducting wire.

At least one embodiment may be summarized as a superconducting lumped element filter assembly including a first plate including a top face, an opposing bottom face, and an outer perimeter face, the first plate comprising a substantially non-superconducting, substantially non-magnetic material; and a first plurality of superconducting lumped element filters, each of the superconducting lumped element filters comprising: a dielectric medium including a first face and a second face; at least one superconducting inductor; a continuous superconducting signal path that includes at least one superconducting trace on the first face of the dielectric medium, wherein the at least one superconducting inductor is superconductingly coupled in series with the continuous superconducting signal path such that the continuous superconducting signal path includes the at least one superconducting inductor; at least one capacitor coupled in parallel with the continuous superconducting signal path; and a ground plane formed by a plane of non-superconducting metal carried by the second face of the dielectric medium; wherein the dielectric medium, the at least one superconducting trace, the at least one superconducting inductor, the at least one capacitor, and the ground plane each include substantially non-magnetic materials; wherein the first plurality of superconducting lumped element filters is carried on the top face of the first plate.

The superconducting lumped element filter assembly may further include a second plate including a top face, an opposing bottom face, and an outer perimeter face, the second plate comprising a substantially non-superconducting, substantially non magnetic material, wherein at least a portion of the top face of the first plate is thermally conductively connected with at least a portion of the bottom face of the second plate. The top face of the first plate may include a plurality of cavities extending partially therethrough, each cavity forming an at least partial enclosure defined by the walls of the cavity, the top face of the first plate, and the bottom face of the second plate, and wherein each enclosure receives a respective one of the first plurality of superconducting lumped element filters. The bottom face of the second plate may include a plurality of cavities extending partially therethrough, each cavity forming an at least partial enclosure defined by the walls of the cavity, the bottom face of the second plate, and the top face of the first plate, and wherein each enclosure receives a respective one of the first plurality of superconducting lumped element filters. At least one of the first and the second plates may have at least one through-hole that extends in a transverse direction with respect to a longitudinal axis of one of the cavities, the through-hole extending through the perimeter face of the first or the second plate.

The superconducting lumped element filter assembly may further include a first plurality of electrical wires wherein a respective electrical wire passes through each of the at least one through-holes and provides an electrical connection to a respective one of the first plurality of superconducting lumped element filters. The first plate may be circular in geometry. The cavities may be aligned in a substantially radial arrangement. The superconducting lumped element filter assembly may further include a second plurality of electrical wires wherein a respective electrical wire in the second plurality of electrical wires is communicatively coupled to a respective one of the first plurality of superconducting lumped element filters, and wherein a center of the first plate includes a central through-hole that extends through the top face and the bottom face of the first plate, such that the coupling between at least one electrical wire from the second plurality of electrical wires and a respective superconducting lumped element filter is at least proximate the central through-hole and at least one electrical wire from the second plurality of electrical wires extends through the central through-hole. At least one of the first plurality of electrical wires may include a material that is superconducting below a critical temperature, and at least one of the second plurality of electrical wires includes a material that is superconducting below a critical temperature.

The superconducting lumped element filter assembly may further include a third plate including a top face, an opposing bottom face, and an outer perimeter face, the third plate comprising a substantially non-superconducting, substantially non-magnetic material; and a second plurality of superconducting lumped element filters, each of the superconducting lumped element filters comprising: a dielectric medium including a first face and a second face; at least one superconducting inductor; a continuous superconducting signal path that includes at least one superconducting trace on the first face of the dielectric medium, wherein the at least one superconducting inductor is superconductingly coupled in series with the continuous superconducting signal path such that the continuous superconducting signal path includes the at least one superconducting inductor; at least one capacitor coupled in parallel with the continuous superconducting signal path; and a ground plane formed by a plane of non-superconducting metal carried by the second face of the dielectric medium; wherein the dielectric medium, the at least one superconducting trace, the at least one superconducting inductor, the at least one capacitor, and the ground plane each include substantially non-magnetic materials; wherein the second plurality of superconducting lumped element filters is carried on the top face of the second plate; and wherein the third plate is stacked upon the second plate such that at least a portion of the top face of the second plate is thermally conductively connected with at least a portion of the bottom face of the third plate.

The superconducting lumped element filter assembly may further include at least one bolt that passes through both the first plate, the second plate, and the third plate, wherein the at least one bolt secures the first plate, the second plate, and the third plate as one rigid structure. The superconducting lumped element filter assembly may further include at least one additional plate including a top face, a bottom face, and an outer perimeter face, the at least one additional plate comprising a substantially non-superconducting, substantially non-magnetic material; and at least one additional plurality of superconducting lumped element filters, each of the additional plurality of superconducting lumped element filters comprising: a dielectric medium including a first face and a second face; at least one superconducting inductor; a continuous superconducting signal path that includes at least one superconducting trace on the first face of the dielectric medium, wherein the at least one superconducting inductor is superconductingly coupled in series with the continuous superconducting signal path such that the continuous superconducting signal path includes the at least one superconducting inductor; at least one capacitor coupled in parallel with the continuous superconducting signal path; and a ground plane formed by a plane of non-superconducting metal carried by the second face of the dielectric medium; wherein the dielectric medium, the at least one superconducting trace, the at least one superconducting inductor, the at least one capacitor, and the ground plane each include substantially non-magnetic materials; wherein the first plate, the second plate, the third plate, and the at least one additional plate are stacked one on top of the other to form a stack of plates, adjacent ones of the first, the second, the third, and the at least one additional plate thermally conductively connected to one another; and wherein a respective one of the first, the second, the third, and the at least one additional plurality of superconducting lumped element filters is arranged on the top face of all but one of the first, the second, the third, or the at least one additional topmost plate in the stack of plates. The superconducting lumped element filter assembly may further include at least one bolt that passes through each of the first, the second, the third, and the at least one additional plate in the stack of plates to secure the stack of plates such that each of the first, the second, the third, and the at least one additional plate is held in physical contact with at least an adjacent one of the first, the second, the third, and the at least one additional plate.

At least one embodiment may be summarized as a metal powder filter assembly including a first portion of a substantially non-superconducting, substantially non-magnetic metal, wherein the first portion has a first end, a second end, and a plurality of longitudinal passages that span between the first end and the second end of the first portion; a plurality of conductive wires, each of which is superconducting below a critical temperature, wherein each of the longitudinal passages of the first portion receives at least one conductive wire; an epoxy mixture comprising an epoxy and a metal powder that is substantially non-superconducting and substantially non-magnetic, wherein each of the plurality of longitudinal passages in the first portion is filled with the epoxy mixture and each of the plurality of conductive wires is secured in place by the epoxy mixture inside a respective one of the longitudinal passages in the first portion; and at least one common flange that encloses the plurality of longitudinal passages at least proximate at least one of the first end and the second end of the first portion. At least one conductive wire may include a wound intermediate section that is at least partially contained within a respective one of the longitudinal passages in the first portion, and wherein a longitudinal axis of the wound intermediate section is coaxially aligned with a longitudinal axis of the respective longitudinal passage. The metal powder may include at least one of copper and brass. A ratio of the epoxy mixture may be selected from the group consisting of: approximately two to one by weight of metal powder to epoxy, approximately four to one by weight of metal powder to epoxy, and approximately eight to one by weight of metal powder to epoxy.

The metal powder filter assembly may further include a first circuit board having a first side, a second side opposed to the first side, a plurality of through-holes and a plurality of solder pads, wherein each through-hole passes through a respective solder pad, and wherein each of the plurality of conductive wires passes through a respective one of the through-holes and is soldered to a respective one of the solder pads, the first circuit board positioned adjacent to the first end of the first portion such that a first side of the first circuit board is in physical contact with the first end of the first portion, such that the first circuit board approximately seals the plurality of longitudinal passages at the first end of the first portion. At least a portion of at least one of the conductive wires that extends through the second side of the first circuit board may be enclosed in an electrically insulative material. The metal powder filter assembly may further include a second circuit board having a first side, a plurality of through-holes and a plurality of solder pads, wherein each through-hole passes through a respective solder pad; and a plurality of sheathes of woven conductive wire, each of the sheathes soldered to a respective one of the solder pads on the first side of the second circuit board, such that each of the plurality of conductive wires extends through a respective one of the through-holes in the second circuit board and is enclosed by a respective one of the sheathes on the first side of the second circuit board, the second circuit board positioned in close proximity to the first circuit board. The metal powder filter assembly may further include an additional circuit board having a first side, a plurality of through-holes and a plurality of solder pads, wherein each of the through-holes passes through a respective solder pad; and a plurality of sheathes of woven conductive wire, each of the sheathes soldered to a respective one of the solder pads on the first side of the additional circuit board, such that each of the plurality of conductive wires extends through a respective one of the through-holes in the additional circuit board and is enclosed by a respective one of the sheathes on the first side of the additional circuit board, the additional circuit board positioned in close proximity to the second end of the first portion. The metal powder filter assembly may further include at least a second portion of a substantially non-superconducting, substantially non-magnetic metal that is substantially similar in shape to the first portion, the second portion being formed by having a first end, a second end, and a plurality of longitudinal passages that span between the first end and the second end of the second portion, and wherein the first end of the second portion is mated to the second end of the first portion such that each of the longitudinal passages in the first portion aligns with a respective one of the longitudinal passages in the second portion and each of the plurality of conductive wires that is positioned within a respective one of the longitudinal passages of the first portion extends through a corresponding one of the longitudinal passages in the second portion, the longitudinal passages in the second portion being filled with an epoxy mixture comprising a metal powder and an epoxy. A majority of the length of each of the conductive wires that is enclosed within a respective one of the longitudinal passages may be wound about a longitudinal axis that is coaxial with a longitudinal axis of the respective longitudinal passage. The metal powder filter assembly may further include a metal enclosure that is open at one end, the metal enclosure including a flange proximate the open end, wherein the flange of the metal enclosure is connected to the common flange of the first portion such that the metal enclosure and the first portion define a closed volume that is shielded from electromagnetic and thermal radiation.

At least one embodiment may be summarized as a structure to provide physical support and thermalization of a superconducting device sample including a pedestal assembly including a pedestal of a substantially non-superconducting, substantially non-magnetic material, and at least one pedestal circuit board that is physically coupled to the pedestal, wherein the pedestal is physically coupleable to a cold surface in a refrigeration system to establish a thermal connection therebetween; and a device sample holder assembly including a thermal backplane, a base overlying at least a portion of the thermal backplane, a device sample holder circuit board carried by the base, and a lid overlying at least a portion of the device sample holder circuit board, wherein the thermal backplane, the base, and the lid are each substantially non-magnetic material and the device sample holder assembly is selectively mountable to and dismountable from the pedestal assembly. The superconducting device sample may be positioned in superconducting electrical communication with the device sample holder circuit board. The device sample holder circuit board may carry at least one superconducting pad and the superconducting device sample may be in superconducting electrical communication with the device sample holder circuit board through the at least one superconducting pad. The base and the lid may each be superconducting below a critical temperature such that together they form a superconducting enclosure around the superconducting device sample. At least one bolt that is substantially non-superconducting and substantially non-magnetic may be physically coupled to both the thermal backplane and the device sample holder circuit board, and through at least one through-hole in the base, such that the at least one bolt passes through the at least one through-hole in the base to provide a thermal connection between the device sample holder circuit board and the thermal backplane. The superconducting device sample may carry at least one pad formed by a substantially non-superconducting metal, and a non-superconducting thermal connection may be established between the device sample holder circuit board and the pad carried by the device sample. The superconducting device sample may be non-superconductingly coupled to the base by at least one substance or device selected from the group consisting of: varnish, epoxy, adhesive, mechanical springs, mechanical clamps, and mechanical spring clamps. The at least one pedestal circuit board and the device sample holder circuit board may each include at least one superconductive trace formed by a material that is superconducting below a critical temperature. The at least one pedestal circuit board may be superconductingly electrically coupled to at least one input signal. The at least one pedestal circuit board may be superconductingly electrically coupled to the device sample holder circuit board, such that the at least one input signal is superconductingly electrically coupled from the at least one pedestal circuit board to the device sample holder circuit board. The at least one input signal may be superconductingly electrically coupled from a first superconductive trace carried by the device sample holder circuit board to the superconducting device sample through a first superconducting electrical connection. The at least one input signal may be returned from the superconducting device sample to a second superconductive trace carried by the device sample holder circuit board through a second superconducting electrical connection, thereby defining at least one return signal. The at least one return signal may be superconductingly electrically coupled from the device sample holder circuit board to the at least one pedestal circuit board. The at least one return signal may be electrically coupled from the at least one pedestal circuit board to the pedestal. The base and the lid may be electrically isolated from both the at least one input signal and the at least one return signal. The superconducting device sample may include a superconducting processor. The superconducting processor may include a superconducting quantum processor.

At least one embodiment may be summarized as an input/out system for use with a superconducting device sample including a superconducting lumped element filter assembly having a number of superconducting lumped element filters; a metal powder filter assembly having a number of metal powder filters; a pedestal assembly; a device sample holder assembly selectively mountable to and dismountable from the pedestal assembly, wherein at least a portion of the device sample holder assembly is superconductingly electrically coupled to the superconducting device sample; and a first set of electrical signal paths, wherein at least a portion of each of the electrical signal paths is superconducting and each of the electrical signal paths in the first set of electrical signal paths passes through at least one of the superconducting lumped element filters and through at least one of the metal-powder filters, and each of the electrical signal paths provides electrical communication with at least a portion of the superconducting device sample. Each of the electrical signal paths may pass through a respective one of the superconducting lumped element filters. Each of the electrical signal paths may pass through a respective one of the metal powder filters. The superconducting lumped element filter assembly and the metal powder filter assembly may be physically coupled to one another to provide thermal conduction therebetween.

The pedestal assembly may be physically coupled to the metal powder filter assembly. The input/output system may include a top hat shield that is substantially non-magnetic and substantially non-superconducting metal. The top-hat shield may be physically coupled to the metal powder filter assembly to define a sealed enclosure. The pedestal assembly and the device sample holder assembly may both be at least partially contained within the sealed enclosure. The superconducting device sample may include a superconducting processor. The superconducting processor may include a superconducting quantum processor.

At least one embodiment may be summarized as an input/out system for use with a superconducting device sample in a refrigeration system including a first set of electrical signal paths, wherein at least a portion of each of the electrical signal paths is formed by a material that is superconducting below a critical temperature and at least a portion of each of the electrical signal paths is thermally coupleable to a cold surface in the refrigeration system; at least one filtering stage that filters a specific frequency range of electrical signals, wherein each of the electrical signal paths in the first set of electrical signal paths includes the at least one filtering stage and wherein at least a portion of the at least one filtering stage is thermally coupleable to a cold surface in the refrigeration system; and a support structure that provides thermalization of the superconducting device sample, wherein the support structure includes a superconducting enclosure, a non-superconducting portion, and a superconducting printed circuit board that is at least partially contained within the superconducting enclosure, wherein each of the electrical signal paths in the first set of electrical signal paths is electrically isolated from the superconducting enclosure and each of the electrical signal paths in the first set of electrical signal paths is superconductingly electrically coupled to the superconducting printed circuit board of the support structure, and wherein the superconducting device sample is superconductingly electrically coupled to the superconducting printed circuit board of the support structure and the superconducting device sample is thermally coupled to the non-superconducting portion of the support structure, and wherein the non-superconducting portion of the support structure is thermally coupleable to the at least one filtering stage. The at least one filtering stage may include a first filtering stage comprising a plurality of superconducting lumped element filters arranged in a superconducting lumped element filter assembly. The at least one filtering stage may include a second filtering stage comprising a plurality of metal powder filters arranged in a metal powder filter assembly. The metal powder filter assembly may be physically coupled to the superconducting lumped element filter assembly. Each of the superconducting lumped element filters in the superconducting lumped element filter assembly may be superconductingly electrically coupled in series with a respective one of the metal powder filters in the metal powder filter assembly. The at least one filtering stage may include a first filtering stage comprising a plurality of metal powder filters arranged in a metal powder filter assembly. The support structure may be physically coupled to at least one of the superconducting lumped element filter assembly and the metal powder filter assembly. The superconducting device sample may include a superconducting processor. The superconducting processor may include a superconducting quantum processor.

At least one embodiment may be summarized as a structure to provide physical support and thermalization of a superconducting device sample. The structure may include a pedestal assembly. The pedestal assembly may include a pedestal of a substantially non-superconducting, substantially non-magnetic material, and at least one pedestal circuit board that is physically coupled to the pedestal. The pedestal may be physically coupleable to a cold surface in a refrigeration system to establish a thermal connection therebetween. The structure may also include a device sample holder assembly including a base overlying at least a portion of the pedestal, a device sample holder circuit board carried by the base, and a lid overlying at least a portion of the device sample holder circuit board. The base and the lid may each be substantially non-magnetic material and the device sample holder circuit board may carry at least one superconducting pad such that the superconducting device sample is in superconducting electrical communication with the device sample holder circuit board through the at least one superconducting pad.

BRIEF DESCRIPTION OF THE SEVERAL VIEWS OF THE DRAWINGS

In the figures, identical reference numbers identify similar elements or acts. The sizes and relative positions of elements in the figures are not necessarily drawn to scale. For example, the shapes of various elements and angles are not drawn to scale, and some of these elements are arbitrarily enlarged and positioned to improve legibility. Further, the particular shapes of the elements as drawn are not intended to convey any information regarding the actual shape of the particular elements and have been solely selected for ease of recognition in the figures. Furthermore, while the figures may show specific layouts, one skilled in the art will appreciate that variations in design, layout, and fabrication are possible and the shown layouts are not to be construed as limiting the geometry of the present systems, devices, and methods.

DETAILED DESCRIPTION

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with superconducting processors, such as superconducting devices, coupling devices, and control systems including microprocessors and drive circuitry have not been shown or described in detail to avoid unnecessarily obscuring descriptions of the embodiments of the systems, devices, and methods.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

Figure 1:
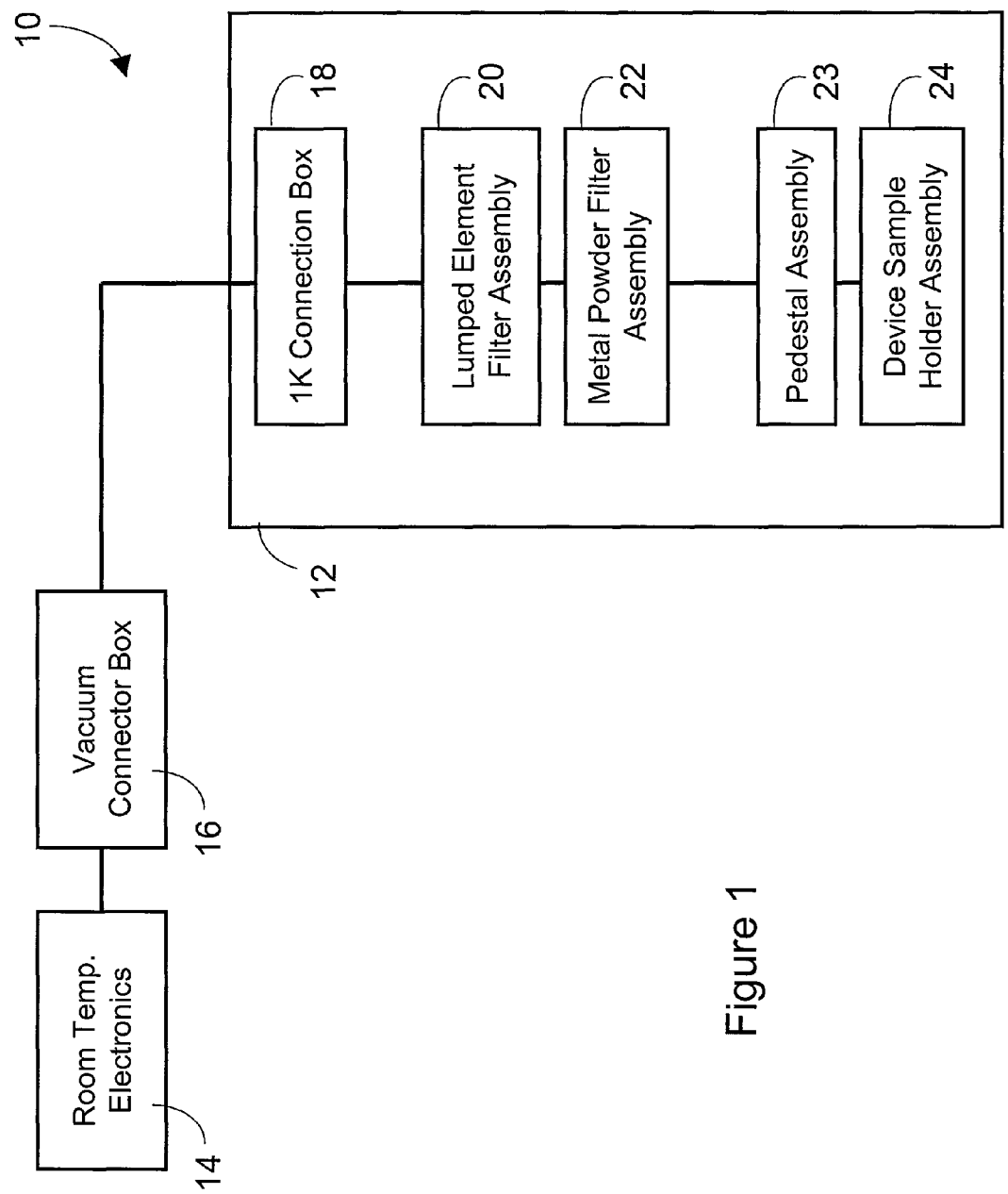
FIG. 1 is a schematic diagram showing an input/output (I/O) system for use with a superconducting device in a refrigerated environment according to one illustrative embodiment, including a set of room temperature electronics, vacuum connector box, 1K connection box, lumped element filter assembly, metal powder filter assembly, pedestal assembly, and device sample holder assembly, where wiring passes between the various components and connectors of the system and thermalizing clamps may be included between various stages.

FIG. 1 shows an input/output (I/O) system 10 for use with a processor in a refrigerated environment 12 according to one illustrative embodiment.

The I/O system 10 may interface with a set of room temperature electronics 14, and may include a vacuum connector box 16, and within the refrigerated environment 12 may include an optional 1K connection box 18, lumped element filter assembly 20, metal powder filter assembly 22, pedestal assembly 23 and device sample or chip holder assembly 24, each of which is discussed in more detail below. Superconducting paths are provided within the refrigerated environment 12 to prevent heat creation, which may otherwise adversely affect performance by raising the temperature of the refrigerated environments and/or portions of the I/O system.

The refrigerated environment 12 may provide milliKelvin temperatures to operate various superconducting components, for example the device sample (e.g., superconducting processor or superconducting quantum processor). The refrigerated environment 12 may, for example, take the form of a dilution refrigerator, such as the Leiden Cryogenics B.V. MNK 126 series (Galgewater No. 21, 2311 VZ Leiden, The Netherlands). In some embodiments all or part of the I/O system 10 may be housed in the refrigerated environment 12.

The room temperature electronics 14 may include conventional I/O electronics that are not maintained at superconducting temperatures. Such electronics 14 are not pertinent to the present disclosure so are not discussed further.

The vacuum connector box 16 may provide an interface between the room temperature electronics 14 and the portion of the I/O system 10 that is in the evacuated refrigerated environment 12. The vacuum connector box 16 may provide a hermetically sealed interface between the refrigerated environment 12 and the non-refrigerated environment, while providing electrically conductive signal paths therebetween. The vacuum connector box 16 may include one or more circuit boards, with protecting resistors and flexible coaxial cable. The vacuum connector box 16 is not pertinent to the present disclosure so is not discussed further.

The optional 1K connection box 18 is where transition may occur between non-superconducting materials and superconducting materials. For example, the 1K connection box 18 may be where the transition occurs between non-superconducting coaxial cable and superconducting coaxial cable (e.g., a copper nickel plated coaxial cable). While designated as 1K, the 1K connection box does not have to be at 1K; however, the transition from non-superconducting materials to superconducting materials should occur at a temperature that is below the critical temperature of the superconducting materials. For example, in some embodiments, the 1K connection box 18 may be at approximately 1.2-1.4K. The 1K connection box 18 should provide good thermal transfer (i.e., thermalizing) and should have a small volume so as to fit in the refrigerated environment 12. In some embodiments, a noise filter may be mounted in the connection between the two sets of wires.

The lumped element filter assembly 20 is a low pass filter that forms one superconducting filtering stage. The lumped element filter assembly 20 may, for example, filter noise from approximately 1 MHz, 3 MHz or 5 MHz to approximately 2-4 GHz.

The metal powder filter assembly 22 is a low temperature, low pass filter with a wide range that form another superconducting filtering stage. The metal powder filter assembly 22 may, for example, filter noise from approximately 1 GHz to approximately optical frequencies. In some embodiments, there may be overlap between the frequencies filtered by the lumped element filter assembly 20 and the metal powder filter assembly 22. The combination of lumped element filter assembly 20 and metal powder filter assembly 22 assures that only signals of interest are transferred, for example signals below 1 MHz.

The pedestal assembly 23 provides a mounting platform for the device sample holder assembly 24. The device sample holder assembly 24 carries the device sample, which may take the form of a superconducting processor, for example a superconducting quantum processor. The device sample holder assembly 24 may provide thermal conductivity and electrically superconductive signal paths to the device sample, as well as a stable magnetic environment. The device sample holder assembly 24 may be selectively mounted and dismounted from the pedestal assembly 23 to provide easy and reliable loading and unloading of the device sample from the refrigerated environment 12. The pedestal assembly 23 and device sample holder assembly 24 should provide good thermal conductivity and superconducting signal paths from the I/O system 10 to the device sample.

It is noted that at least some metal surfaces may be clamped to provide good thermal conductivity and to prevent noise from passing by the various filters.

Figure 2:
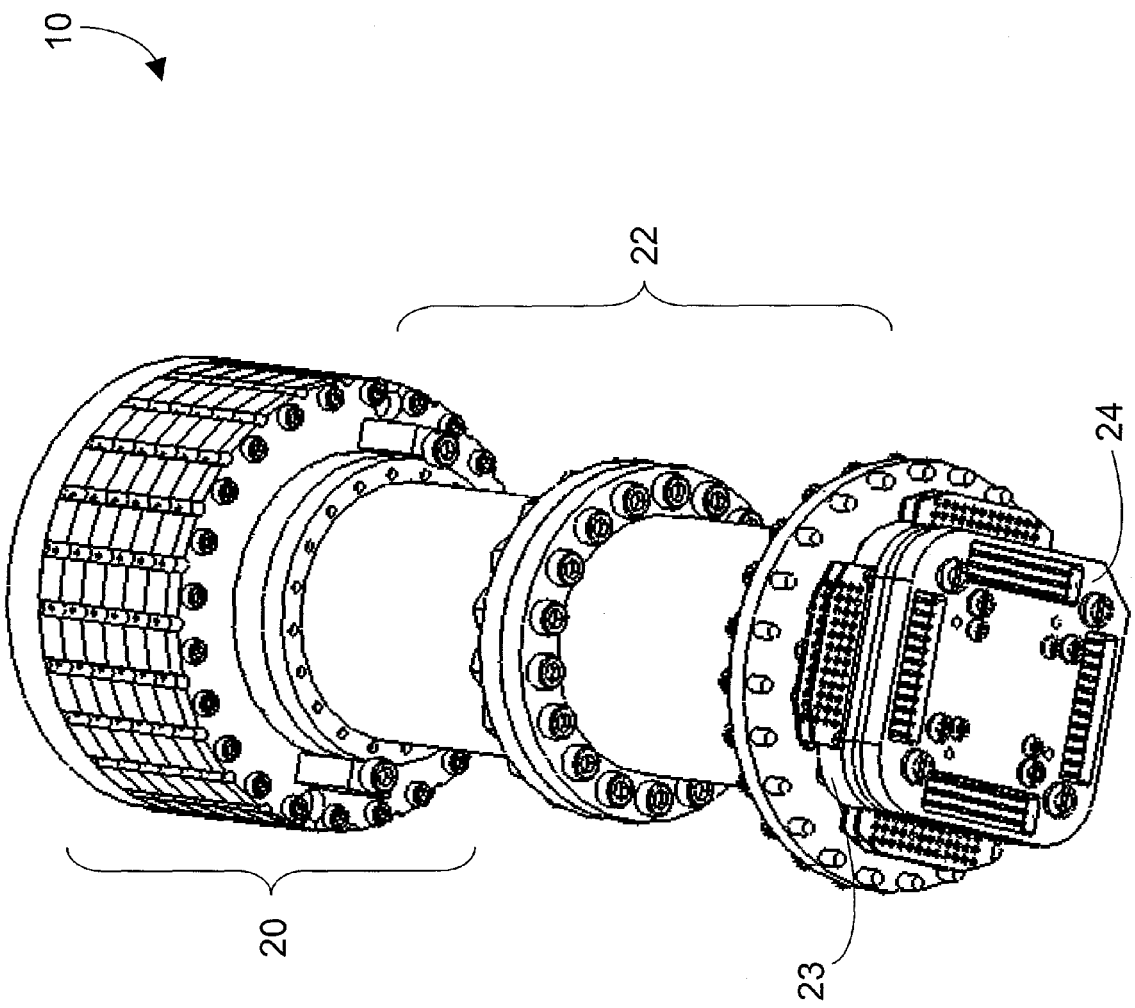
FIG. 2 is an isometric view of a portion of the I/O system of FIG. 1 according to one illustrative embodiment, including a lumped element filter assembly, metal powder filter assembly, pedestal assembly, and device sample holder assembly.

FIG. 2 shows a portion of the I/O system 10 according to one illustrative embodiment, including a lumped element filter assembly 20, metal powder filter assembly 22, pedestal assembly 23 and device sample holder assembly 24. Adhesive tape (not shown), for example a KAPTON or TEFLON tape, may secure cables against the lumped element filter assembly 20 for the purpose of thermalization and volume reduction. Adhesive tape (not shown), for example KAPTON or TEFLON tape, may secure wires against the metal powder filter assembly 22 for the purpose of thermalization and volume reduction. In this respect, it is noted that TEFLON shrinks as temperature lowers, so will hold the wiring tighter as the temperature decreases.

The lumped element filter assembly 20 carries one or more lumped element filters. The metal powder filter assembly 22 carries one or more metal powder filters and circuit boards. The metal powder filter assembly 22 may thermally couple the lump element filter assembly 20 with the pedestal assembly and the device sample holder assembly 24. Superconducting electrical signal paths enter the lumped element filter assembly 20 from the cabling (not shown), connect through to the metal powder filter assembly 22, through to the pedestal assembly 23 and device sample holder assembly 24, and finally on to the processor or device sample.

Figure 3A:
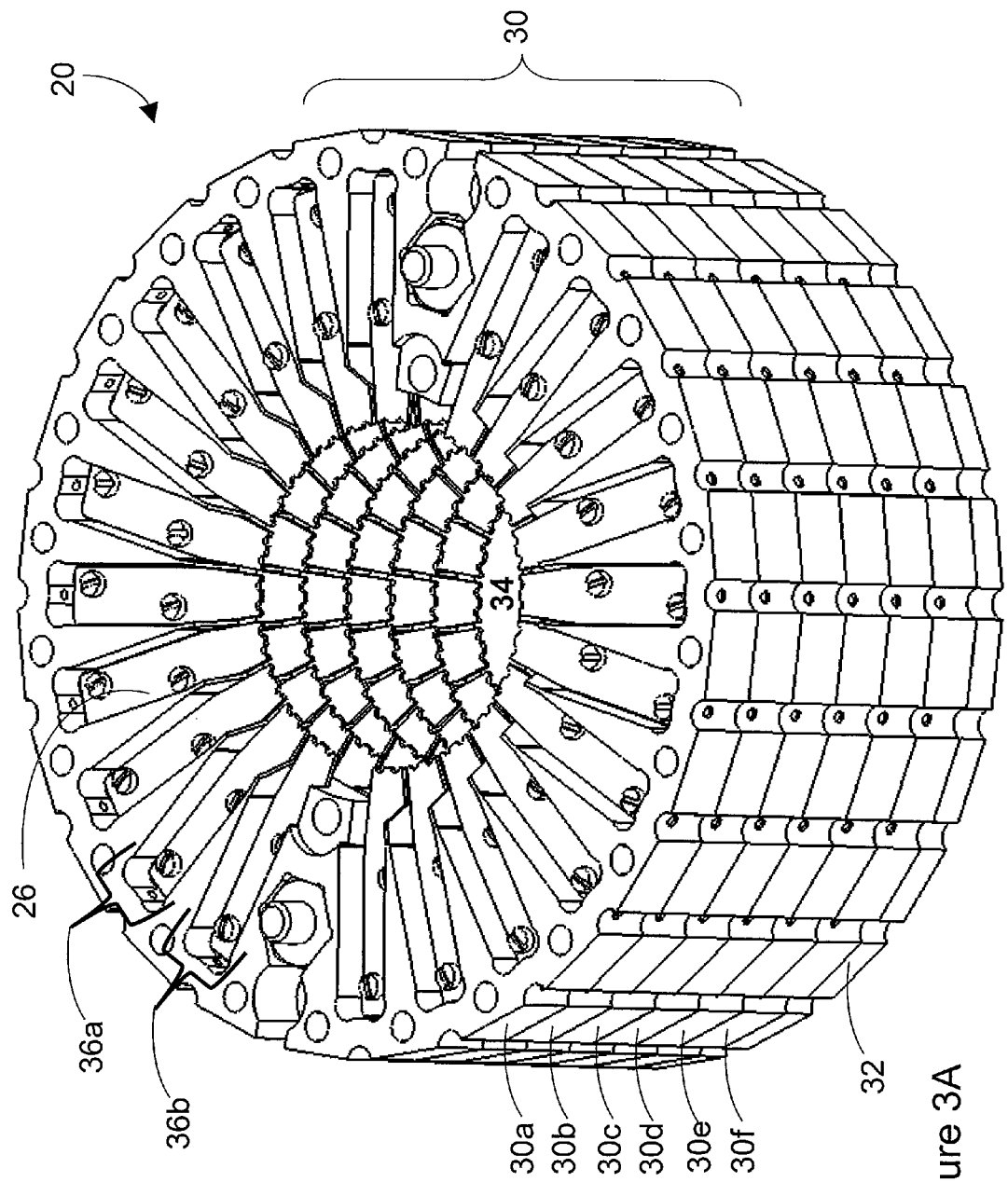
FIG. 3A is an isometric view of a portion of a lumped element filter assembly according to one illustrative embodiment.

FIG. 3A shows a lumped element filter assembly 20 according to one illustrative embodiment.

The lumped element filter assembly 20 carries one or more lumped element filters 26 (only one called out in the Figure). The lumped element filter assembly 20 may include one or more lumped element filter plates 30a-30f (collectively 30), each of which may carry one or more lumped element filters 26. As illustrated, the lumped element filter assembly 20 includes a base plate 32 and six lumped element filter plates 30a-30f. However, in alternative embodiments the base plate 32 may be replaced by a lumped element filter plate.

As illustrated, each lumped element filter plate 30 takes the form of an annular disk, with a central passage 34. Each lumped element filter plate 30 has a plurality of radial slots or cavities 36a, 36b (collectively 36, only two called out in the Figure), each of the radial cavities 36 sized to receive a respective one of the lumped element filters 26. As illustrated each lumped element filter plate 30 has twenty-two radial cavities 36.

Those of skill in the art will appreciate that all or any subset of lumped element filter plates 30 may be realized by an alternative geometry, such as a square or rectangular geometry as opposed to an annular disk. Furthermore, in alternative embodiments cavities 36 may be arranged in an alternative manner, such as a linear or grid-like arrangement as opposed to the illustrated radial arrangement.

The lumped element filter assembly 20 is modular. Additional lumped element filter plates 30 may be added, or some removed, to achieve the degree of filtering that is desired or required.

Each of the lumped element filters plates 30 may be thermally coupled, either directly or through an intermediate coupling, to a cold surface in the refrigeration system. Lumped element filter plates 30 may therefore provide thermalization of the lumped element filters 26. For this reason, it can be advantageous to ensure that lumped element filter plates 30 are comprised of substantially non-superconducting material in order to provide better thermal coupling. Furthermore, some superconducting devices, such as a superconducting processor, may be highly sensitive to magnetic fields. Thus, in some embodiment it can be advantageous to ensure that lumped element filter plates 30 are comprised of substantially non-magnetic material.

Figure 3B:
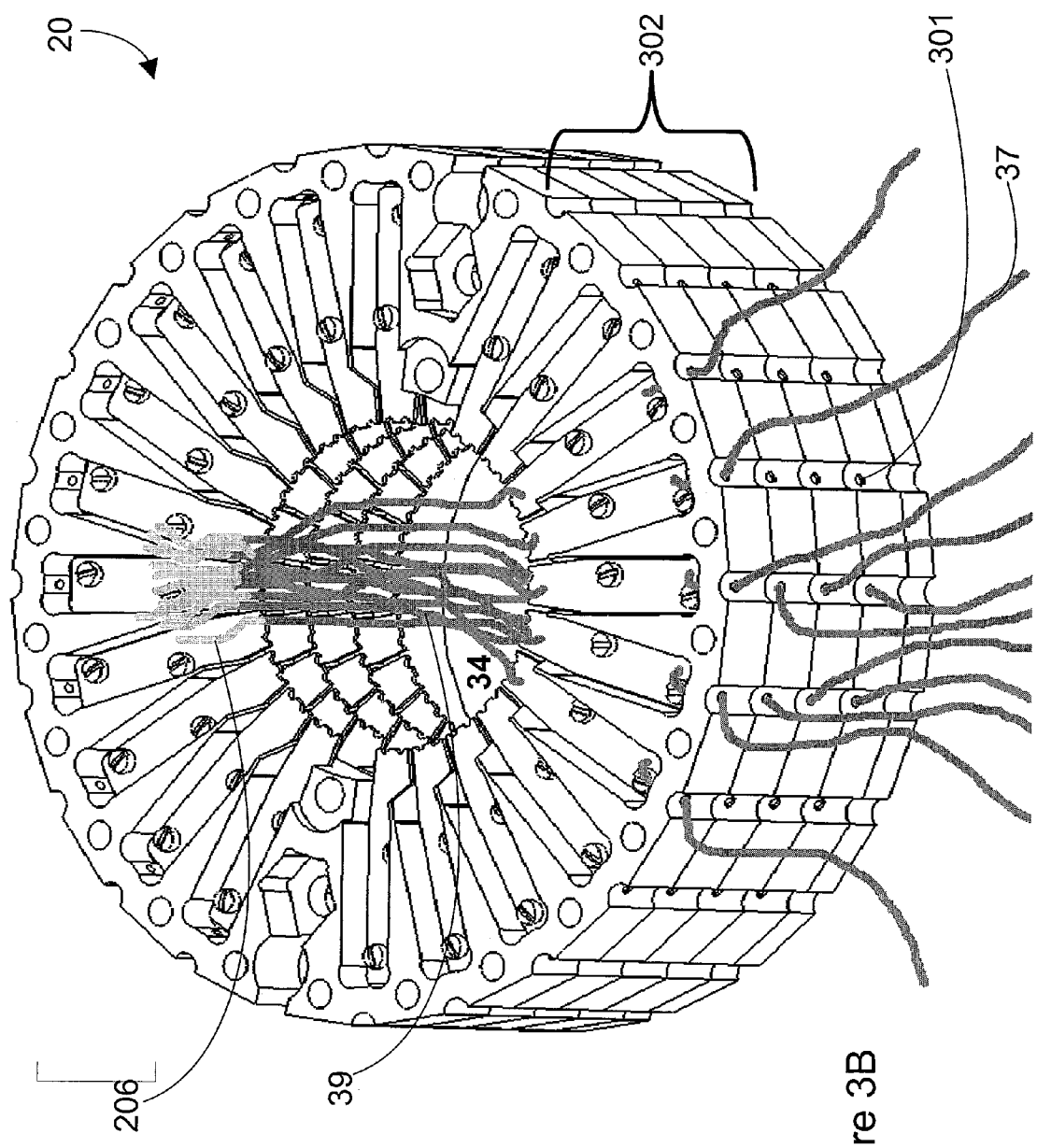
FIG. 3B is an isometric view of a lumped element filter assembly and some associated wiring according to one illustrative embodiment.

FIG. 3B shows a set of coaxial cables 37 (only one called out in the Figure) entering the lumped element filter assembly 20 and a set of coaxial cables 39 (only one called out in the Figure) leaving the lumped element filter assembly 20 according to one illustrative embodiment. The coaxial cables 37 enter the lumped element filter assembly 20 through apertures 301 (only one called out in the Figure) located in longitudinally extending grooves 302 on an exterior of the lumped element filter assembly 20. The coaxial cables 39 leave the lumped element filter assembly 20 through the central passage 34 (note that, in the Figure, cables 39 each extend from a respective filter 26, but do not connect to anything else). The coaxial cables 37, 39 may include a superconductor, for example Niobium wire (not visible in the Figure). The coaxial cables may include a tube 206 (represented by the light grey region at the end of each cable 39, only one called out in the Figure) encasing respective ones of the wires to provide electrical insulation. The tubes 206 may take the form of PTFE (TEFLON) tubes (e.g., 24 or 28 gauge). Portions of the tubes 206 that extend from the lumped element filter assembly 26 may be encased in a sheath (represented by the dark grey region at the beginning of each cable 37, 39). The sheathes may take the form of metal braided sheath, for example a copper braid or a tin braided copper. A collar (not shown) may be formed at each end of each sheath. The collar may be formed from a wrap of fine wire (e.g., lead tin), which may be soldered.

Figure 4:
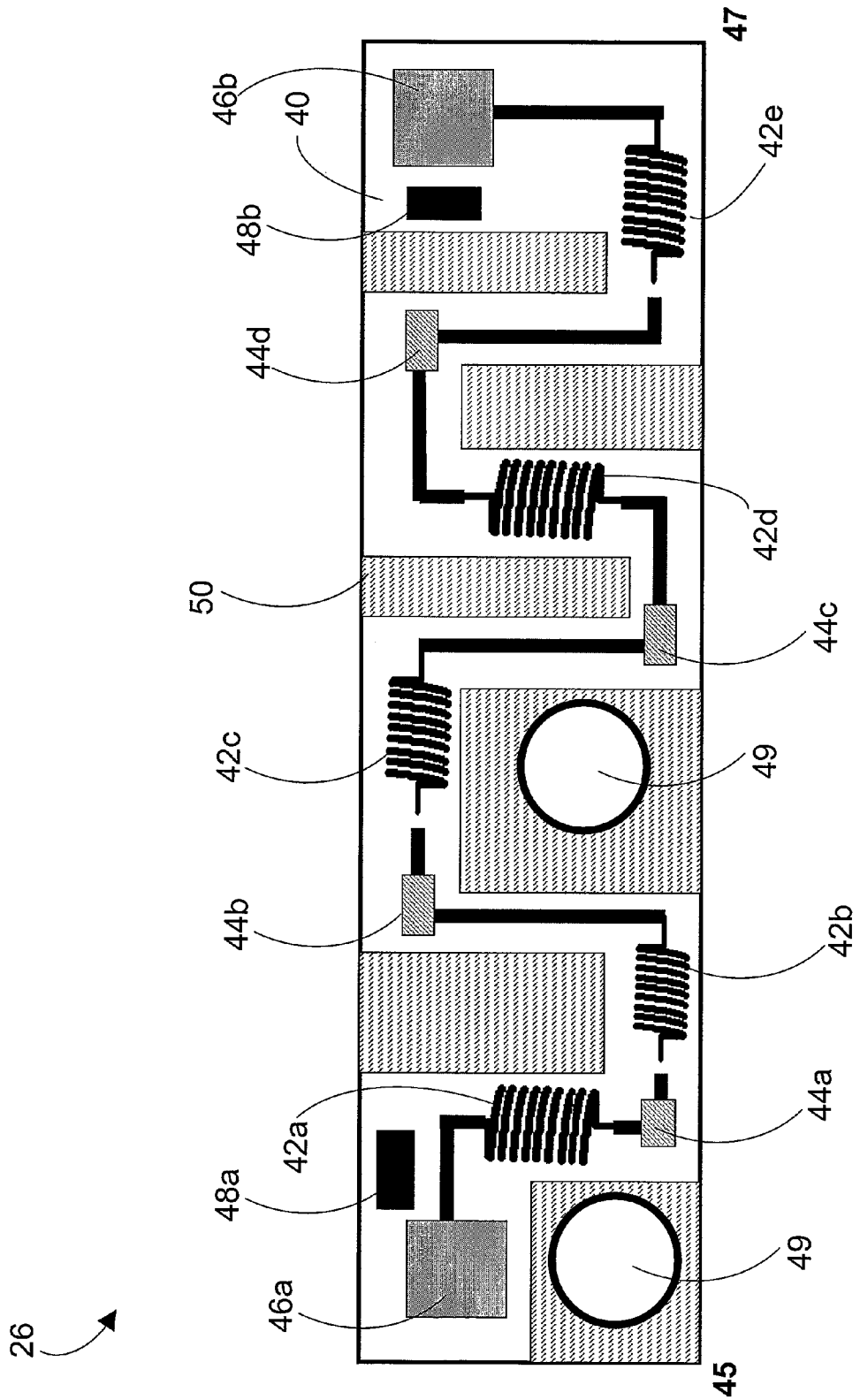
FIG. 4 is a top plan view of a lumped element filter according to one illustrative embodiment.

FIG. 4 shows a lumped element filter 26 according to one illustrative embodiment.

As noted above, the lumped element filter 26 is a low pass filter that may form one superconducting filtering stage, for example, filtering noise from approximately 1 MHz, 3 MHz or 5 MHz to approximately 2-4 GHz. The lumped element filter 26 includes a dielectric medium substrate (such as an electrically insulative substrate portion of a circuit board) 40, a number of superconducting inductors 42a-42e (collectively 42), a number of capacitors 44a-44d (collectively 44), signal interconnect pads 46a and 46b, ground terminals 48a and 48b, and superconducting traces formed by substantially non-magnetic material. In some embodiments, the dielectric medium substrate 40 may carry (e.g., internally and/or externally) a copper layer that is lapped, polished, and gold-plated. The dielectric medium substrate 40 may be annealed, and may be comprised of substantially non-magnetic material. An input end is denoted by 45, while an output end is denoted by 47.

As illustrated, the dielectric medium substrate 40 carries five superconducting inductors 42a-42e to form a five stage filter, including a large superconducting inductor 40a (e.g., approximately 2200 nH), two medium superconducting inductors 42b, 42c (e.g., approximately 270 nH), and two small superconducting inductors 42d, 42e (e.g., approximately 27 nH). Other embodiments may employ a different number and/or sizes of superconducting inductors 42. For example, one embodiment may employ four superconducting inductors 42. The superconducting inductors 42 may take the form of aluminum wire wound air core inductors, which are superconducting at suitable low temperatures and non-magnetic. These superconducting inductors 42 may be bound by Emerson and Cummings 1266 epoxy, which is suitable for low temperatures. Alternatively, superconducting inductors 42 may take the form of glass core/metglass core inductors or may employ other materials suitable for the extremely low temperatures. For reasons already discussed, in some embodiments it may be advantageous to ensure that superconducting inductors 42 of comprised of substantially non-magnetic materials.

As illustrated, the dielectric medium substrate 40 carries two signal interconnect pads 46a, 46b and two ground terminals 48a, 48b. In this particular embodiment, there is one superconducting input contact pad 46a with ground 48a, and one superconducting output contact pad 46b with ground 48b. In alternative embodiments, a plurality of ground terminals may be located proximate either the input or the output due to space constraints. A non-superconducting ground plane may be carried on the face of the dielectric medium substrate 40 opposed to the face that is visible in FIG. 4. In some embodiments, the edges of dielectric medium substrate 40 may be plated with non-superconducting material to provide a thermal path connecting the ground plane to at least a portion of non-superconducting material 50 carried on the face that is visible in FIG. 4. The dielectric medium substrate 40 may include mounting holes 49 sized to receive fasteners to fasten and thermalize the lumped element filter plates 30. The mounting holes 49 may, for example include a gold plated oxygen-free copper.

As illustrated, the dielectric medium substrate 40 carries four capacitors 44a-44d (collectively 44). The capacitors 44 may take the form of ceramic capacitors, or example porcelain capacitors, which are commercially available and substantially non-magnetic. The capacitors 44 may employ other exotic materials suitable for the extremely low temperatures. In some embodiments, at least one capacitor may couple at least one superconducting trace directly to the ground plane.

The dielectric medium substrate 40 may include one or more electrically and thermally insulative layers of FR4 or KAPTON, with a copper pour over the top and bottom thereof. The layer(s) of FR4 or KAPTON should be thin to reduce the amount of thermal insulation the layer provides, while the copper pour should be thick. The bottom copper pour or layer may be coated with gold to provide a good, dry thermal contact that is clamped. The copper pour may extend over the edges of the insulative layer(s) to provide a good thermally conductive path between the top and bottom copper pours or layers.

Figure 5:
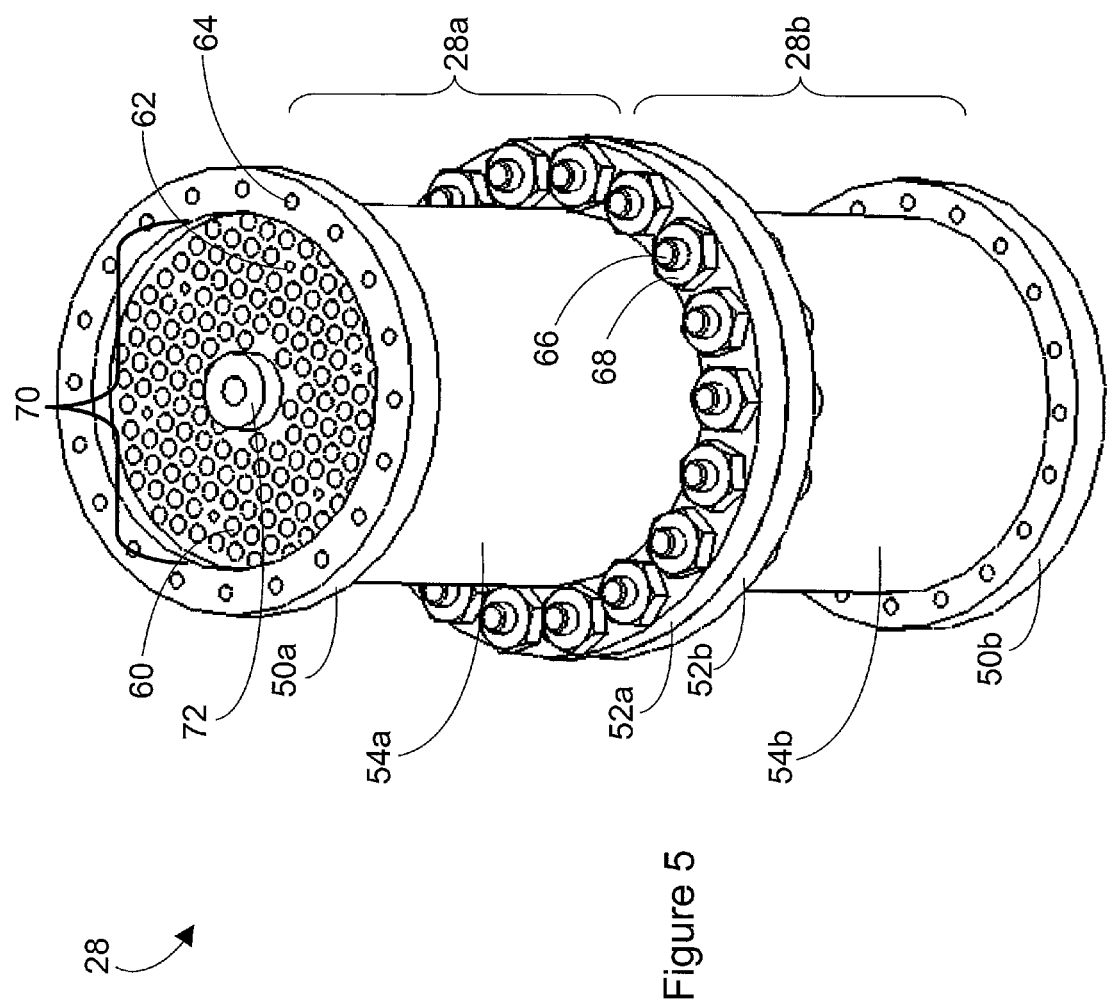
FIG. 5 is an isometric view of a portion of a metal powder filter assembly according to one illustrative embodiment which employs a multi-portion assembly.

FIG. 5 shows a portion of a metal powder filter assembly 28 according to one illustrative embodiment.

The metal powder filter assembly 28 may thermally couple the lumped element filter assembly 20 (not shown in FIG. 5) with the device sample holder assembly 24 (not shown in FIG. 5). The metal powder filter assembly 28 provides a structure with a number of conduits 60 (only one called out in the Figure) that receive respective superconducting wires 204 (FIGS. 10A-10E) and metal powder filter structures 200 (FIG. 10D). The metal powder filter assembly 28 may include one or more portions, for example a first portion 28a and a second portion 28b. In the embodiment shown in FIG. 5, the portions 28a and 28b are formed of high purity copper, for example C10100 copper or oxygen-free electronic copper, and may be thus be referred to as copper bars or bars of a copper bar assembly. In some embodiments, portions 28a and 28b may also be gold plated (e.g., ASTM B 488, Type III, Grade A, Class 2) to prevent surface oxidation and also to provide thermalization (i.e., good thermally conductive path). Portions 28a and 28b may be annealed, and they may have polished surfaces. Those of skill in the art will appreciate that some embodiments may employ materials in addition or in substitution for high purity copper. However, for reasons already discussed, it may be advantageous to ensure that portions 28a and 28b are comprised of substantially non-magnetic material. Furthermore, in order to provide good thermal paths, it may be advantageous to ensure that portions 28a and 28b are comprised of substantially non-superconducting material.

In embodiments that include at least two portions 28a and 28b, the first and second portions 28a and 28b may be identical or similar in construction. Two-piece construction may advantageously simplify the machining process.

Each of the first and second portions 28a, 28b may have an interface flange 50a, 50b located at an interface end and a mating flange 52a, 52b located at a mating end that is opposed to the respective interface end. The mating ends of the first and second bars 28a, 28b may be sized, dimensioned and/or finished to mate together. The interface ends may be sized, dimensioned and/or finished to interface with other components of the I/O system 10. For example, the interface end of the first portion 28a may be sized, dimensioned and/or finished to interface with the lumped element filter assembly 20. Also for example, the interface end of the second portion 28b may be sized, dimensioned and/or finished to interface with the pedestal assembly 23 and/or the device sample holder assembly 24.

Each of the first and the second portions 28a, 28b may include a substantially tubular or cylindrical body 54a, 54b, respectively, with a mating flange 52a, 52b, respectively, proximate the mating end, and an interface flange 50a, 50b, respectively, proximate the interface end. The surfaces of the mating and interface flanges 52a, 52b, 50a, 50b may be lapped and polished (e.g., RA2) to achieve good thermal conductivity and/or to prevent leakage of epoxy during manufacture. All surfaces may also be gold plated to prevent oxidation and to facilitate good thermal contacts.

The tubular body 54a, 54b may include a plurality of longitudinal passages 60 (only one called out in the Figure) extending therethrough, which may serve as conduits to receive respective superconducting wires 204 (FIGS. 10A-10E) and metal powder filter structures 200 (FIG. 10D). Two-piece construction (first and second portions 28a, 28b) may advantageously simplify the machining of these longitudinal passages 60, which would otherwise have a very high aspect ratio. The mating and interface flanges 52a, 52b, 50a, 50b may each enclose the plurality of longitudinal passages 60 that traverse portions 28a and 28b.

As illustrated, the tubular body 54a, 54b includes one hundred and forty four (144) longitudinal passages 60 arranged in a number of successively adjacent offset rows to create a hexagonal honeycomb type structure, although the longitudinal passages 60 may be arranged in any other pattern. Some embodiments may include a greater or lesser number of longitudinal passages 60. Including more longitudinal passages 60 than the minimum number of electrically superconducting paths required for operation may advantageously provide redundancy, should one or more of the superconducting wires be damaged or metal powder filters fail to function properly. The longitudinal passages 60 each hold a respective superconducting wire 204 (FIGS. 10A-10E) and metal powder filter structure 200 (FIG. 10D).

The tubular body 54a, 54b may also include a number of alignment holes 62 (only one called out in the Figure) extending therethrough. The alignment holes 62 may be threaded to receive an end of respective stud (not shown in the Figure), which may for example be brass. Note that, in the Figure, alignment holes 62 are smaller in diameter than passages 60.

The mating and interface flanges 52a, 52b, 50a, 50b may include a plurality of apertures 64 (only called out in the Figure). The apertures 64 may be sized to receive fasteners. For example, the apertures may be sized to receive threaded bolts 66 having a head and a threaded portion (only one called out in Figure), which are secured by nuts 68 (only one called out in Figure). The bolts 66 and nuts 68 may be brass.

The apertures 64 may be spaced around the mating and interface flanges 52a, 52b, 50a, 50b to ensure good physical contact, provide a good thermally conductive path, and provide a good electrically conductive path between the two portions 28a, 28b, and between the first portion 28a and the lumped element filter assembly 20 as well as between the second portion 28b and the pedestal assembly 23 and/or the device sample holder assembly 24. The seal should also be adequate to prevent the epoxy filling the longitudinal passages 60 from leaking out from the interface of the mating flanges 52a, 52b during manufacture. The seal should also be sufficient to maintain the electrically noise-free spaces (i.e. 34 and 70) within the filter assemblies (i.e., lumped element filter assembly 20 and metal powder filter assembly 22).

The interface flanges 50a, 50b may form a cavity 70 (only one visible in the Figure). The cavity 70 may be sized to receive one or more circuit boards, as discussed below. A post 72 may extend from each or either interface end. The post 72 may include a threaded aperture, sized to receive a fastener (not shown in the Figure). As illustrated the post 72 may be longitudinally centered on the interface end.

Figure 6:
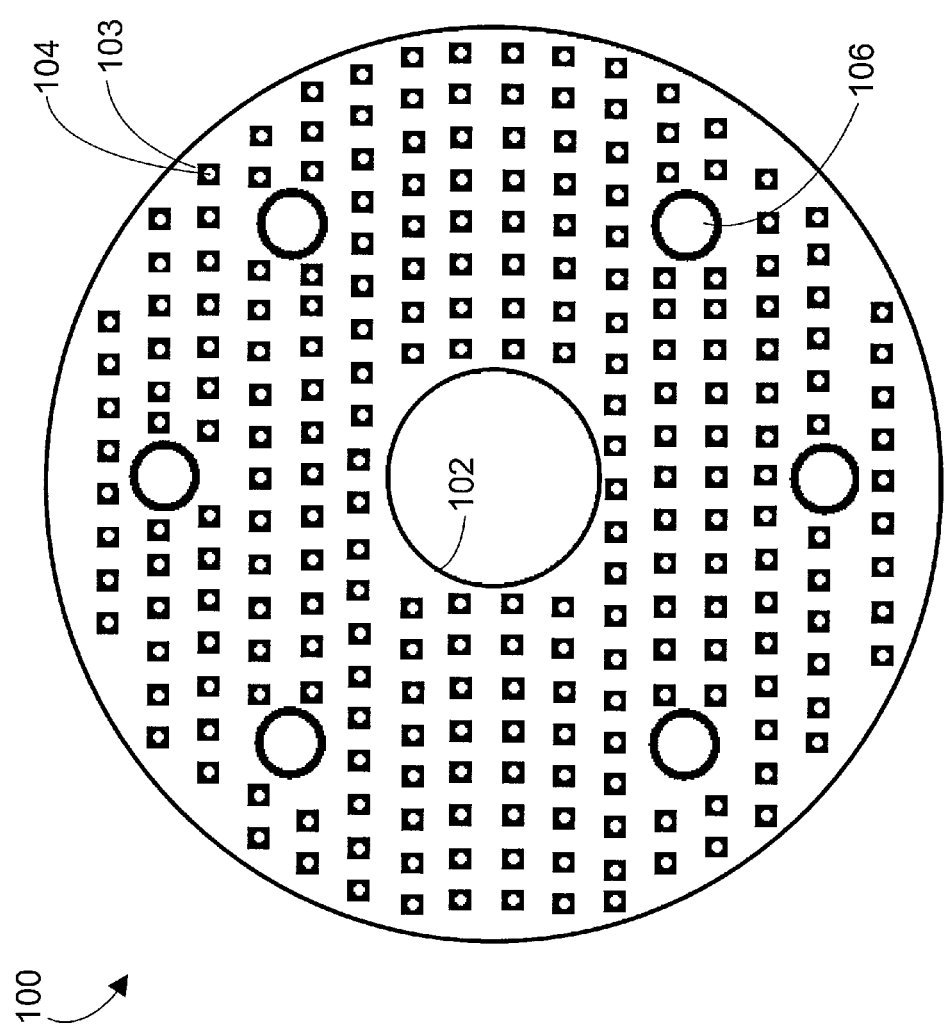
FIG. 6 is an isometric view of a signal circuit board that forms part of the metal powder filter assembly according to one illustrative embodiment.

FIG. 6 shows a signal circuit board 100, according to one illustrative embodiment.

The signal circuit board 100 forms part of the metal powder filter assembly 22. In some embodiments, the signal circuit board 100 may provide a connection between different sized electrically superconducting paths (e.g., between thin and thick Niobium wiring). The signal circuit board 100 may include one or more layers. For example, the signal circuit board 100 may include a copper layer which is plated with either white tin or gold depending on the requirements of that region on the surface. The white tin layer is used to provide a superconducting path while the gold layer is used to improve thermal contact by preventing the growth of an oxide layer. Note that gold and white tin layers can be adjacent to one another on the same copper surface.

The signal circuit board 100 is sized and dimensioned to be received in the cavity 70 (FIG. 5) that is proximate the pedestal assembly 23 and device sample holder assembly 24. For example, the signal circuit board 100 may take the form of a flat disk having an approximately circular profile. A central aperture 102 is sized and dimensioned to receive the post 72 (FIG. 5), which thereby serves as an alignment structure. While shown as circular, the central aperture 102 may have a variety of other shapes. Non-symmetrical shapes (not shown) may be employed to assure that the signal circuit board 100 is also rotationally aligned.

The signal circuit board 100 may carry a plurality of solder pads 103 (represented by black squares in the Figure) and include a plurality of through-holes 104 (represented by white circle in the Figure) that align with the longitudinal passages 60 (FIG. 5), such that each through-hole passes through a respective solder pad. Thus, a superconducting wire extending from each respective longitudinal passage 60 may pass through and be soldered to a respective through-hole 104 in signal circuit board 100. The signal circuit board 100 may include a plurality of alignment holes 106, each of which aligning with a respective one of the alignment holes 62 (FIG. 5), which thereby serve as alignment/mounting/clamping/thermalizing structures. The alignment holes 106 may be sized to receive studs (e.g., brass studs) (not shown in the Figure) therethrough, which may be fastened with gold plated high purity copper nuts (shown in the FIG. 9C). The bottom surface of the signal circuit board 100 may include a copper ground plane that is gold plated for thermal contact to the metal powder filter assembly 22 except where holes (104) pass through. These holes 104 may be electrically isolated from the ground plane. The central aperture 102 and/or alignment holes 106 may be gold plated to provide a good thermally conductive path between top and bottom layers.

The signal circuit board 100 may serve as an epoxy seal. In particular, wires soldered in place to the signal circuit board 100 form a seal to flow of epoxy from the longitudinal passages 60 (FIG. 5), and may prevent noise from bypassing the filtering. All edges of signal circuit board 100 that are adjacent to features of the portion 28b may be sealed with epoxy.

Figure 7:
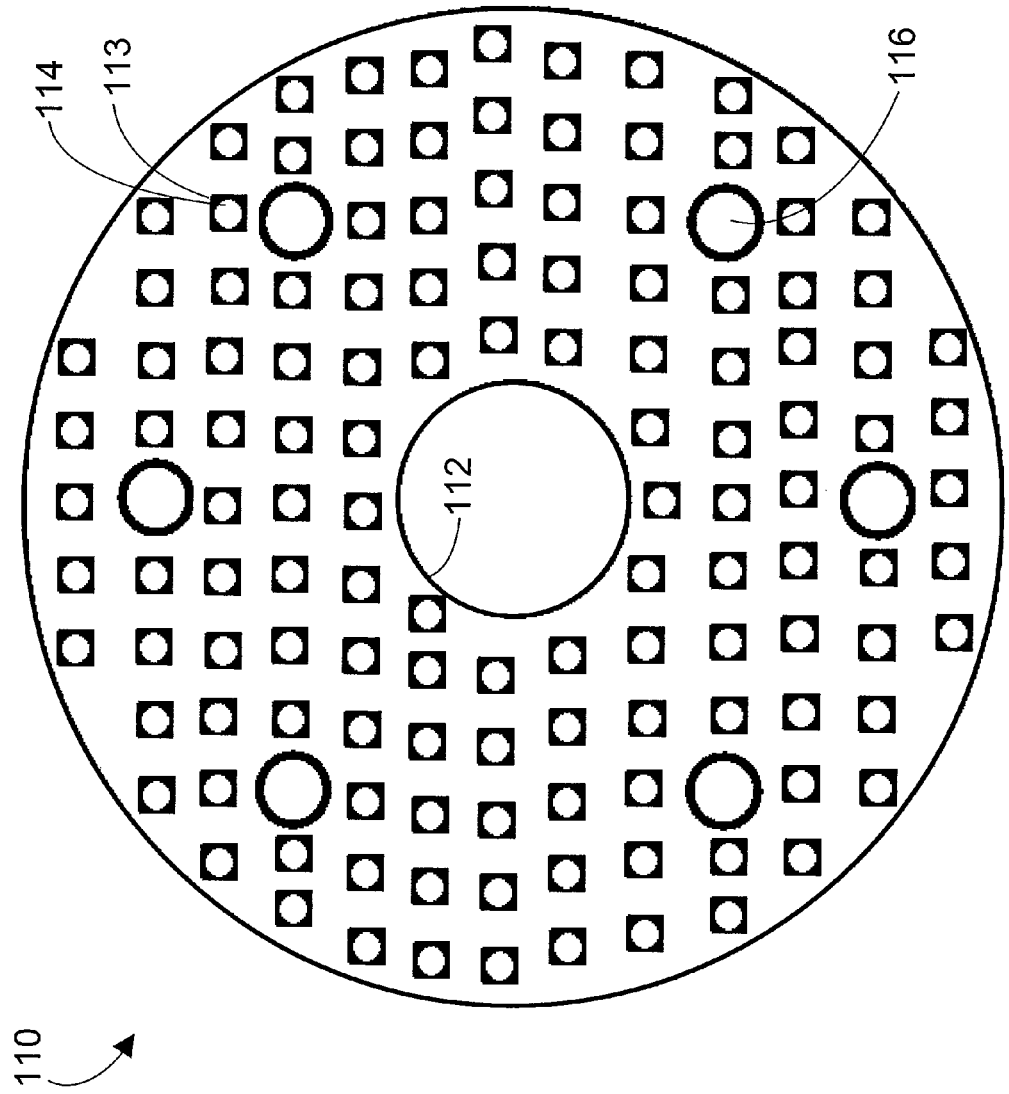
FIG. 7 is an isometric view of a ground circuit board that forms part of the metal powder filter assembly according to one illustrative embodiment.
Figure 8B:
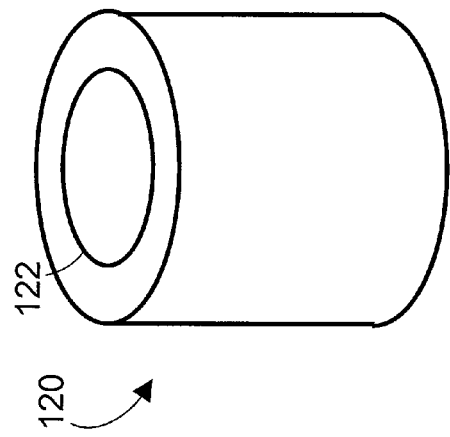
FIG. 8B is an isometric view of the spacer of FIG. 8A.
Figure 8D:
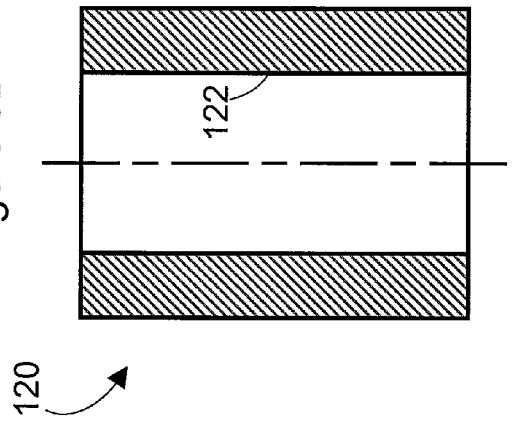
FIG. 8D is cross-sectional view of the spacer of FIG. 8A.
Figure 8A:
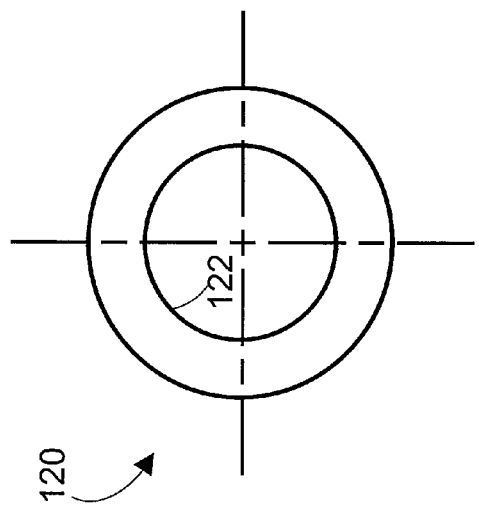
FIG. 8A is a top plan view of a spacer of the metal powder filter assembly according to one illustrative embodiment.
Figure 8C:
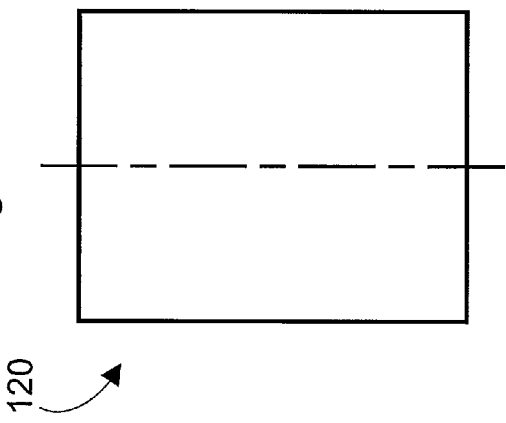
FIG. 8C is a front plan view of the spacer of FIG. 8A.

FIG. 7 shows a ground circuit board 110, according to one illustrative embodiment.

The ground circuit board 110 forms part of the metal powder filter assembly 22. The ground circuit board 110 provides an easy-to-solder surface to launch shields that surround signal lines on either end of the metal powder filter assembly 22. The ground circuit board 110 may include one or more layers. For example, the ground circuit board 110 may include a copper layer, which carries either a white tin layer or a gold layer depending on the requirements of that region on the surface. The white tin layer is used to provide a superconducting path while the gold layer is used to improve thermal contact by preventing the growth of an oxide layer. Note that gold and white tin layers can be adjacent to one another on the same copper surface.

The ground circuit board 110 is sized and dimensioned to be received in the cavity 70 (FIG. 5) in both the portion that is proximate the lumped element filter assembly 20 and the portion that is proximate the pedestal assembly 23 and device sample holder assembly 24. Thus, in some embodiments, a metal powder filter assembly 22 may include one signal circuit board 100 located at the end proximate the pedestal assembly 23 and two ground circuit boards 110 each located at a respective end of the metal powder filter assembly 22. Ground circuit board 110 may take the form of a flat disk having an approximately circular profile. The ground circuit board 110 may or may not have central aperture 112 or gold annulus to receive the post 72 (FIG. 5), which thereby serves as an alignment structure. While shown as circular, the central aperture 112 may have a variety of other shapes. Non-symmetrical shapes (not shown) may be employed to ensure that the ground circuit board 110 is also rotationally aligned.

The ground circuit board 110 may carry a plurality of solder pads 113 (represented by black squares in the Figure) and include a plurality of through-holes 114 (represented by white circles in the Figure) that align with the longitudinal passages 60 (FIG. 5), such that each through-hole passes through a respective solder pad. A superconducting coaxial cable including an inner wire wrapped in insulating tubing and enclosed by a braided sheath may enter one side of ground circuit board 110, passing through a through-hole 114. The braided sheath of the coaxial cable may be soldered to a solder pad on one side of ground circuit board 110 such that the braided sheath does not pass through the through-hole 114. The ground circuit board 110 may include a plurality of alignment holes 116, each of which that aligns with a respective one of the alignment holes 62 (FIG. 5), which thereby serve as alignment structures. Alignment holes 62 (FIG. 5) may themselves each be in the center of a gold-plated annulus for mounting/clamping/thermalizing. The alignment holes 116 may be sized to receive studs (e.g., brass studs) (not shown in the Figure) therethrough, which may be fastened with gold plated high purity copper or brass nuts (also not shown in the Figure). The central aperture 112 and/or alignment holes 116 may be gold plated to provide a good thermally conductive path when mounted/clamped to the metal powder filter assembly 22. Holes 114 may each be heat-relieved from the rest of the board and located in the center of an annulus that is coated with white tin for solderability. The ground circuit board 110 is light weight, and may be diced for ease of assembly.

Note that, in the Figures, each of metal powder filter assembly 28 (FIG. 5), signal circuit board 100 (FIG. 6), and ground circuit board 110 (FIG. 7) is shown with a different number of passages/through-holes. Those of skill in the art will appreciate that a metal powder filter assembly 22 may include any number of signal lines, and thus each of metal powder filter assembly 28, signal circuit board 100, and ground circuit board 110 may include any number of passages/through-holes. However, in any given embodiment, it may be advantageous for signal circuit board 100 and ground circuit board 110 to have the same number of through-holes 104,114 as the number of passages 60 in metal powder filter assembly 28.

FIGS. 8A-8D show a spacer 120 according to one illustrative embodiment.

The spacer 120 may be used to space one or more of the circuit boards within the cavity 70 (FIG. 5). The spacer 120 may be C10100 copper or oxygen-free electronic copper, which may be coated with gold. The spacer 120 may have approximately the same height as the post 72. The spacer 120 includes a through hole 122 sized and dimensioned to receive a stud (not shown in the Figure). The spacer 122 also serves as a thermal connection between the ground circuit board 110 and the metal powder filter assembly 28.

In at least one embodiment, the cavity 70 proximate the pedestal assembly 23 and device sample holder assembly 24 receives both a signal circuit board 100 (FIG. 6) and a ground circuit board 110 (FIG. 7), while the cavity 70 proximate the lumped element filter assembly 20 receives only a ground circuit board 110. The signal circuit board 100 (FIG. 6) should be fit as low as possible in the cavity 70, against the face of the portion 28b with the openings of the longitudinal passages 60. Threaded rods or studs and nuts may be used to clamp the signal circuit board 100 in place. Since the depths of the cavities 70 are identical, the spacer 120 is used to fill the remaining height of the cavity 70 having just the ground circuit board 110. The signal circuit board 100 may be secured using an epoxy (e.g. ITW DEVOCON 2 TON clear epoxy)

FIGS. 9A-9D show a nut 124 according to one illustrative embodiment.

The nut 124 may be used to secure various components. For example, the nut 124 may secure the lumped element filter plates 30 to a stud (not shown in the Figure). The nut 124 may be used to secure the first and second portions 28a, 28b of the metal powder filter assembly 28 together.

The nut 124 may be C10100 copper or oxygen-free electronic copper, which may be coated with gold. The nut 124 includes a threaded opening 126. The threaded opening 126 may be sized and dimensioned to fasten to a thread on an end of a stud (not shown in the Figure), which could then be used to clamp the signal circuit board 100 to the metal powder filter assembly 28 and provide a surface upon which to clamp ground circuit board 110, thereby providing a mounting point and thermal contact to the ground circuit board 110.

Figure 10A:
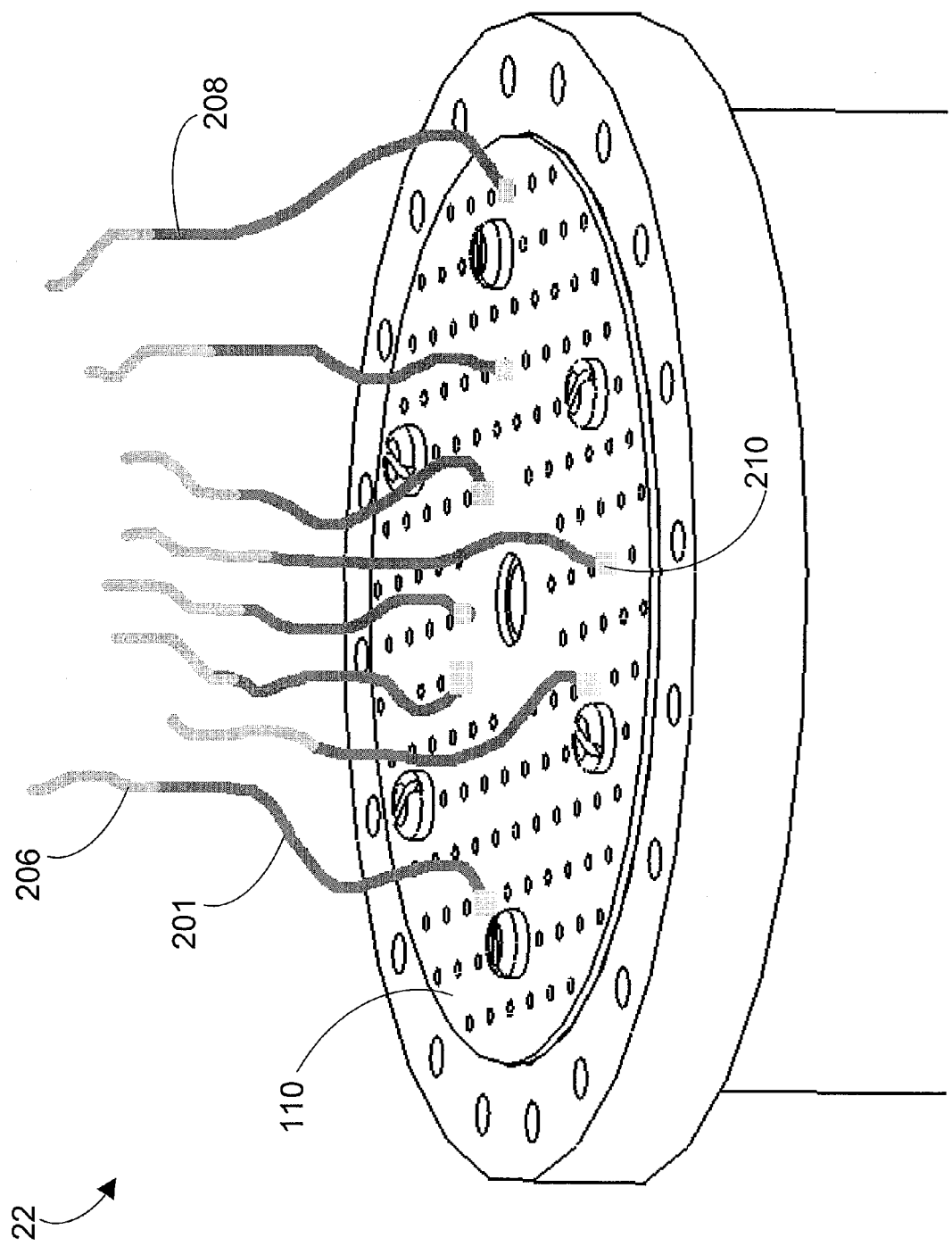
FIG. 10A is an isometric view of a set of signal lines or cables connected to the metal powder filter assembly according to one illustrative embodiment.
Figure 10B:
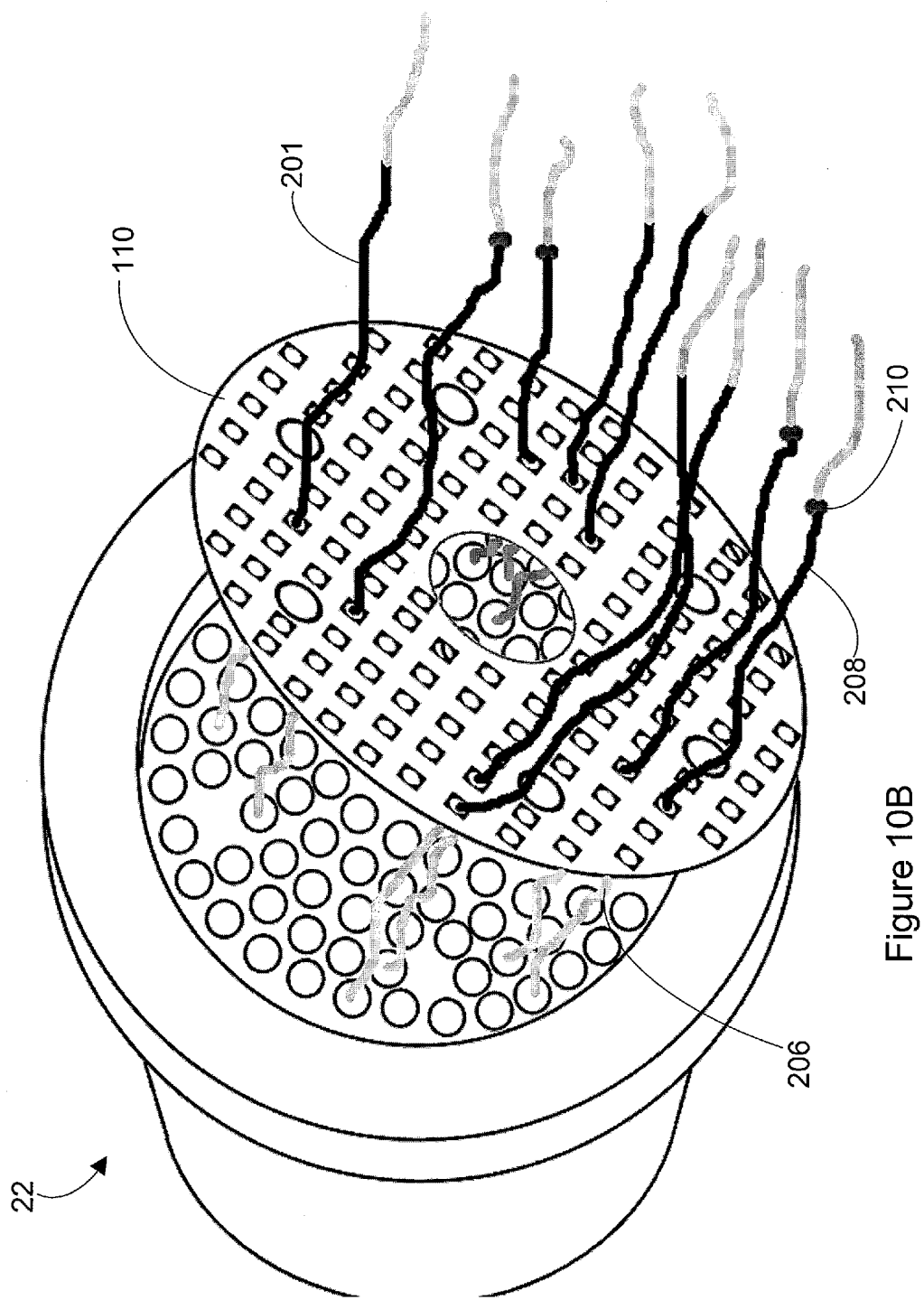
FIG. 10B is an isometric view of a signal lines or cables connected to the metal powder filter assembly according to one illustrative embodiment.
Figure 10C:
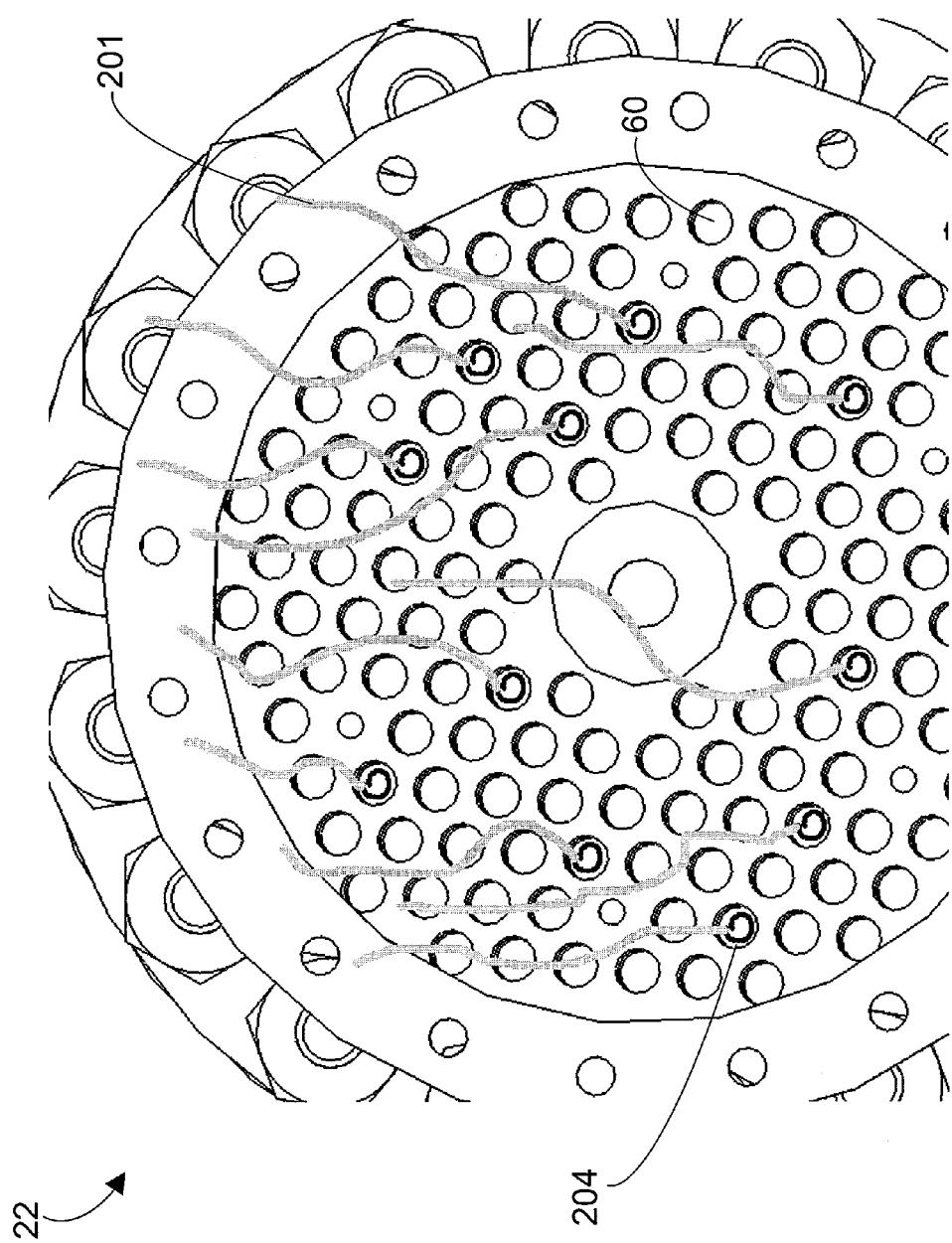
FIG. 10C is a top isometric view of a number of signal lines or cables connected to the metal powder filter assembly, showing a spiral or coiled portion of a superconducting wire of the signal lines or cables positioned in a respective passage of the metal powder filter assembly, according to one illustrative embodiment.
Figure 10D:
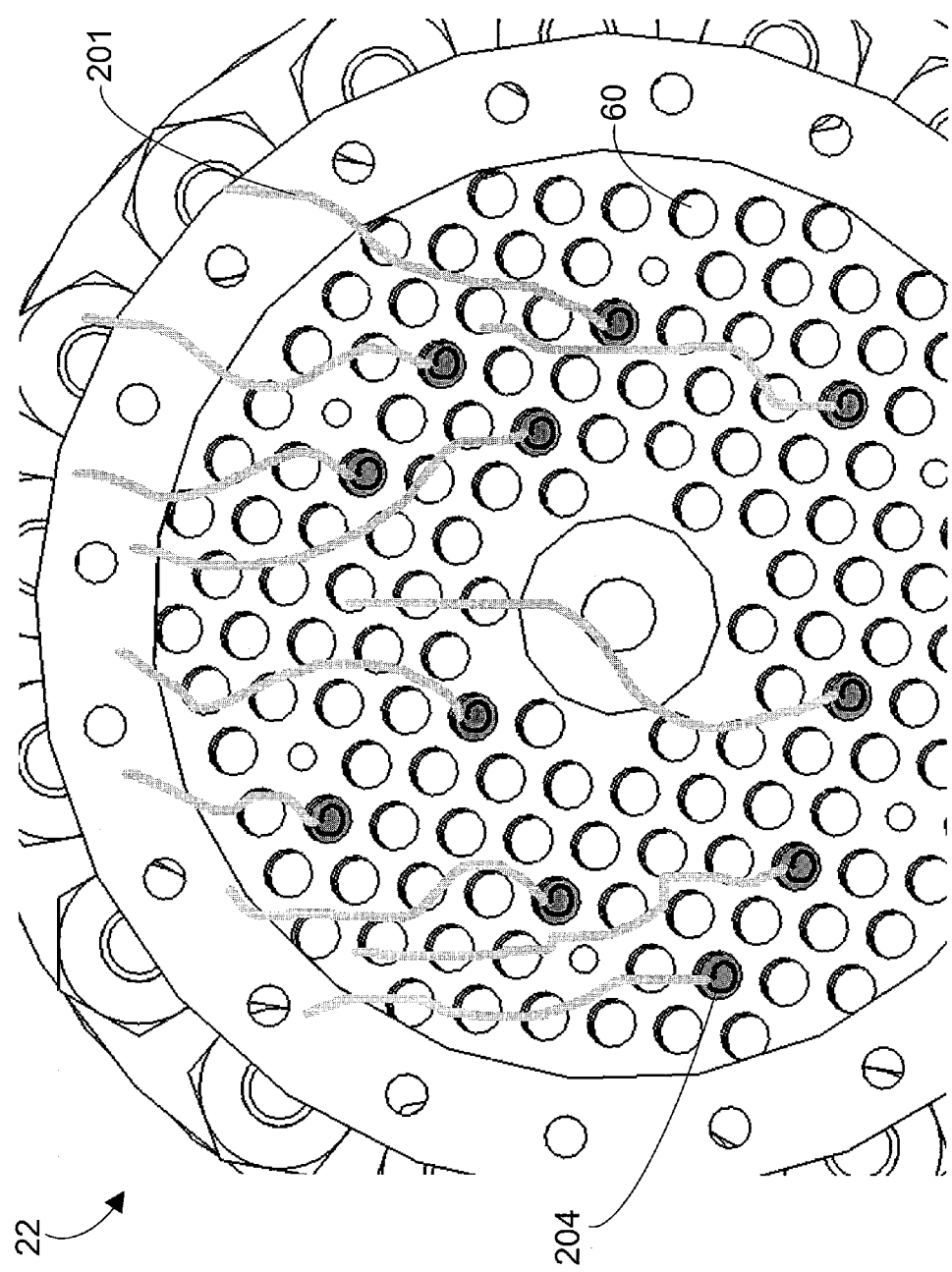
FIG. 10D is a top isometric view of a number of signal lines or cables connected to the metal powder filter assembly, showing a metal powder/epoxy mixture received about the spiral or coiled portion of a superconducting wire in a number of the passages to form a metal powder filter structure in a number of the passages of the metal powder filter assembly, according to one illustrative embodiment.
Figure 10E:
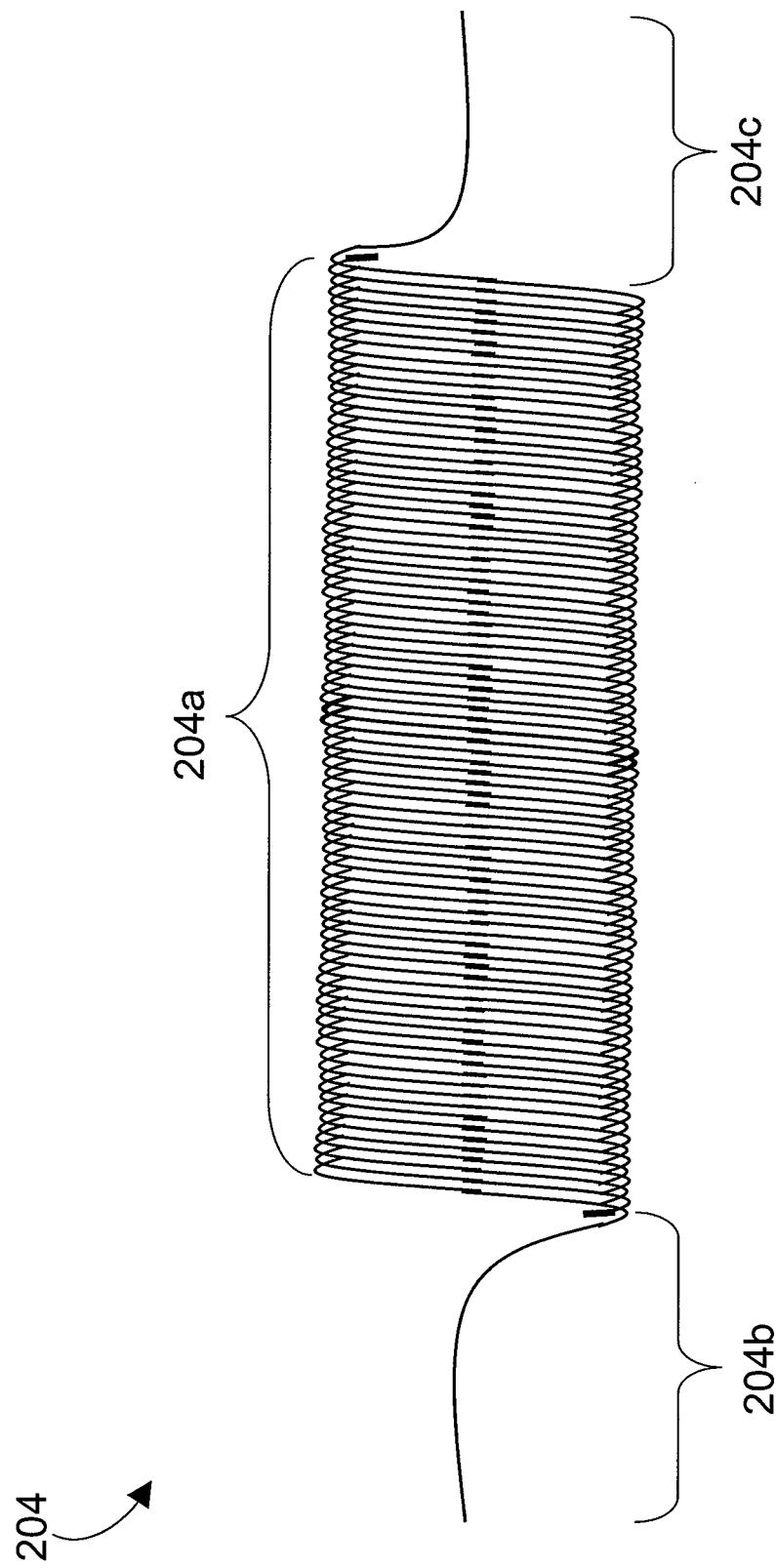
FIG. 10E is a side plan view of a superconducting wire of the signal lines or cables, showing a spiral or coiled intermediate portion between two straight end portions according to one illustrative embodiment.

FIGS. 10A and 10B show a set of cables 201 (only one called out in each Figure) extending from a ground circuit board 110 of a metal powder filter assembly 22 according to one illustrative embodiment. FIGS. 10C and 10D show a portion of superconducting wires 204 (only one called out in each Figure) from a number of the cables 201 (only one called out in each Figure) received in a respective longitudinal passage 60 (only one called out in each Figure) and a portion of each cable 201 extending therefrom. FIG. 10E shows a metal powder filter structure including a superconducting wire 204 with a wound intermediate section 204a. In a metal powder filter, the wound intermediate section 204a of the superconducting wire 204 is enclosed within a longitudinal passage 60.

There is one metal powder filter structure (comprising a superconducting wire with a wound intermediate section and a metal powder/epoxy mixture) per longitudinal passage 60. In some embodiments, a total of 144 such structures may be included. In other embodiments, either more or fewer such structures may be implemented. In some embodiments, it can be advantageous to include a greater number of metal powder filter structures than required in the system; such provides redundancy in case one or more are damaged during manufacture.

Those of skill in the art will appreciate that, for clarity in the illustrations, each of FIGS. 10A-10D shows only a small number of cables 201 and wires 204. In physical implementation, each longitudinal passage 60 receives a respective superconducting wire 204 from a respective cable 201, but such detail results in unnecessary clutter in FIGS. 10A-10D.

Each of the longitudinal passages 60 receives a portion of superconducting wire 204. The superconducting wire 204 received in the longitudinal passages 60 may be wound, spiraled or coiled to increase the amount of superconducting wire 204 in the longitudinal passage 60. As best shown in FIG. 10E, the superconducting wire 204 may include a wound intermediate section 204a (e.g., six inches coiled) between two straight end sections 204b, 204c. A large amount of superconducting wire 204 produces better filtering. The superconducting wire 204 may, for example, take the form of a Niobium wire (e.g., 100 micron diameter wire) which may include a copper cladding. Alternatively, a copper nickel cladding may be employed to enhance filtering. Alternatively, the superconducting wire 204 may take the form of a tin plated copper wire (e.g., 0.006" diameter). The portion of each of each superconducting wire 204 that extends from the longitudinal passages 60 may be encased in a respective tube 206 (only one called out in the Figures) to provide electrical insulation. The tubes 206 may take the form of PTFE (TEFLON) tubes (e.g., 26, 28, or 30 gauge).

The wound portions 204a of each of the superconducting wires 204 are inserted in a respective one of the longitudinal passages 60 (FIG. 5) of the metal powder filter assembly 22, and may be fixed or potted therein via an epoxy, for example a metal powder epoxy mix. FIG. 100 shows a number of passages 60 containing superconducting wire 204 before epoxy has been added, while FIG. 10D shows a number of passages 60 containing superconducting wire 204 and epoxy (represented by dark grey shading within the passages 60). The metal powder epoxy physically sets the superconducting wires 204 in the longitudinal passages 60 and thermalizes the structure. The particles of metal powder dissipate the high frequency signals that travel on the surface of the superconducting wire 204. Consequently, each longitudinal passage 60 becomes its own isolated environment, free of magnetic noise. The metal powder epoxy mix serves to hold the wires in place and provides a medium for high frequency signals to flow from the superconducting wires 204 and dissipate, for example via eddy currents.

In one method of assembly, the superconducting wires 204 are attached (e.g., soldered) to a thicker wire which is used to pull the wires 204 through the longitudinal passages 60 while the superconducting wires 204 are concurrently pushed. When the end of the thicker wire is touches the edge of the opening of the longitudinal passage 60, that end is soldered to the signal circuit board 100, thereby sealing the opening at the end of the longitudinal passage 60. The longitudinal passages 60 are then each filled with a metal powder/epoxy mixture during manufacture. The metal powder/epoxy mixture may, for example take the form of a mixture of copper powder and an epoxy such as Emerson and Cummings Stycast 1266 Part A & B. The metal powder/epoxy mixture may, alternatively, include brass powder as opposed to copper powder, or a combination of the two powders. The metal powder/epoxy mixture may contain a ratio of metal powder to epoxy of 2:1, 4:1 or 8:1 by weight. While a higher ratio of metal powder may be preferred to achieve better filtering, a metal powder/epoxy mixture that is too viscous may damage the wires 204. Epoxy, for example, conventional twenty minute household epoxy may be used to protect exposed surfaces. For example, epoxy may be used to form an air tight seal between the circuit boards 100, 110 and the portions 28a, 28b to protect the surfaces during manufacturing. Glue may be used to protect nuts during manufacturing.

Throughout this specification and the appended claims, the term "epoxy" is frequently used to describe an insulating compound; however, those of skill in the art will appreciate that this term is not intended to limit the various embodiments described herein, and embodiments that include epoxy material may alternatively employ resin or another insulating compound in a similar fashion.

A vacuum chamber may be used to pot the metal powder/epoxy mixture in the longitudinal passages 60. For example, the vacuum chamber may be evacuated to remove air from the longitudinal passages 60 and degas the metal powder/epoxy mixture. The metal powder/epoxy mixture may be applied to the openings of the longitudinal passages 60. Returning the vacuum chamber to atmospheric pressure causes the metal powder epoxy mix to be forced into the longitudinal passages 60. In preparation for this process, hot glue may be used to protect fastener heads from epoxy. TEFLON parts or structures may be employed to protect polished surfaces from the epoxy. DOW-CORNING Silicon vacuum grease may be used between TEFLON from gold surface for additional protection.

Portions of the tubes 206 that extend from the metal powder filter assembly 22 may be encased in a sheath 208 (only one called out in the Figures). The sheaths 208 may take the form of metal braided sheath, for example a copper braid or a tin-plated copper braid. A collar 210 (only one called out in the Figures) may be formed at each end of each sheath 208. The collar 210 may be formed from a wrap of fine wire (e.g., lead tin-coated copper), which may be soldered. Also, an end of the fine wire 204 may extend from the collar 210.

Figure 11:
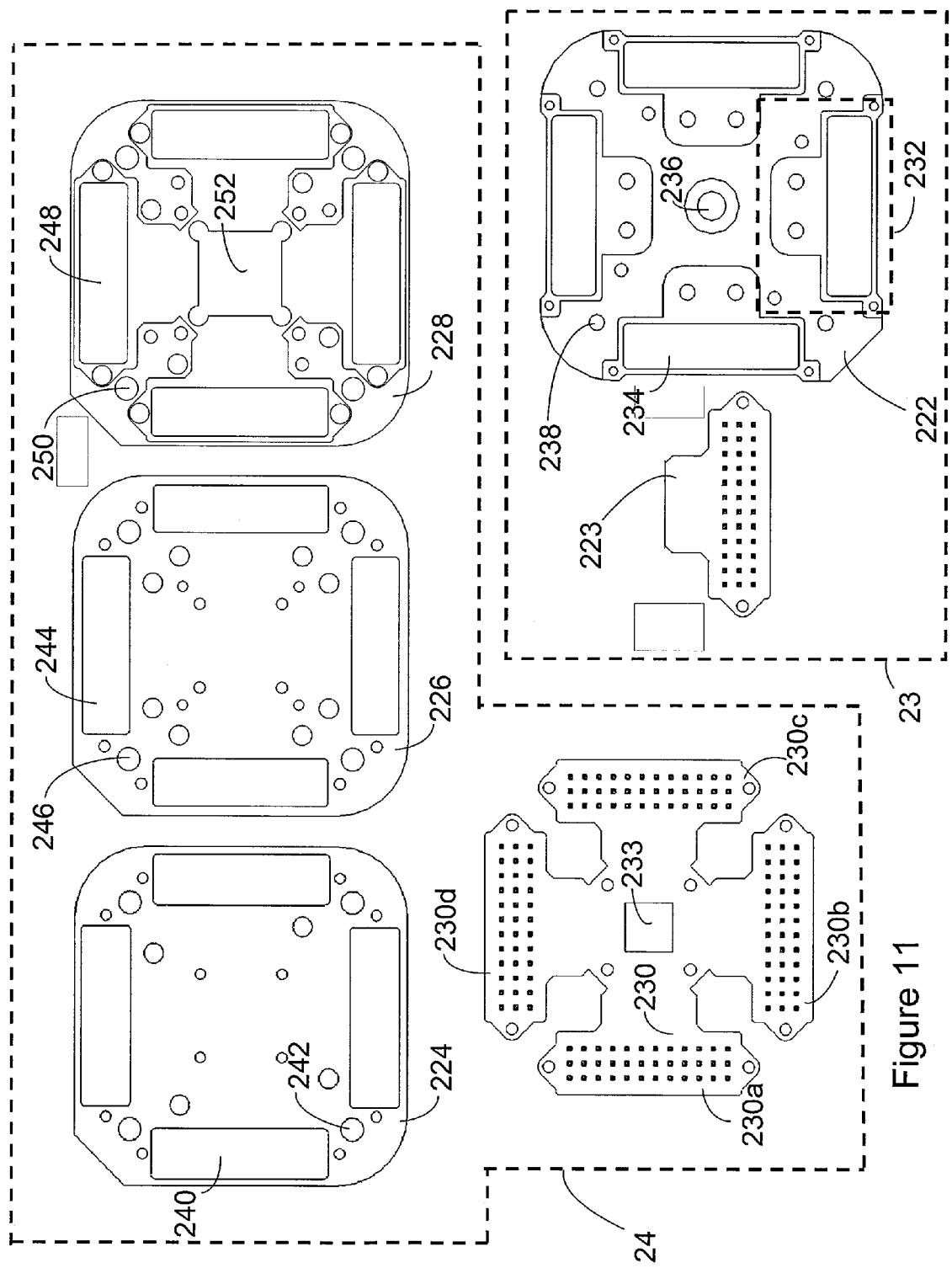
FIG. 11 is an exploded isometric view of a portion of the pedestal assembly and device sample holder assembly in an unassembled state according to one illustrative embodiment.
Figure 12:
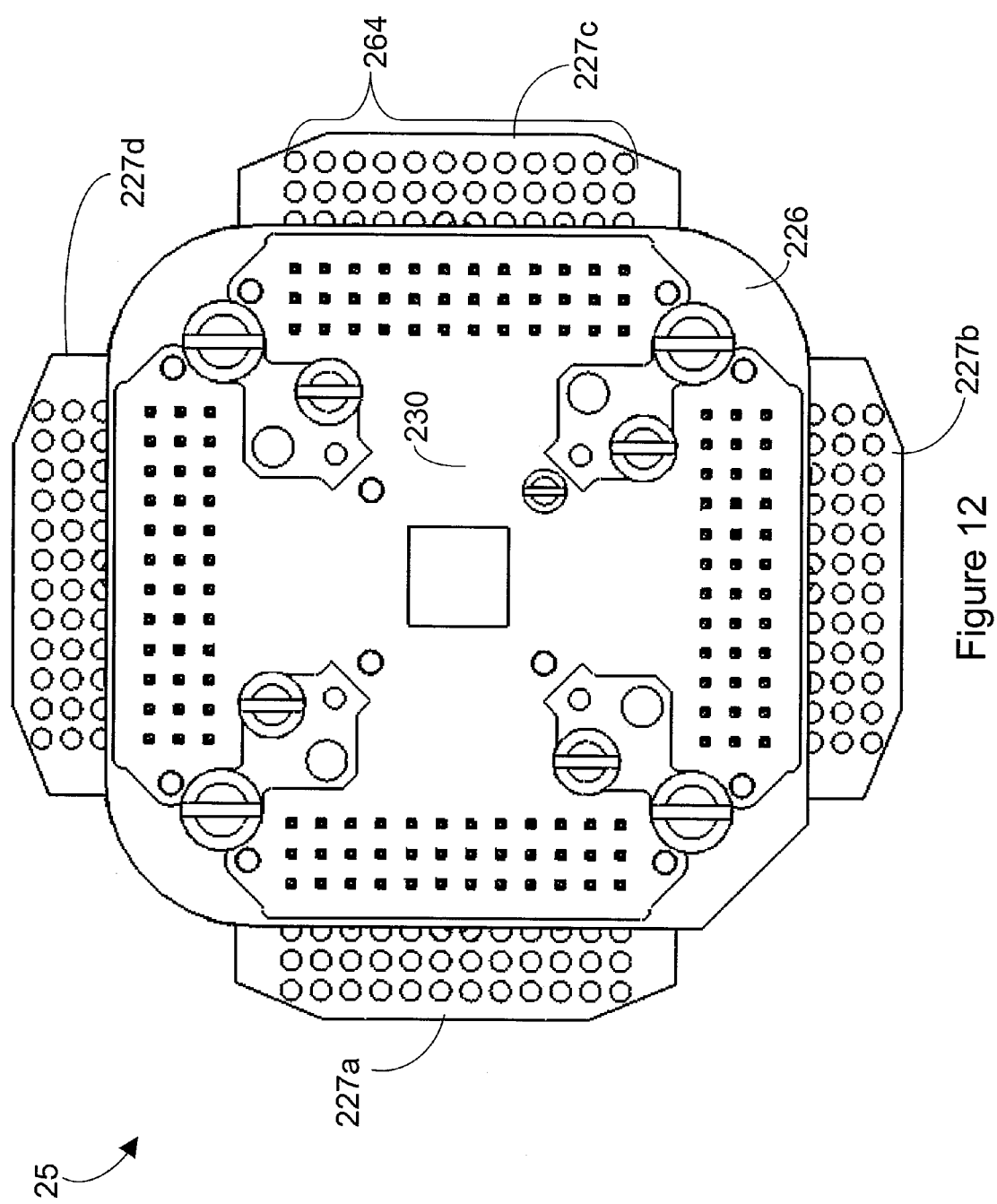
FIG. 12 is a top plan view of a pedestal assembly and device sample holder assembly in an assembled state according to one illustrative embodiment.
Figure 13A:
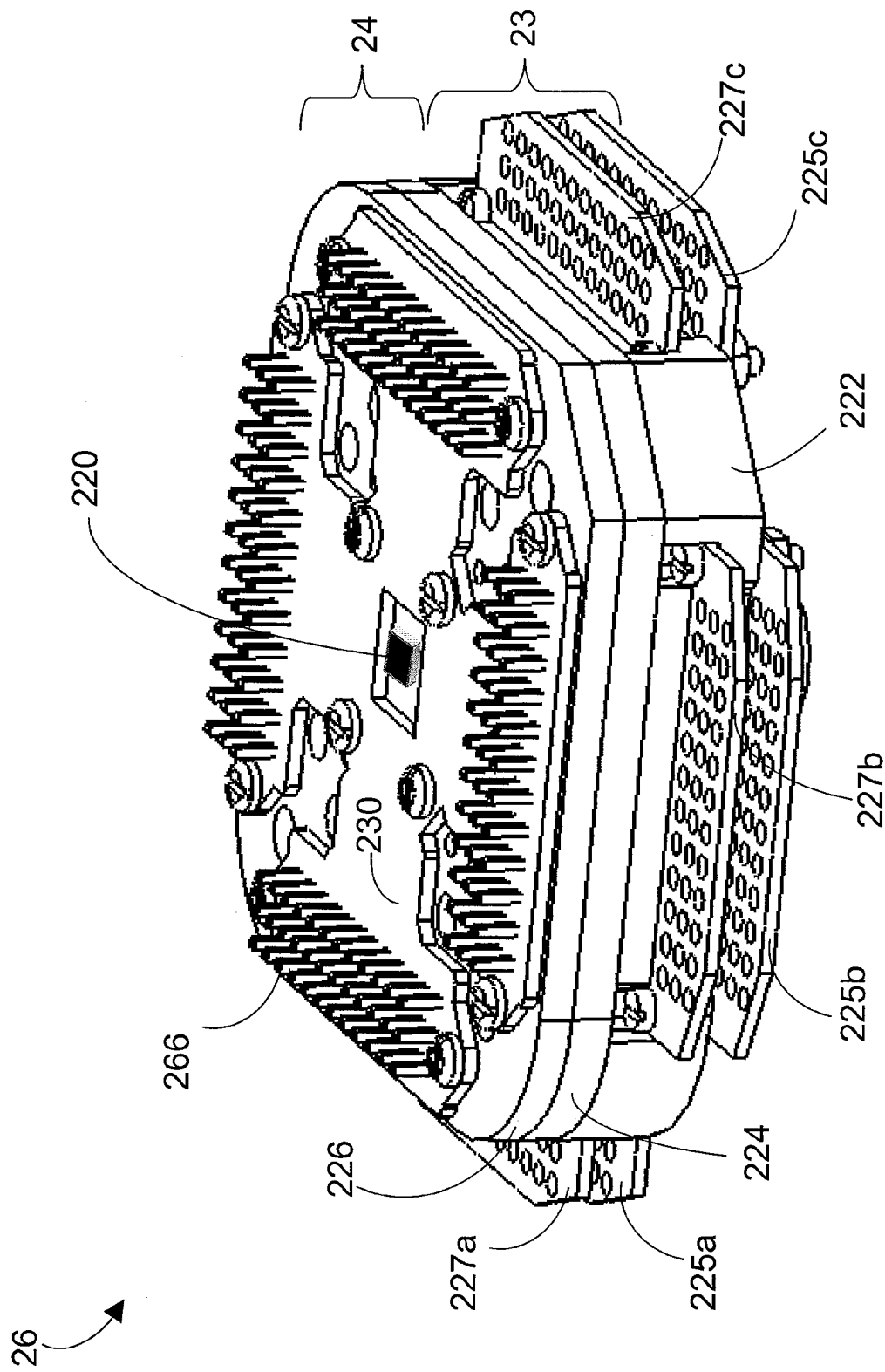
FIG. 13A is an isometric view of a pedestal assembly and device sample holder assembly carrying a device sample according to one illustrative embodiment.
Figure 13B:
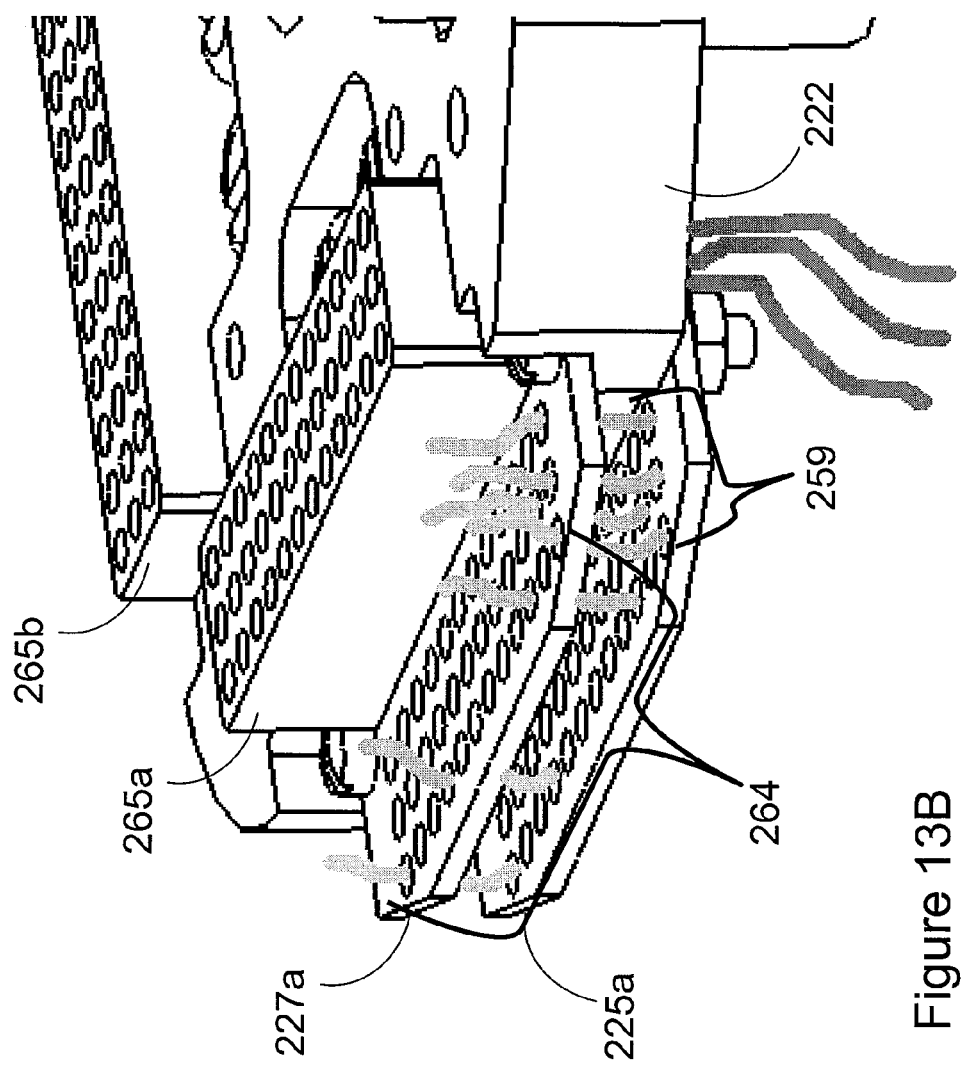
FIG. 13B shows a pedestal assembly with upper and lower circuit boards and wiring according to one illustrative embodiment.

FIG. 11 shows a pedestal assembly 23 and device sample holder assembly 24 in an unassembled state, according to one illustrative embodiment. FIG. 12 shows a pedestal assembly 23 and device sample holder assembly 24 in an assembled state 25 according to one illustrative embodiment. FIG. 13A shows a pedestal assembly 23 and device sample holder assembly 24 in an assembled state 26 carrying a device sample or chip 220 according to one illustrative embodiment. FIG. 13B shows a portion of a pedestal assembly 23 and wiring according to one illustrative embodiment. For reasons already discussed, in some embodiments it can be advantageous to ensure that the pedestal assembly 23 and the device sample holder assembly 24 are each comprised of substantially non-magnetic materials.

Figure 37:
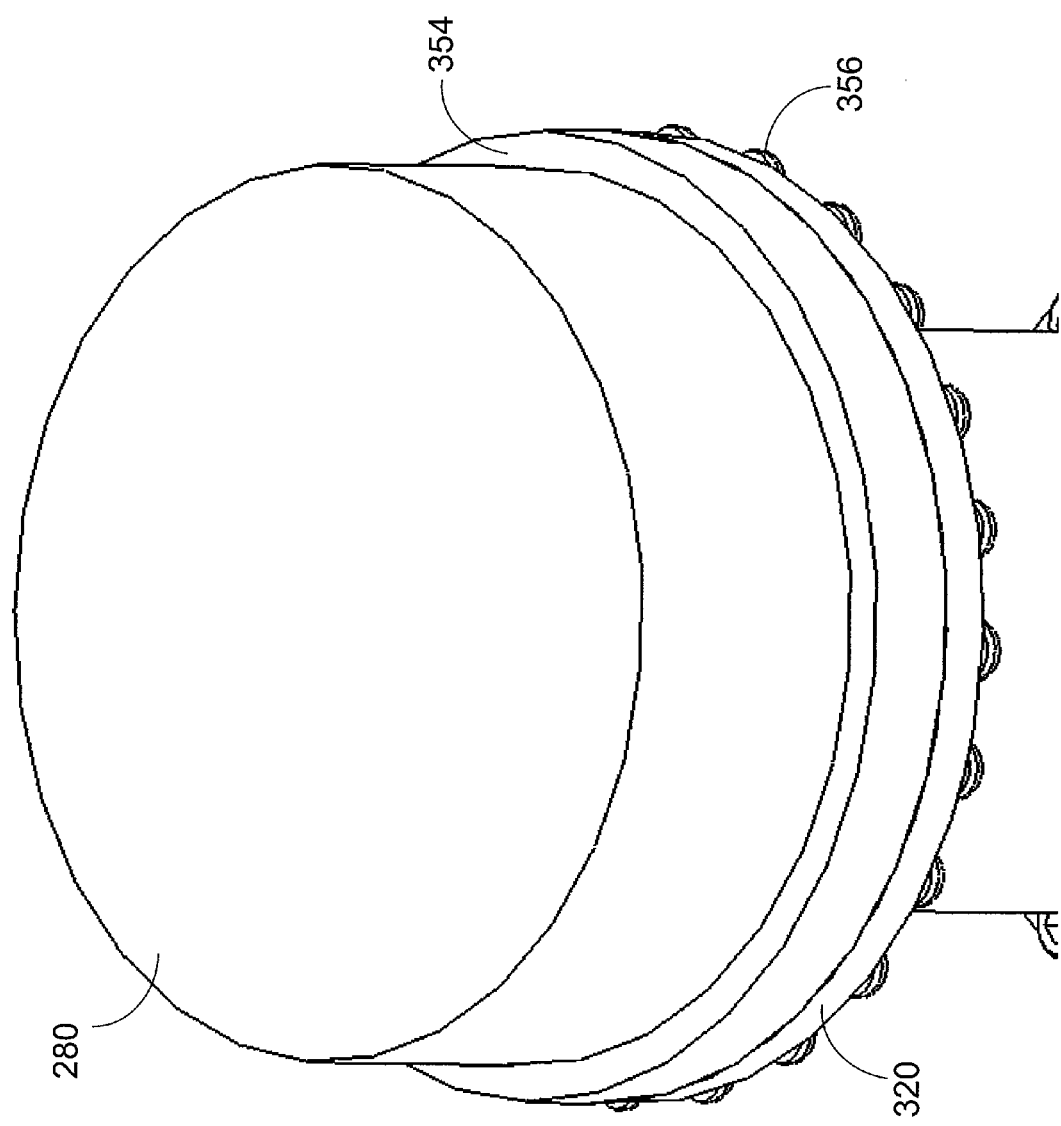
FIG. 37 is an isometric view showing the top hat or cover secured to the top or adapter plate by fasteners according to one illustrative embodiment.

As noted previously, the pedestal assembly 23 may bolt directly to the metal powder filter assembly 22 and the device sample holder assembly 24 is selectively mountable to and dismountable from the pedestal assembly 23. Alternatively, the pedestal assembly 23 may be coupled to the metal powder filter assembly 22 via one or more adapters, for example one or more adapter rings for the top hat 280 (FIG. 37). The pedestal assembly 23 includes a pedestal 222 and pedestal circuit board assembly 223. Only one board is called out in FIG. 11, but in various embodiments any number of such boards may be implemented. For instance, some embodiments may include four such boards, and other embodiments may include eight such boards. The device sample holder assembly 24 includes a thermal backplane 224, base 226, lid 228, and device sample holder circuit board assembly 230. The pedestal 222 carries pedestal circuit board assembly 223. The thermal backplane 224 may be selectively mounted and dismounted from the pedestal 222. The thermal backplane 224 carries the base 226. The base 226 carries the device sample holder circuit board assembly 230. The lid 228 overlies the base 226, such that together the lid 228 and the base 226 form an enclosure with an inner volume that is at least partially shielded from E&M radiation.

The pedestal 222 may be formed of high purity copper, for example C10100 copper or oxygen-free electronic copper. The copper may be gold plated to provide a good thermally conductive path. As illustrated, the pedestal 222 includes four wells 232 (collectively, only one called out in the Figure), each of which includes a slot 234 (collectively, only one called out in the Figure) extending through the pedestal 222. Some embodiments may include a greater number of wells, while other embodiments may include a lesser number of wells or may omit the wells entirely. As illustrated, the pedestal 222 also includes a central aperture 236. The pedestal includes a number of additional fastening apertures 238 (collectively, only one called out in the Figure) to receive fasteners. Opposed from the central aperture is a knob (not visible in the Figures). The knob may be the same diameter as the post 72 of the metal powder filter assembly 28, and physically contacts the post 72 (FIG. 5) of the metal powder filter assembly 28 when assembled.

As illustrated, the pedestal circuit board assembly 223 may include a lower circuit board or set of circuit boards, collectively 225 (three such boards, 225a-225c, are called out in FIG. 13A), and an upper set of circuit boards, collectively 227 (three such boards, 227a-227c, are called out in FIG. 13A). The lower circuit boards 225 may be formed as one circuit board with four distinct portions 225a-225d (only three visible in the Figure) or may be formed as four separate circuit boards. Similarly, the upper circuit boards 227 may include four distinct portions 227a-227d (only three visible in the Figure). In some embodiments, the lower and/or the upper circuit boards 225, 227 may have multiple arms. The lower circuit board or sets of circuit boards 225 provides a ground, while the upper circuit board or sets of circuit boards 227 routes signals. Alternatively, the pedestal circuit board assembly 223 may include one circuit board or set of circuit boards, for example the upper circuit board 227, which would route signals and provide ground.

The portions 225a-225d of the lower circuit board 225 may be positioned on or proximate a bottom face of the pedestal 222. A part of each of the portions 225a-225d may be aligned or in registration with respective slots 234 of the pedestal 222 to allow superconducting electrical connections to be made. The portions 227a-227d of the upper circuit board 227 may be positioned in respective wells 232 of the pedestal 222, the portions 227a-227d aligned or in registration with respective portions 225a-225d of the lower circuit board 225.

The thermal backplane 224 may be formed of high purity copper, for example C10100 copper or oxygen-free electronic copper. The thermal backplane 224 may include four slots 240 (collectively, only one called out in the Figure) extending through opposing faces of the thermal backplane 224. The thermal backplane 224 may also include a number of fastening apertures or reliefs 242 (collectively, only one called out in the Figure) to receive or pass fasteners. The slots 240 and fastening apertures 242 of the thermal backplane 224 may align or be in registration with the slots 234 and the fastening apertures 238, respectively, of the pedestal 222 when the thermal backplane 224 is correctly positioned on the pedestal 222. The thermal backplane 224 provides a cooling sink for all elements contained in the device sample holder assembly 24. At least a portion of the source of its sinking ability is in its contact with the pedestal 222. The thermal backplane 224 may have a top view profile that is identical or similar to a top view profile of the pedestal 222, allowing sides of the thermal backplane 224 to align or be in registration with sides of the pedestal 222 when the thermal backplane 224 is correctly positioned on the pedestal 222.

The base 226 may be formed of a superconducting material such as aluminum, for example 6061 or 1100 aluminum. The base 226 may include four slots 244 (collectively, only one called out in the Figure) extending through opposing faces of the base 226. The base 226 may also include a number of fastening apertures, reliefs or holes 246 (collectively, only one called out in the Figure) to receive, clear, or pass fasteners. The slots 244 and fastening apertures 246 of the base 226 may align or be in registration with the slots 240 and the fastening apertures 242, respectively, of the thermal backplane 224 when the base 226 is correctly positioned on the thermal backplane 224. The base 226 may have a top view profile that is identical or similar to a top view profile of the thermal backplane 224, allowing sides of the base 226 to align or be in registration with sides of the thermal backplane 224 when the base 226 is correctly positioned on the thermal backplane 224. In some embodiments, the base 226 may be soldered on both opposing faces.

As illustrated, the device sample holder circuit board 230 has four distinct portions or arms 230a-230d (best illustrated in FIG. 11). The circuit board 230 is positioned on the base 226 below the lid 228, with the portions or arms 230a-230d of the circuit board 230 aligned or in registration with respective slots 244, 248 of the base 226 and the lid 228, respectively. The portions or arms 230a-230d of the circuit board 230 may also be aligned or in registration with the arms 227a-227d of the upper circuit board 227. The device sample holder circuit board 230 may have an opening 233 positioned between the portions or arms 230a-230d sized to accommodate the device sample 220. The circuit board 230 may include a plurality of vias (not shown) filled with a thermally conductive material to thermally couple all layers in the circuit board 230. While not illustrated, the upper and lower circuit boards 225, 227 may include similar or identical via structures.

The lid 228 may be formed of a superconducting material such as aluminum, for example 6061 or 1100 aluminum. The lid 228 may include four slots 248 (collectively, only one called out in the Figure) extending through opposing faces of the lid 228. The lid 228 may also include a number of fastening apertures 250 (collectively, only one called out in the Figure) to receive or pass fasteners. The slots 248 and fastening apertures 250 of the lid 228 may align or be in registration with the slots 244 and some of the fastening apertures 246, respectively, of the base 226 when the lid 228 is correctly positioned on the base 226. The lid 228 may have a top view profile that is identical or similar to a top view profile of the base 226, allowing sides of the lid 228 to align or be in registration with sides of the base 226 when the lid 228 is correctly positioned on the base 226. The lid 228 may have a well 252, which may be sized and dimensioned to receive the device sample 220 without contacting the device sample 220 or its associated wire bonds, and which may, or may not be centrally located on the lid 228.

In some embodiments, the lid 228 and base 226 form a superconducting enclosure around the device sample 220 that stabilizes the magnetic environment seen by the device sample 220. The superconducting base 226 isolates the device sample 220 from noise that would otherwise couple in from proximate non-superconducting material. Alternatively, the lid 228 may include a well to encapsulate the device sample holder circuit board 230 and may provide a completely connected magnetic enclosure around the entire perimeter of the device sample holder circuit board 230. In some embodiments, thermalization of the device sample holder circuit board 230 may be realized, at least in part, through at least one screw or bolt that is substantially non-superconducting and substantially non-magnetic. The at least one screw or bolt may pass through a respective aperture in each of the device sample holder circuit board 230, the base 226, and the thermal backplane 224 to establish a thermal connection between the device sample holder circuit board 230 and the thermal backplane 224 that passes through the base 226.

Thus, in various embodiments, the combination of the pedestal assembly 23 and the device sample holder assembly 24 may provide several advantages: the lid 228 and the base 226 may define a superconducting enclosure that provides a low-noise environment for the device sample 220, the thermal backplane 224 may provide a non-superconducting thermal path that is accessible from inside the superconducting enclosure (defined by the lid 228 and the base 226) by non-superconducting bolts passing through the base 226; and the device sample holder circuit board 230 and pedestal circuit boards 225, 227 may provide superconducting signal paths to and from within the superconducting enclosure (defined by the lid 228 and the base 226) in such a way that the superconducting enclosure remains electrically isolated from the superconducting signal paths.

As noted above, the pedestal circuit board assembly 223 may include lower and upper circuit boards or sets of circuit boards 225, 227. Also as noted above, the device sample holder circuit board assembly 230 may include a circuit board or set of circuit boards. As detailed below, the circuit boards 225, 227, 230 have a variety of coupling structures to provide electrically superconducting paths between the metal powder filter assembly 22 and the device sample 220. The circuit boards 225, 227, 230 may also provide organization to the wiring.

In the illustrated embodiment, each portion or arm 225a-225d of the lower circuit board 225 has a set of three (3) rows of twelve (12) through-holes 259 (only one set called out in FIG. 13B). Thus, each portion or arm 225a-225d of the lower circuit board 225 carries a respective set of thirty-six (36) through-holes. The through-holes 259 may be copper with a white tin plating. Each of the through-holes 259 may be sized to accept a superconducting wire 204 and/or the tube 206. The shield or cladding of each cable 201 may be soldered to the respective through-hole 259 to make an electrical connection to provide a ground. Alternatively, four (4) sets of sockets (not shown) may extend downwardly (with respect to view of FIG. 13B) from a lower surface of the lower circuit boards 225a-225d.

In the illustrated embodiment, each portion or arm 227a-227d of the upper circuit board 227 has three (3) rows of twelve (12) through-holes 264 (only one set called out in FIG. 12 and FIG. 13B). Thus, each portion or arm 227a-227d of the upper circuit board 227 carries a set of thirty-six (36) through-holes. The through-holes 264 may be copper with a white tin plating. Each of the through-holes 264 may be sized to accept a wire (e.g., Niobium or copper or copper nickel clad Niobium wire) 204 and/or tube 206. An end of the superconducting wire 204 may be soldered to the respective through-hole 264 to make an electrical connection. The through-holes 264 are electrically superconductingly coupled (e.g., by traces in or on the upper circuit board 227) to respective terminals (e.g., forks) of sockets 265 (best illustrated in FIGS. 13B and 29), that extend upwardly from a top face of the upper circuit board 227. In the illustrated embodiment (FIG. 29), there are four (4) sets of sockets 265a-265d.

In the illustrated embodiment, each portion or arm 230a-230d of the device sample holder circuit board 230 has three (3) rows of twelve (12) through-holes, each of which accepts a respective pin 266 (only one called out in the Figures) extending above and below opposed faces of the device sample holder circuit board 230. The pins 266 may be copper with a white tin plating. Thus, each portion or arm 230a-230d of the device sample holder circuit board 230 carries a respective set of pins, with thirty-six (36) pins 266 in each set. The sets of pins 266 are aligned or in registration with respective ones of the sets of sockets 265a-265d, and the pins 266 in each set of pins are aligned or in registration with a respective socket in each set of sockets 265a-265d such that an electrical connection is made between the pins 266 of the device sample holder circuit board 230 and the superconducting wires 204 soldered to the through-holes 264 of the upper circuit board 227 when correctly positioned on the pedestal assembly 23. This allows for as many as one hundred and thirty two eight (132) lines in the system. Some embodiments may employ a greater or lesser number of through-holes 259, 264, sockets 265 and/or pins 266.

The through-holes 259, 264, sockets 265 and pins 266 may be used to provide electrically superconducting paths between the device sample 220 and the metal powder filter assembly 22. In the illustrated embodiment, thirty-three (33) of the through-holes 259, 264, sockets 265 and pins 266 in each set of through-holes 264a-264d, sockets 265a-265d, and pins 266 are used to carry signals, and three (3) of the through-holes 264, sockets 265 and/or pins 266 (e.g., center column of pins) are used for ground. In some embodiments, a greater or lesser number of through-holes 259a-259d, 264a-264d, sockets 265a-265d, and pins 266 may carry signals and/or provide ground.

The lower, upper and device sample holder circuit boards 225, 227, 230, respectively, may include multiple layers. For example, the device sample holder circuit board 230 may include an upper or outer first conductive layer, a lower or inner second conductive layer, an electrically insulating layer therebetween, and a base (underside) ground plane for contact with the device sample holder assembly 24. The upper or outer first conductive layer provides electrically superconducting paths (e.g., electrically superconducting traces) and outer bonding pads to carry signals to the device sample 220. A lower or inner conductive layer provides electrically superconducting paths (e.g., electrically superconducting traces) and inner bonding pads to carry signals from the device sample 220. One or more of the electrically superconducting paths on the upper or outer first conductive layer may overlie or be in registration with respective electrically superconducting paths on the lower or inner conductive layer over a portion or all of their length, to implement a strip-line type geometry in order to advantageously reduce coupling between the electrically superconducting paths. The electrically superconducting paths on one or more of the layers may be electrically shorted to form one or more (e.g., three) common grounds, thereby providing redundancy. In some embodiments, the ground may be made directly to the refrigerator, bypassing the metal powder filter assembly 22. In other embodiments, ground may be connected to the base 226 of the device sample holder assembly 24; connected to the pedestal 222, bypass the device sample holder assembly 24; or may take the form of a superconducting line connecting ground from adapter to fridge plate to bypass the lumped element filter assembly 20 and metal powder filter assembly 22.

The device sample 220 may be electrically connected to the outer and inner bonding pads. For example, the device sample 220 may be electrically coupled to the outer and inner bonding pads via wire bonds.

An optional top hat 280 (best illustrated in FIG. 37) may form a metal cover that encloses the pedestal assembly 23 and device sample holder assembly 24 to protect from changes in magnetic fields. For example, the top hat or cover 280 may be formed of high purity copper, for example C10100 copper or oxygen-free electronic copper, and may be gold plated to prevent the formation of an oxide layer and thus provide a good thermally conductive path. The top hat 280 may employ polished surfaces and/or clamped contact to form an electromagnetic shield around the device sample holder area. Alternatively, the cover 280 may be formed of aluminum if a sufficient thermal transfer path is provided, for example via the thermal backplane 224.

Figure 14:
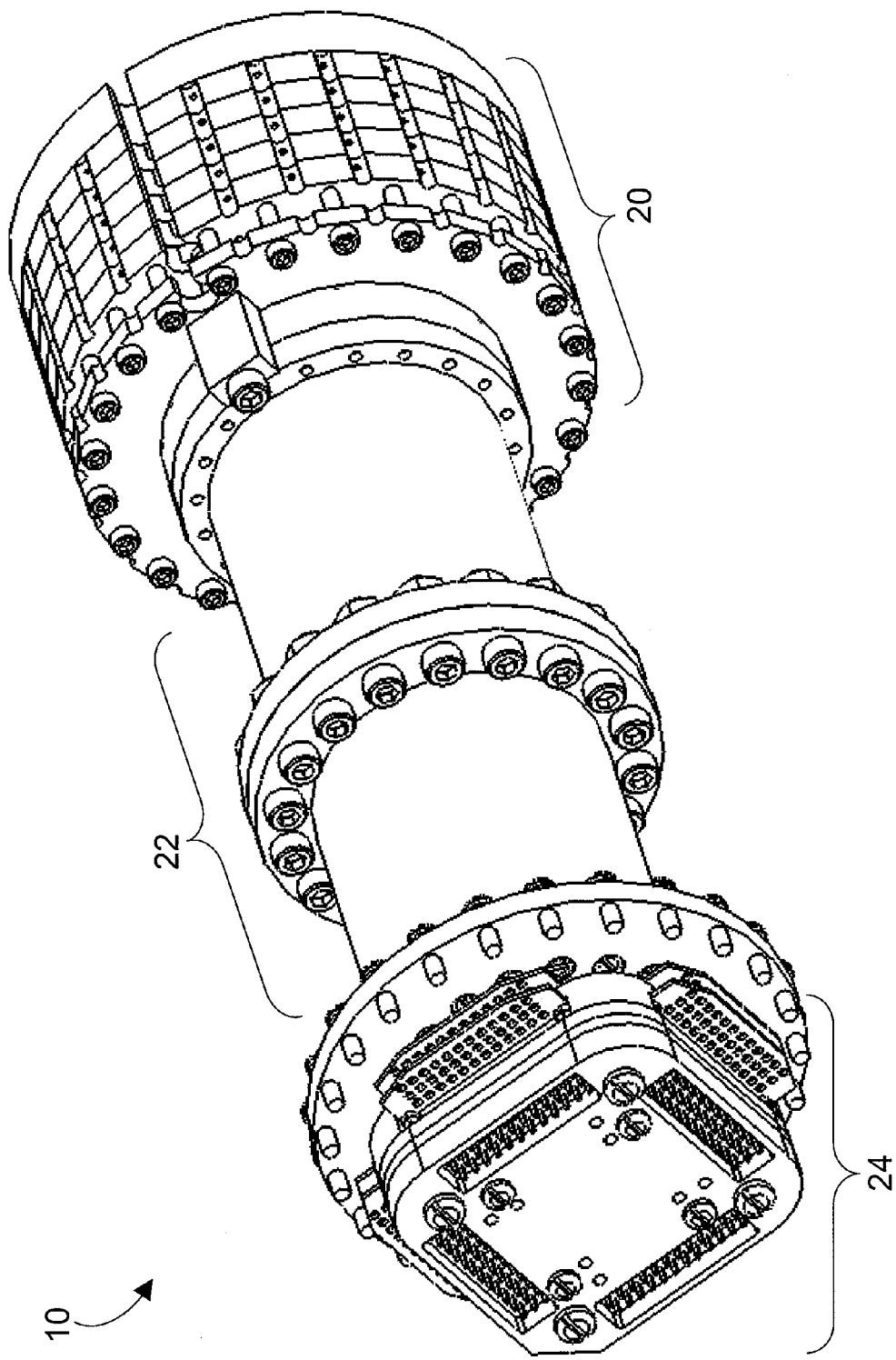
FIG. 14 shows a portion of the I/O system, according to one illustrative embodiment.

FIG. 14 shows a portion of the I/O system 10, according to one illustrative embodiment. FIGS. 15-37 show a sequential assembly sequence for the I/O system 10 of FIG. 14, according to one illustrative embodiment. It is noted that some embodiments may perform the assembly sequence in a different order than that set out in the Figures, and may omit some acts and/or include additional acts not illustrated in the Figures.

In particular, FIG. 14 shows the I/O system 10 including the lumped element filter assembly 20, metal powder filter assembly 22, and device sample holder assembly 24.

Figure 15:
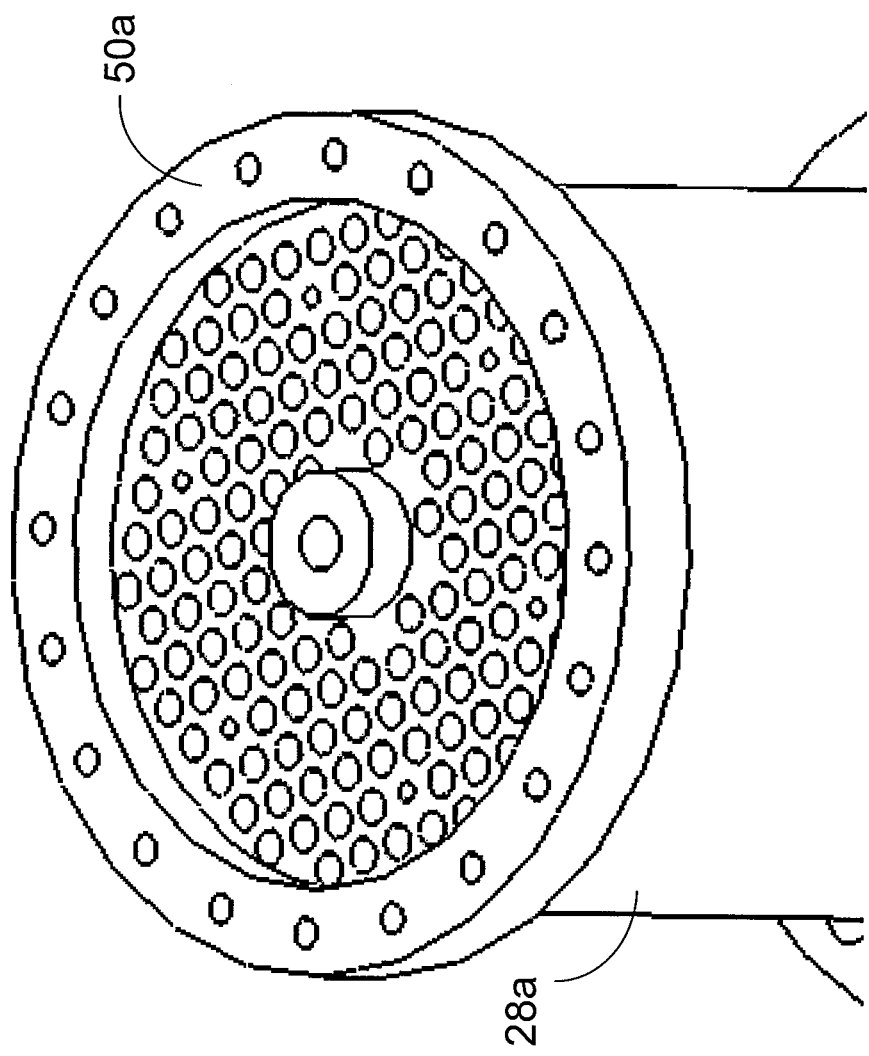
FIG. 15 is an isometric view showing a portion of the metal powder filter assembly according to one illustrative embodiment.

FIG. 15 shows the first portion 28a of the metal powder filter assembly 28.

Figure 16:
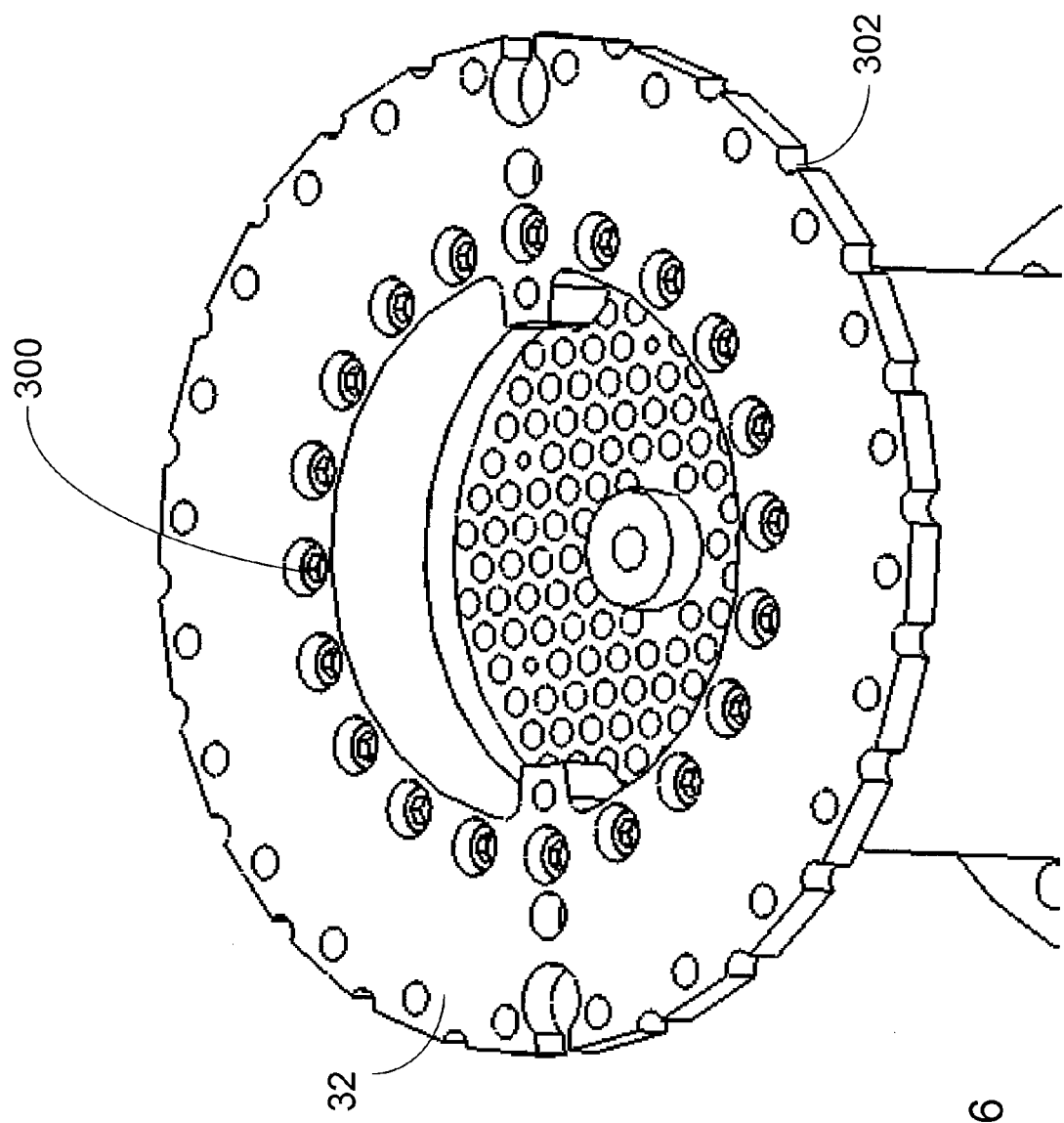
FIG. 16 is an isometric view showing a first plate of a lumped element filter assembly secured to the flange of the metal powder filter assembly by fasteners according to one illustrative embodiment.

FIG. 16 shows the first plate 32 of the lumped element filter assembly 20 secured to the interface flange 50a of the first portion 28a of the metal powder filter assembly 28 by fasteners 300. The fasteners 300 may take the form of machine screws or bolts, and may be gold plated high purity copper to provide good thermal conductivity. Also visible in FIG. 16 are a number of longitudinally extending grooves 302 (only one called out in the Figure) on an exterior surface thereof, which may be sized to receive wires that run along an exterior of the lumped element filter assembly 20. The wires may be secured against the lumped element filter assembly 20 with an adhesive tape, for example a KAPTON tape, to prevent the wires from touching warmer surfaces. There may be six sets of wires, one for each of the lumped element filter plates 30, the wires in each set coupled to provide signals to the lumped element filters 26 of the respective lumped filter plate 30. The shield may be removed from the coaxial cable such that the input wires may be soldered as close as possible to reduce noise and prevent return currents. The shield or sheath 208 and center conductor (e.g., superconducting wire 204) may be separated and soldered to respective pads on the lumped element filter 26. These joints may be made in close proximity to the entrance of the cable 37 to the lumped element filter plate 30 (through aperture 301) in order to minimize noise coupled into the filter space and to reduce the transmission of noise past the filter to the output. The signal and ground pads may be soldered in close proximity to maximize the performance of the filter by allowing the signal and return currents to run in close, low-inductance proximity when not in a coaxial geometry.

Figure 17:
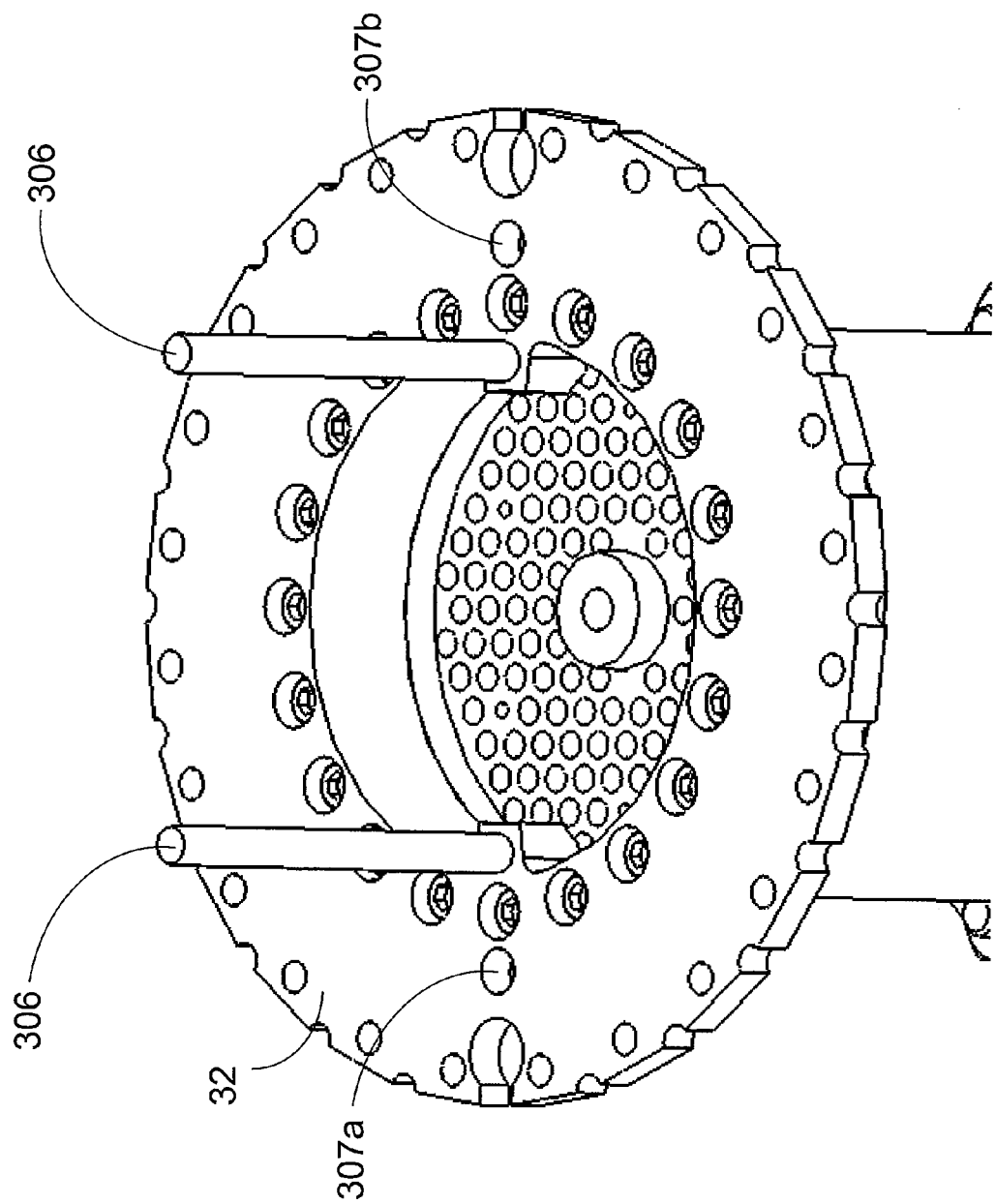
FIG. 17 is an isometric view showing threaded reference studs or rods secured to the first plate of the lumped element filter assembly according to one illustrative embodiment.

FIG. 17 shows threaded reference rods or studs 306 secured to the base plate 32 of the lumped element filter assembly 20, and extending therefrom. The reference studs 306 are used as assembly tools for managing the lumped element filter plates 30 during assembly. The final fasteners (e.g., clamping bolts 310) pass from the underside of base plate 32, through all the lumped element filter plates 30 and are fastened with nuts 124 (FIG. 23) at the end of the assembly. The base plate 32 includes additional recesses 307a, 307b sized to receive fasteners.

Figure 9C:
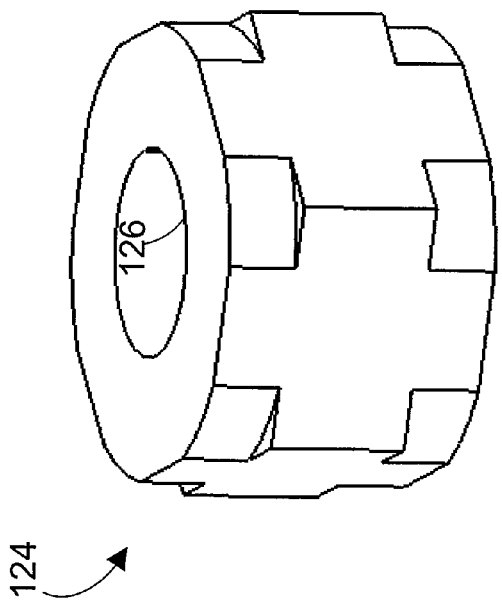
FIG. 9C is an isometric view of the nut of FIG. 9A.
Figure 9A:
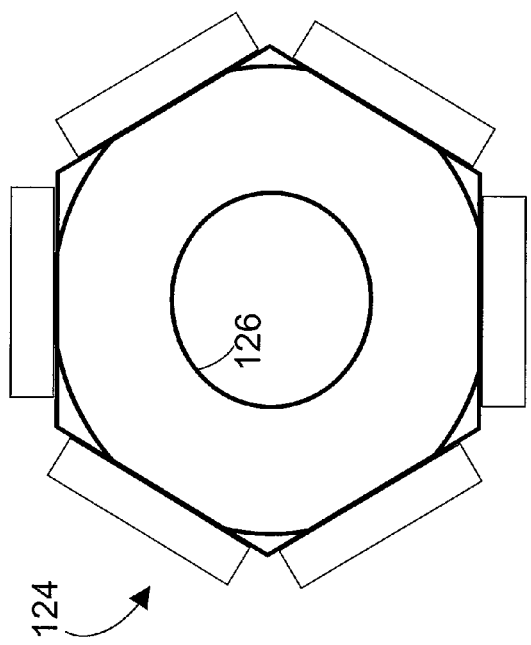
FIG. 9A is a top plan view of a nut of the metal powder filter assembly according to one illustrative embodiment.
Figure 9B:
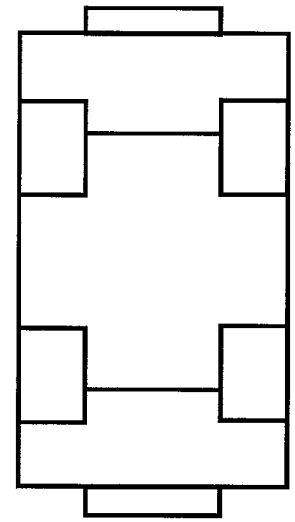
FIG. 9B is a front plan view of the nut of FIG. 9A.
Figure 18:
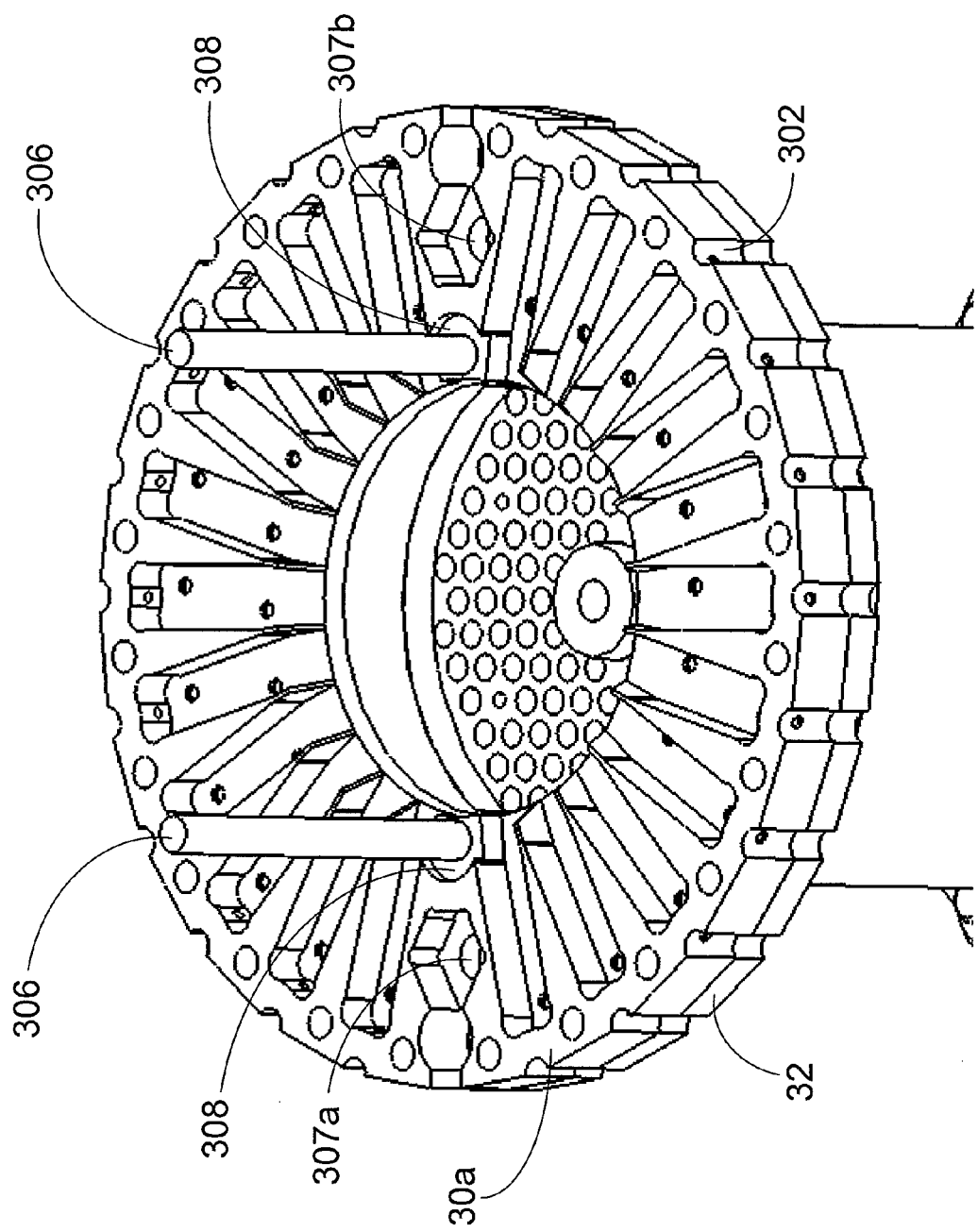
FIG. 18 is an isometric view showing a second plate of a lumped element filter assembly received adjacent and in physical contact with the first plate according to one illustrative embodiment.

FIG. 18 shows a first lumped element filter plate 30a received adjacent and in physical contact with the base plate 32. In alternative embodiments, the first lumped element filter plate 30a may serve as the bottom plate, thereby eliminating the need of base plate 32. The reference studs 306 serve as alignment structures for the lumped element filter plates 30. The lumped element filter plates 30a include a recess 308 surrounding the reference stud 306. The recess 308 is sized to accommodate a fastener, for example a conventional nut that is removed before assembly is completed. The recess 308 may be formed in one face of the lumped element filter plates 30 to accommodate at least a portion of the thickness of the nut. The lumped element filter plates 30 include longitudinally extending grooves 302 (only one called out in the Figure) on an exterior surface thereof, which are sized to receive the wires that run along an exterior of the lumped element filter assembly 20. The grooves 302 of the lumped element filter plates 30 align with respective grooves 302 of the ground plate 32. The lumped element filter plates 30 also include additional recesses 307a, 307b sized to receive fasteners, for example a nut 124 (FIGS. 9A-9C). The additional recesses 307a, 307b of the lumped element filter plates 30 align with respective additional recesses 307a, 307b of the ground plate 32. The recess 307a, 307b may be formed in one face of the lumped element filter plates 30, each sized to accommodate the entire thickness of the nut 124. Alternatively, the recess 307a, 307b may be formed in both opposed faces of the lumped element filter plates 30, each sized to accommodate half the thickness of the nut 124.

It is noted that the lumped element filter plates 30 may have a radial spoke pattern on both top and bottom surfaces. This reduces the amount of surface to be polished and reduces machining costs. Threads may be cut before or after the annealing process depending on the strength requirements.

Figure 19:
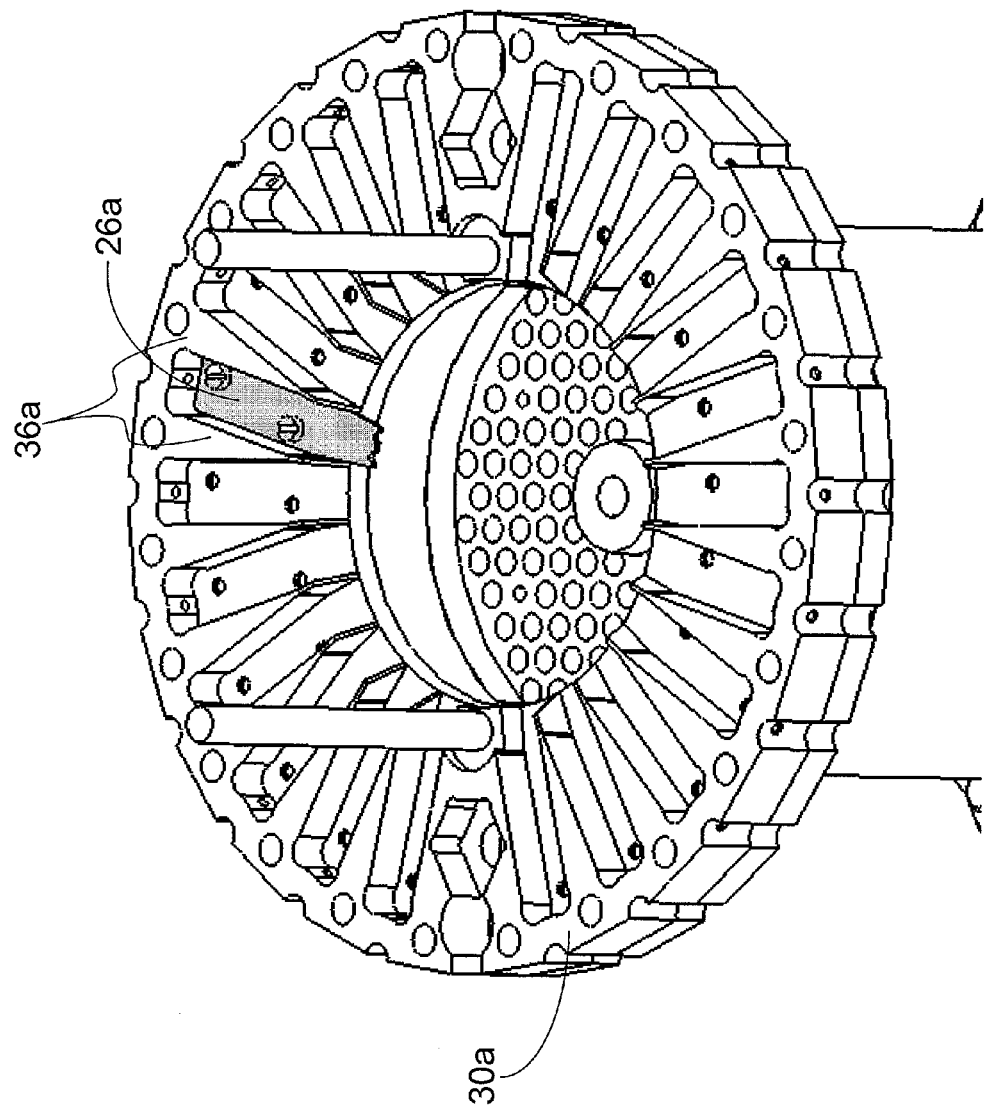
FIG. 19 is an isometric view showing a first lumped element filter received in a radial slot of the second plate of the lumped element filter assembly according to one illustrative embodiment.

FIG. 19 shows a first lumped element filter 26a received in a radial slot or cavity 36a of the first lumped element filter plate 30a. In the interest of clarity, FIG. 19 omits input wire, output wire, fastening parts, and nuts used to secure the lumped element filter plate 30a during the assembly by clamping with the reference studs 306.

Figure 20:
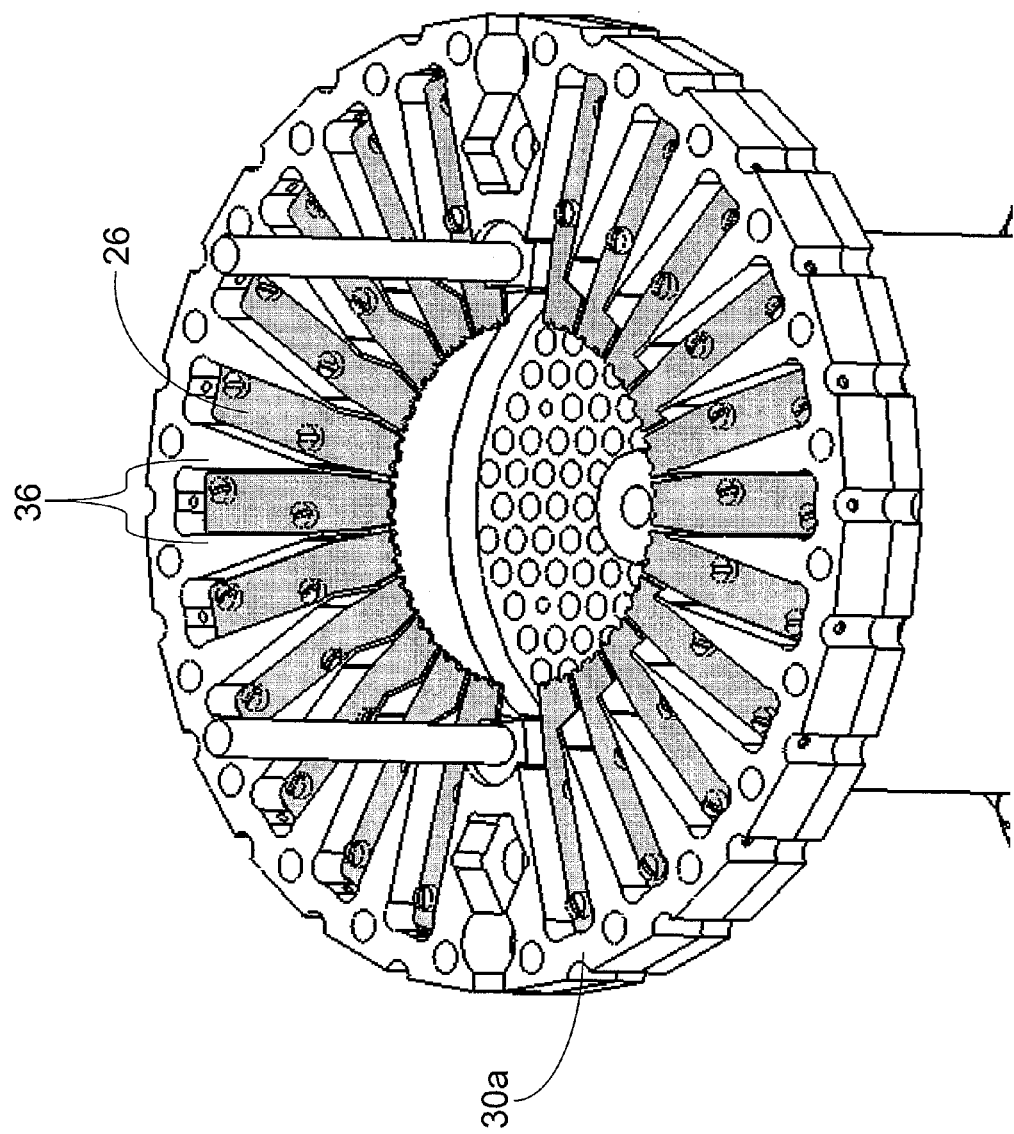
FIG. 20 is an isometric view showing lumped element filters received in respective ones of all of the radial slots of the second plate of the lumped element filter assembly according to one illustrative embodiment.

FIG. 20 shows lumped element filters 26 received in respective ones of all of the radial cavities 36 of the first lumped element filter plate 30a.

Figure 21:
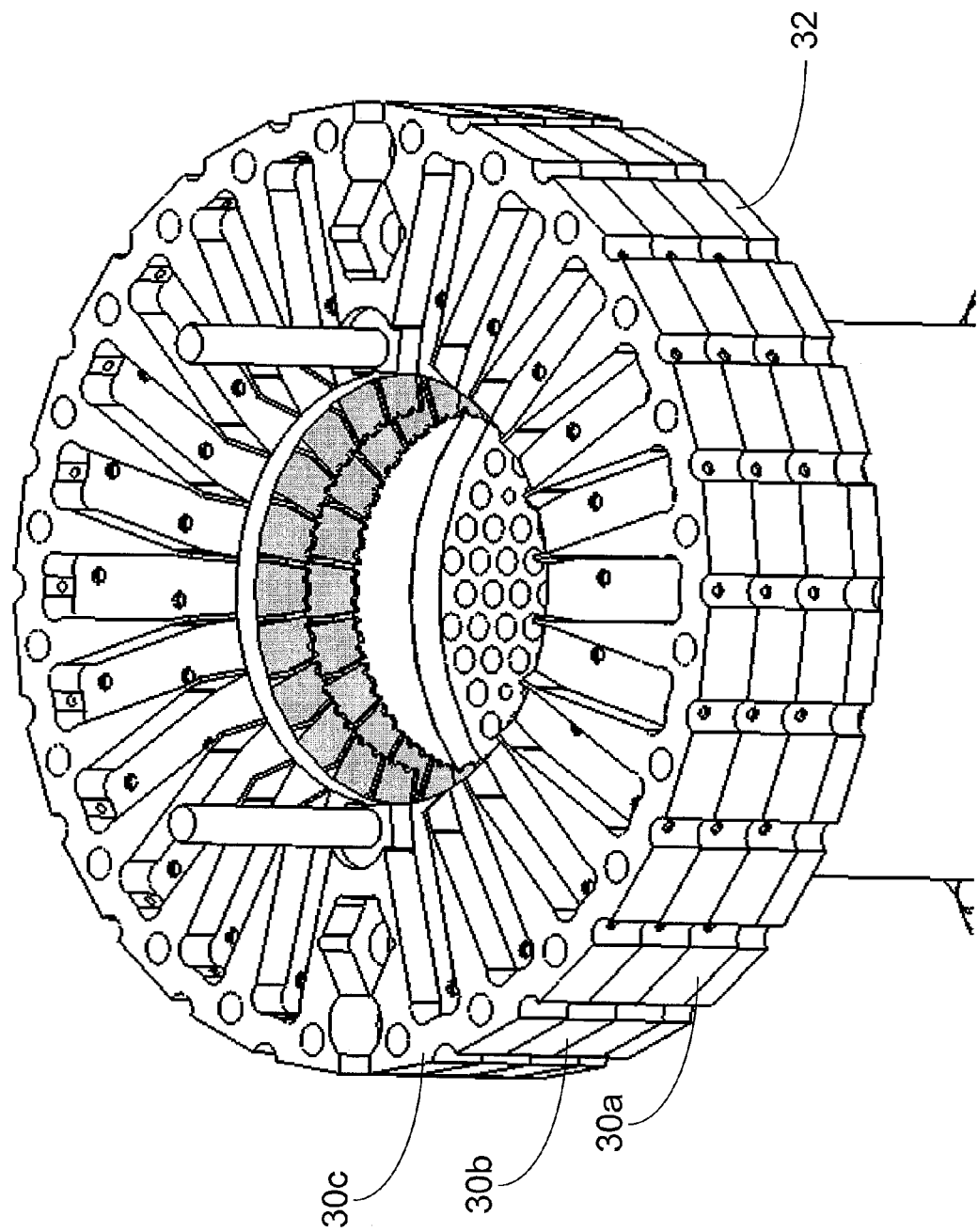
FIG. 21 is an isometric view showing four plates in a lumped element filter assembly according to one illustrative embodiment.

FIG. 21 shows three (3) lumped element filter plates 30a, 30b, 30c mounted to the base plate 32. The lumped element filters 26 of the third lumped element filter plate 30c are omitted for clarity of illustration.

Conventional nuts (not shown in FIG. 21) may be employed to clamp the topmost plate into the base plate 32, thereby securing all of the lump element filter plates 30. As noted above, the nut is removed before completion of assembly. The nut may be substantially non-magnetic and may be selected for strength. As illustrated, the lumped element filter plates 30 include the recess 308 sized to accommodate the nut. The top surfaces of the lumped element filter plates 30 may be polished, for example to a surface roughness of Ra 2. The recesses 308 allow the nuts to clamp on the surface of the lumped element plates 30 without marring the polished finish by preventing interference in the mating of successive lumped element filter plates 30.

Figure 22:
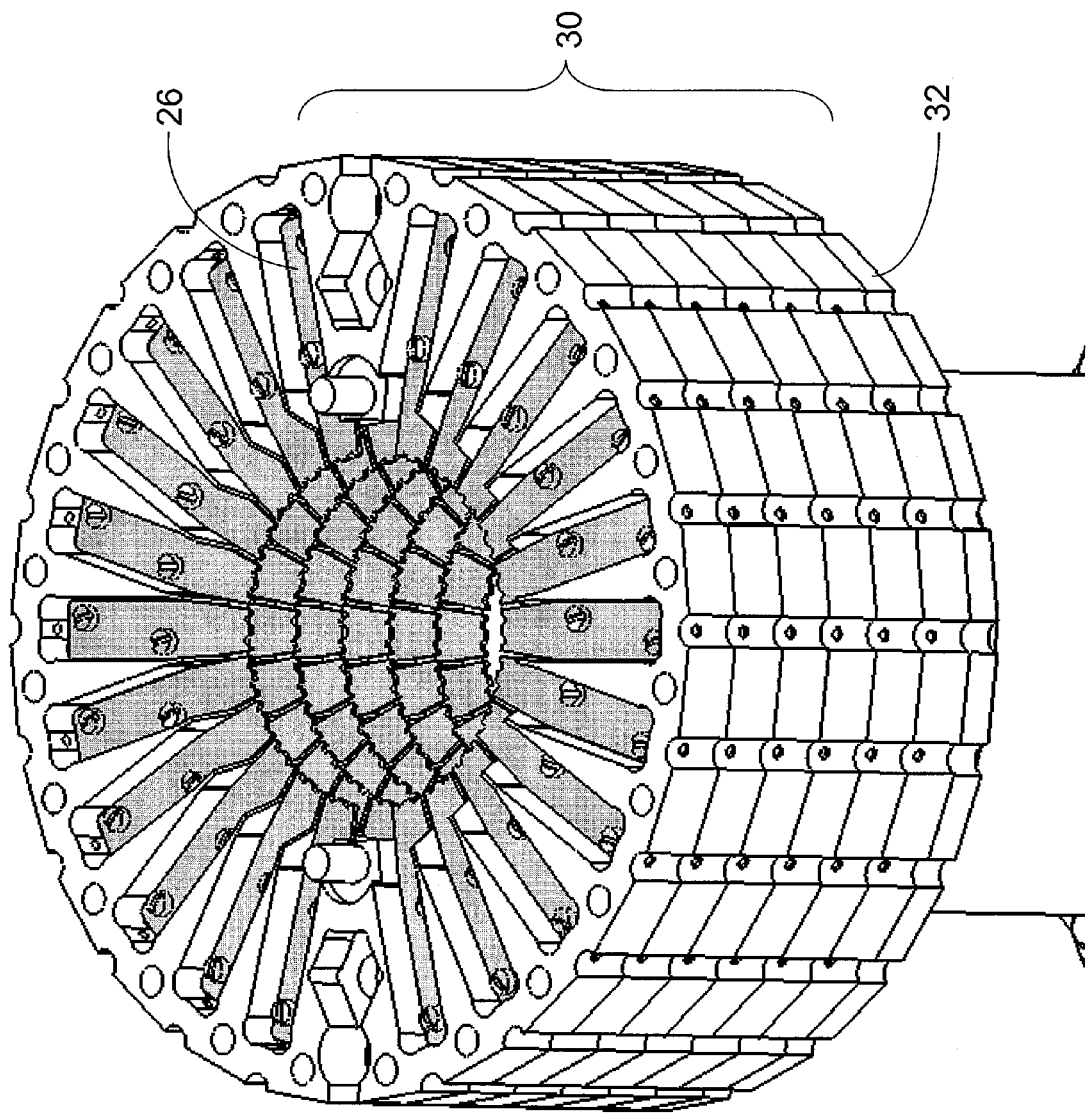
FIG. 22 is an isometric view showing seven plates in a lumped element filter assembly, with many radial slots filled with lumped element filters according to one illustrative embodiment.

FIG. 22 shows six lumped element filter plates 30 mounted to the base plate 32, with all radial cavities 36 filled with lumped element filters 26. Each lumped element filter plate 30 may be added with input connections made and the output connections may be made before the next lumped element filter plate 30 is added.

Figure 23:
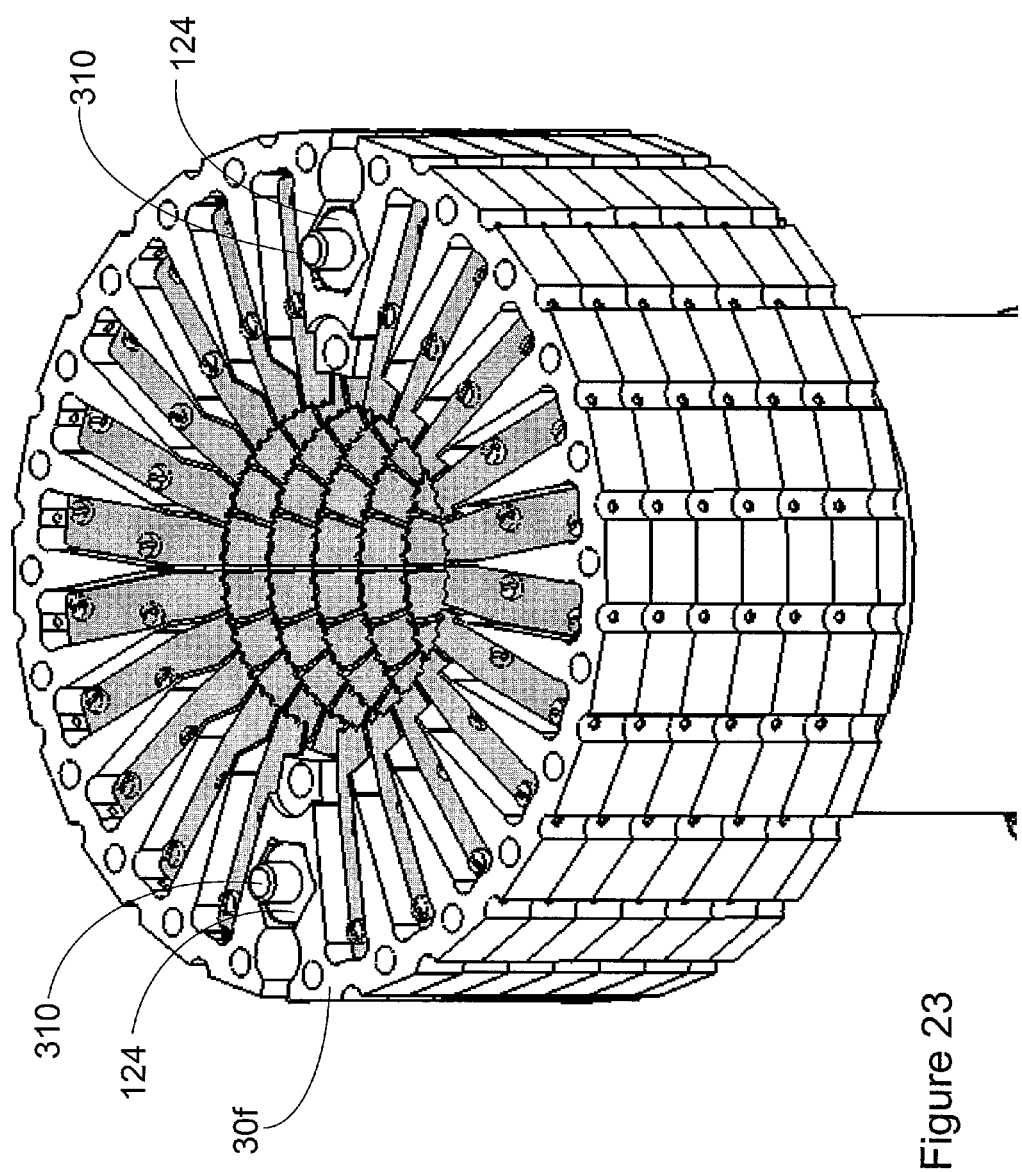
FIG. 23 is an isometric view showing the seventh plate in the lumped element filter assembly with the reference studs removed and secured by a pair of clamping bolts and nuts according to one illustrative embodiment.

FIG. 23 shows the sixth lumped element filter plate 30f secured to a clamping bolt 310 by a nut 124. The clamping bolt 310 is spaced radially outward of the threaded reference rods or studs 306. This secures all of the lumped element filter plates 30 to the base plate 32 and adds to clamping force on the plates 30, 32 when fully assembled.

Figure 24:
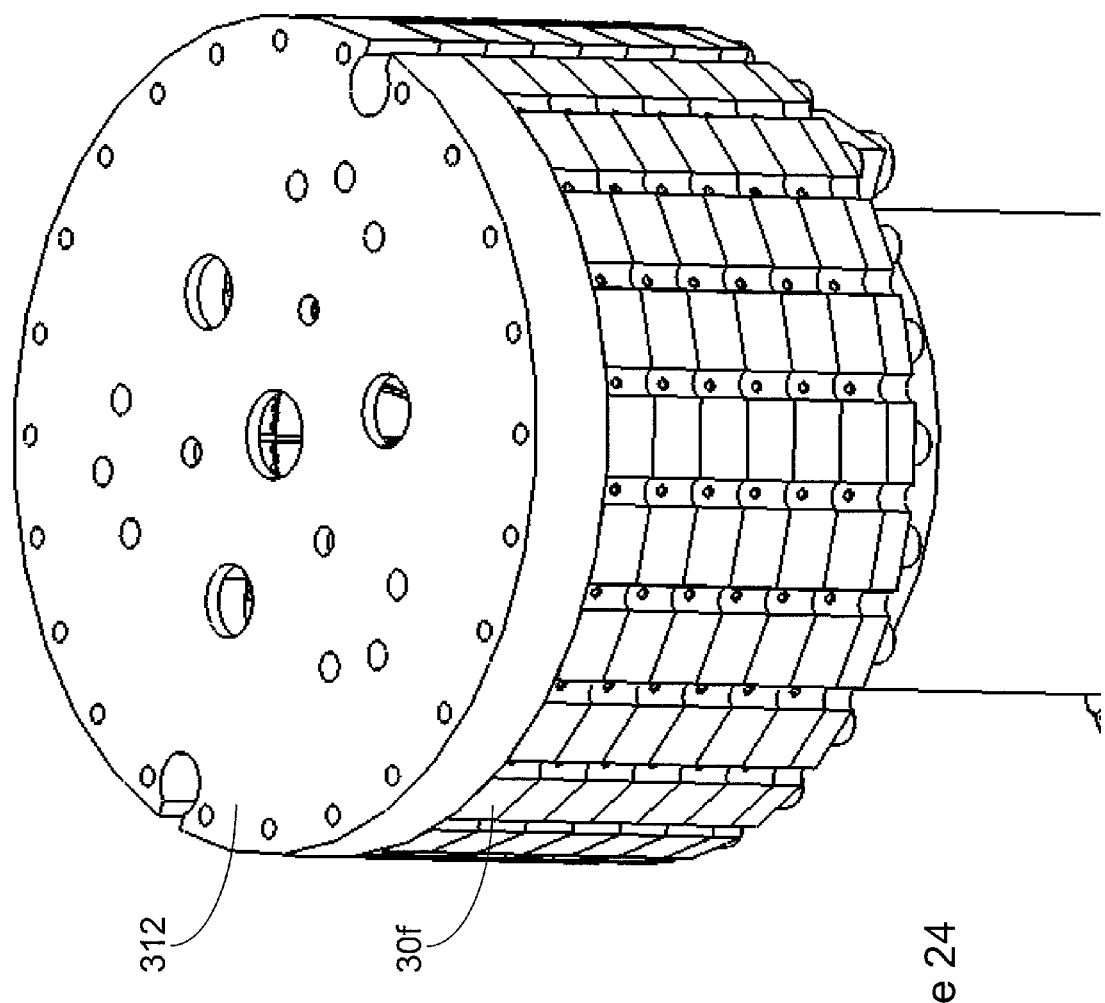
FIG. 24 is an isometric view showing a top or adapter plate overlying the seventh plate in the lumped element filter assembly according to one illustrative embodiment.

FIG. 24 shows a top or adapter plate 312 overlying the sixth lumped element filter plate 30f. The top or adapter plate 312 may allow the I/O system 10 to be mounted to a dilution refrigerator, and may have the lumped element filter assembly 20 attached. In some embodiments, the top or adapter plate 312 includes longitudinally extending grooves along an exterior surface, that align with the longitudinally extending grooves 302 on the exterior surface of the lumped element filter plates 30.

Figure 25:
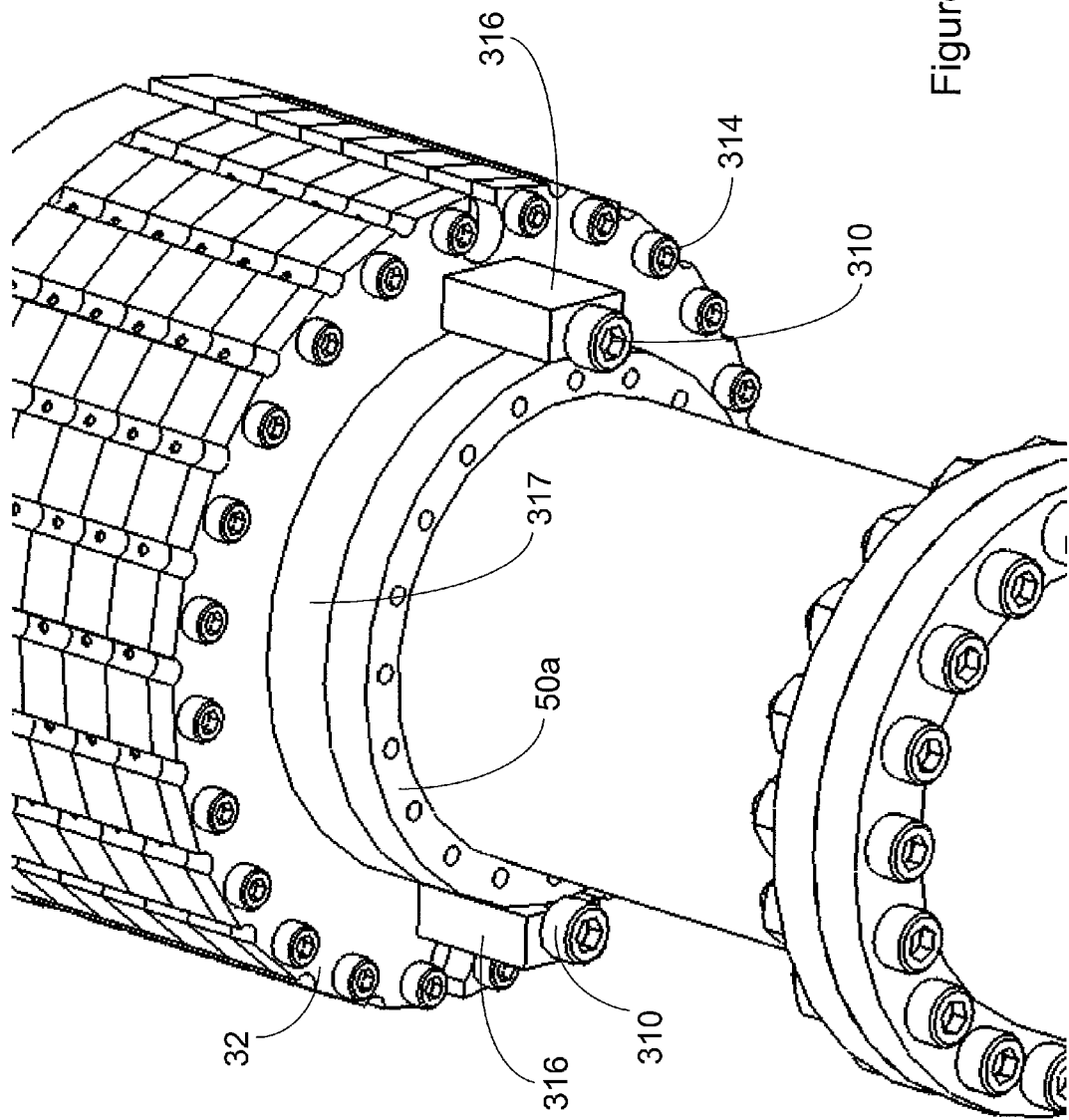
FIG. 25 is an isometric view showing a number of washers on the clamping bolts according to one illustrative embodiment.

FIG. 25 shows fasteners 314 (e.g., machine screws, only one called out in the Figure) received through the bottom of the base plate 32 and extending through the six lumped element filter plates 30 to the top or adaptor plate 312. Such helps to secure physical contact over the entire surface of the lumped element filter plates 30, base plate 32, and top or adapter plate 312, thereby providing a good thermally conductive path therebetween. As noted previously, the fasteners 314 may be substantially non-magnetic, and may be brass to provide strength and a good thermally conductive path. Clamping the plates 30, 32 together closes all edges, thereby defining an inner space and an outer space where a difference in E&M noise environment exists. In some embodiments, it is desirable that the level of E&M noise be lower in the inner space than in the outer space.

FIG. 25 also shows a pair of washers 316 (e.g., titanium) coupled to the base plate 32 by clamp bolts 310. The washers 316 extend the length of clamping bolts 310 so that the head clears the interface flange 50a of the metal powder filter assembly 22. Aluminum coated copper may be used for thermal contact; however, titanium is superconducting and therefore thermally isolated. Titanium has a lower coefficient of thermal expansion, so it contracts less than brass bolts during cool down, and therefore holds the lumped element filter plates 30 more tightly when cold.

FIG. 25 also shows an adapter 317 secured to the interface flange 50a of the first portion 28a of the metal powder filter assembly 28. The adapter 317 advantageously allows the metal powder filter assembly 28 to be used with a lump element filter assembly 20, without the need to modify the structure of the metal powder filter assembly 28. The adapter 317 may be formed from of high purity copper, for example C10100 copper or oxygen-free electronic copper. As illustrated, the adapter 317 takes the form of a ring or annulus, and includes holes (not visible in the Figure) that align with holes 64 on the interface flange 50a to receive fasteners. The fasteners are spaced sufficiently close together to ensure high physical contact between the adapter 317 and the interface flange 50a, to ensure a good thermally conductive path therebetween. The adapter 317 may include a flange (not visible in the Figure) with fastening holes spaced thereabout.

Figure 26:
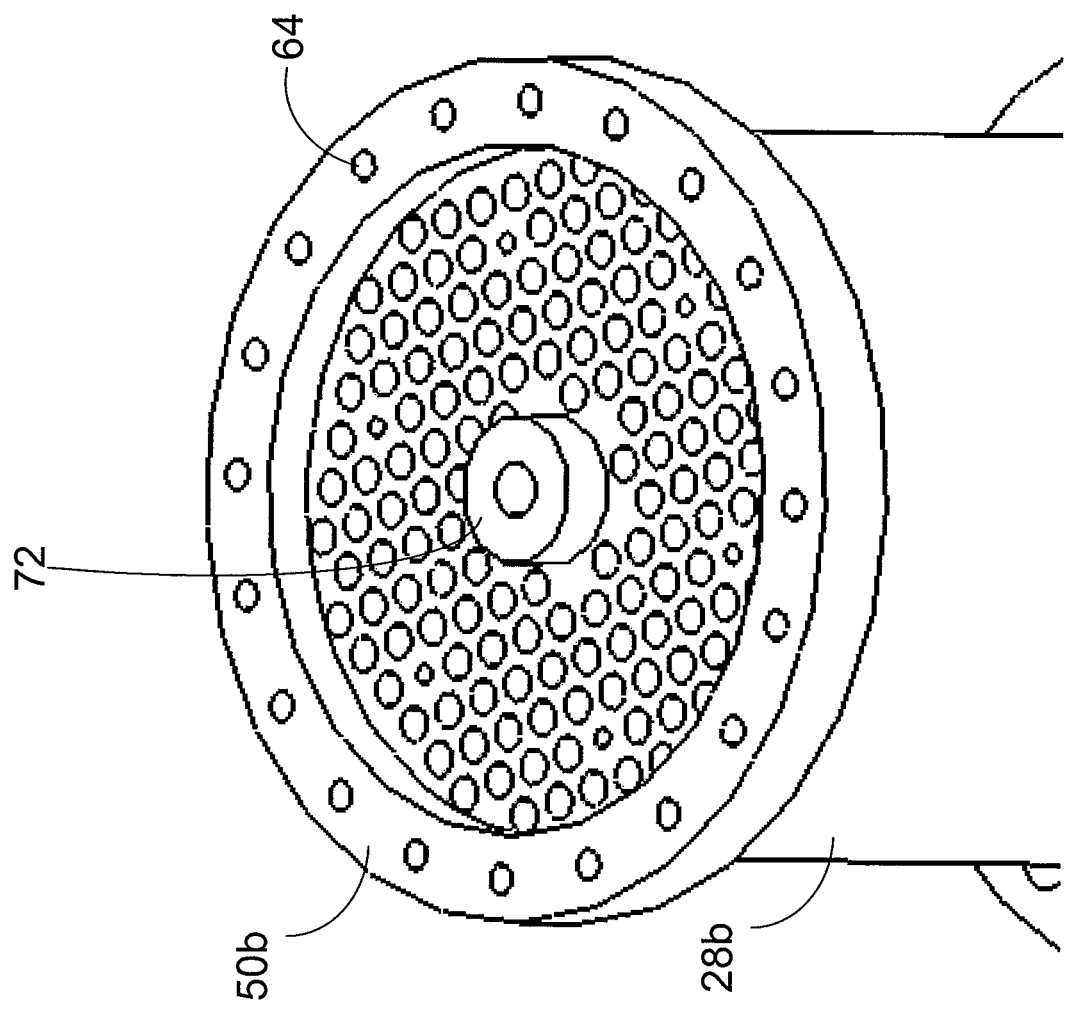
FIG. 26 is an isometric view showing a portion of the metal powder filter assembly according to one illustrative embodiment.

FIG. 26 shows a second portion 28b of the metal powder filter assembly 28, according to one illustrated embodiment. Holes 64 can be threaded to receive bolts or can be through-holes to pass bolts to nuts underneath the interface flange 50b. Both options have advantages, for example simplicity of assembly versus better clamping, better strength, and resilience to threads stripping when over-torqued since nuts can be replaced.

Figure 27:
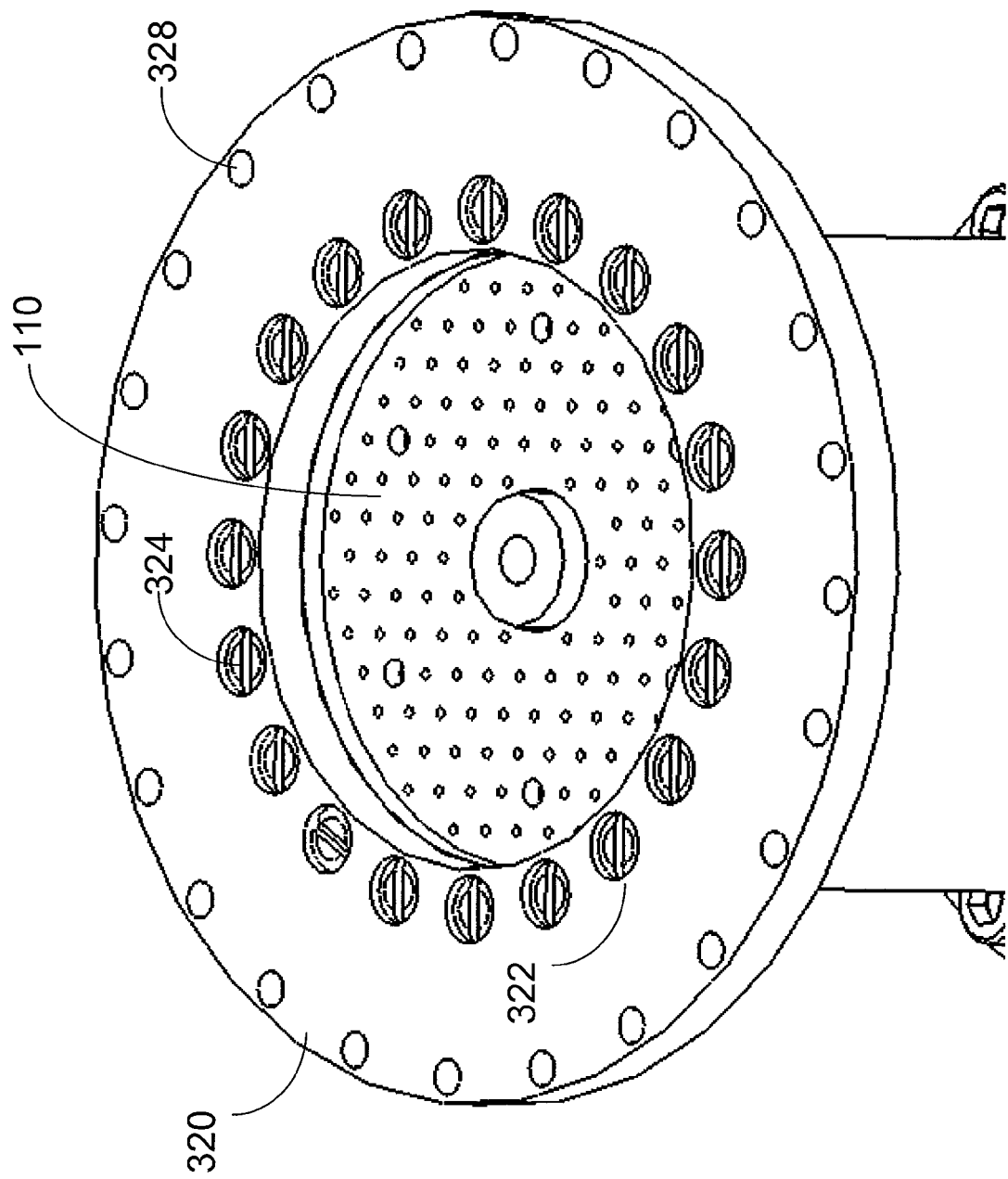
FIG. 27 is an isometric view showing an adapter secured to the interface flange of the first portion of the metal powder filter assembly by fasteners according to one illustrative embodiment.

FIG. 27 shows an adapter 320 secured to the interface flange 50b of the second portion 28b of the metal powder filter assembly 22. The adapter 320 advantageously allows the metal powder filter assembly 22 to be used with a different device sample holder assembly 24 or top hat 280, without the need to modify the structure of the metal powder filter assembly 22. The adapter 320 may be formed of high purity copper, for example C10100 copper or oxygen-free electronic copper. As illustrated, the adapter 320 takes the form of a ring or annulus, and includes holes 322 that align with holes 64 on the interface flange 50b to receive fasteners 324, for example bolts. While illustrated as flat, the adapter 320 may be cupped or concave. The fasteners are spaced sufficiently close together to ensure high physical contact between the adapter 320 and the interface flange 50b, to ensure a good thermally conductive path therebetween and E&M noise shielding from the external environment. As noted previously, the fasteners 324 may be bolts made of a gold-plated high purity copper to provide a good thermally conductive path. The adapter 320 may include a flange with fastening holes 328 spaced thereabout. It is noted that some filtering may occur in the cables 37, 39, 201 (e.g., by the CuNi coating). The line inputs to the lumped element filter plates 30 may be designed roughly to maintain a background E&M noise differential across the hole so that the signal can be less noisy at the inputs of the lumped element filters 26 than the external environment. Note that FIG. 27 also shows a ground circuit board 110 in the cavity at the interface end of portion 28b.

Figure 28:
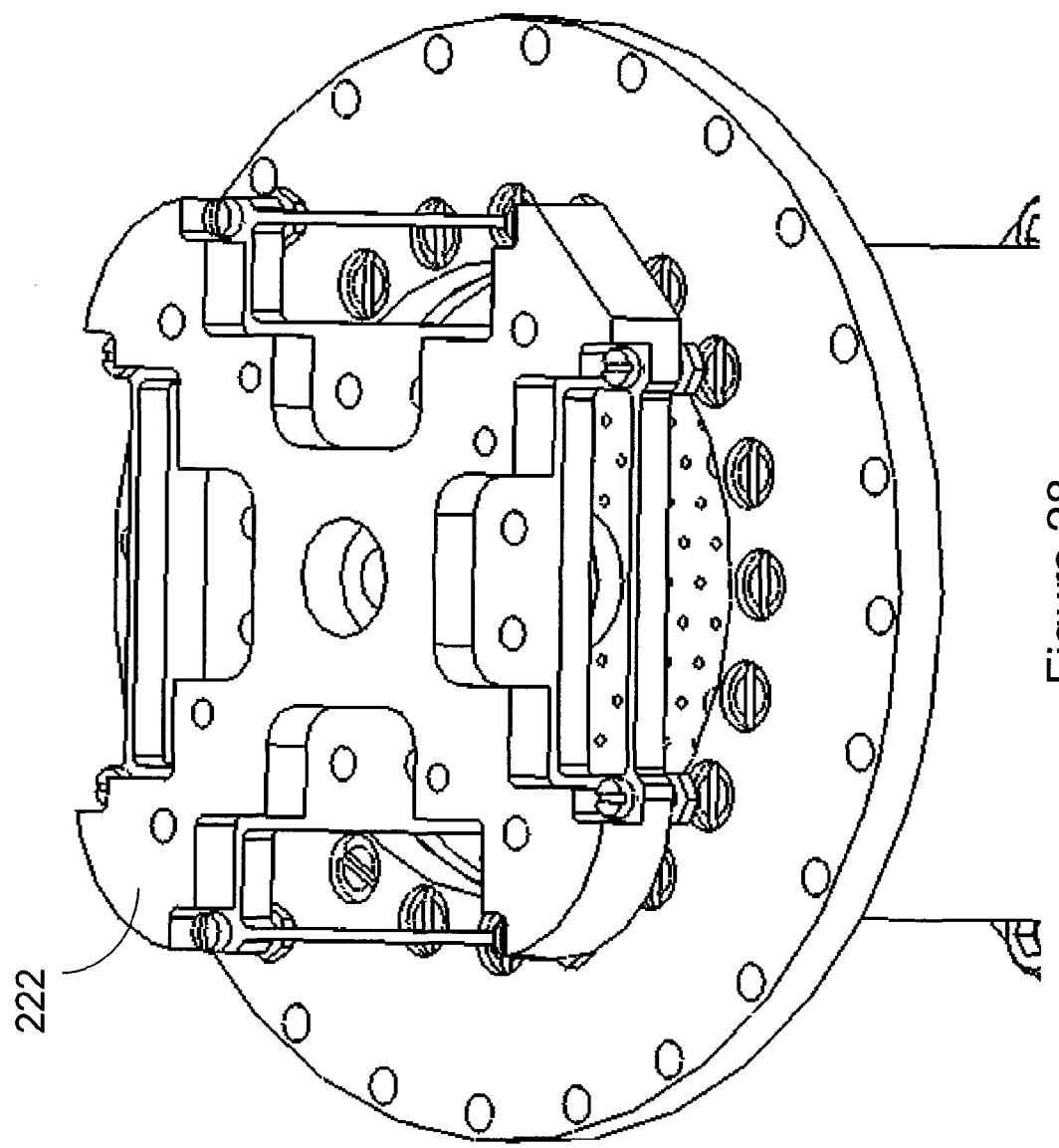
FIG. 28 is an isometric view showing a pedestal of a pedestal assembly positioned on the adapter according to one illustrative embodiment.

FIG. 28 shows the pedestal 222 of the pedestal assembly 23 positioned on the post 72 (not visible in the Figure) of the metal powder filter assembly 22. The pedestal 222 may be secured to the metal powder filter assembly 22 by a fastener (e.g., machine screw) received in the threaded aperture of the post 72 of the metal powder filter assembly 22. The two mating faces are polished and gold plated. As previously noted, the fasteners may be gold plated high purity copper to provide good thermal conductivity.

Figure 29:
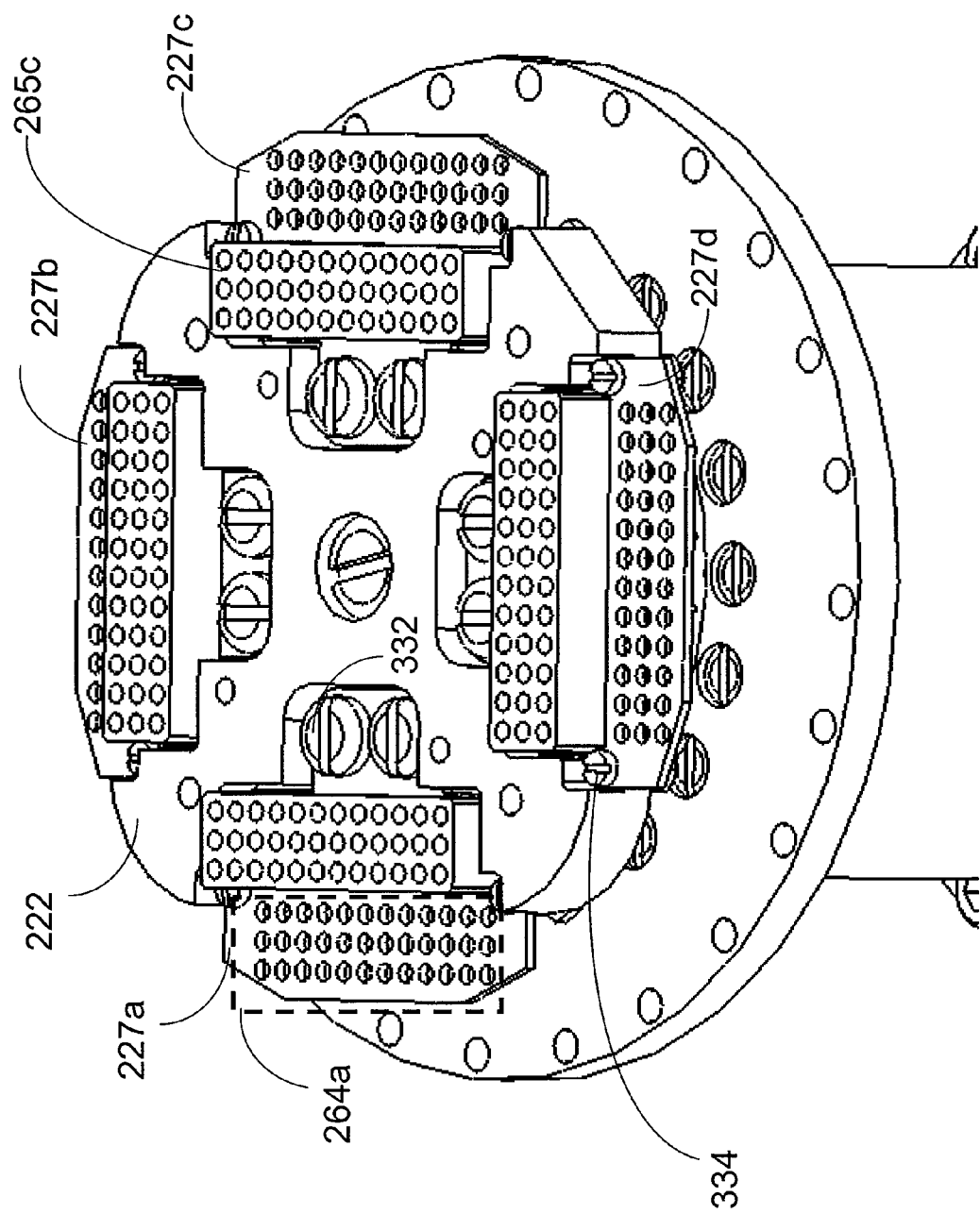
FIG. 29 is an isometric view showing an upper set of circuit boards of a pedestal circuit board assembly having four distinct portions positioned in respective wells of the pedestal according to one illustrative embodiment.

FIG. 29 shows the four distinct portions of the upper circuit board 227a-227d of the pedestal circuit board assembly 223, positioned in respective wells 232 of the pedestal 222. As previously discussed, each portion or arm 227a-227d includes two sets of through-holes 264a-264d (only one set per arm visible in the Figure, and only 264a called out in the Figure) and also includes a set of sockets 265a-265d (only 265c called out in the Figure) extending from a top surface. A first set of fasteners 332 (only one called out in the Figure) secure each of the portions or arms 227a-227d to the pedestal 222. A second set of fasteners 334 (only one called out in the Figure) may also secure each of the portions or arms 227a-227d to the pedestal 222. As previously noted, the fasteners 332, 334 may be gold-plated high-purity copper to provide good thermal conductivity.

Figure 30:
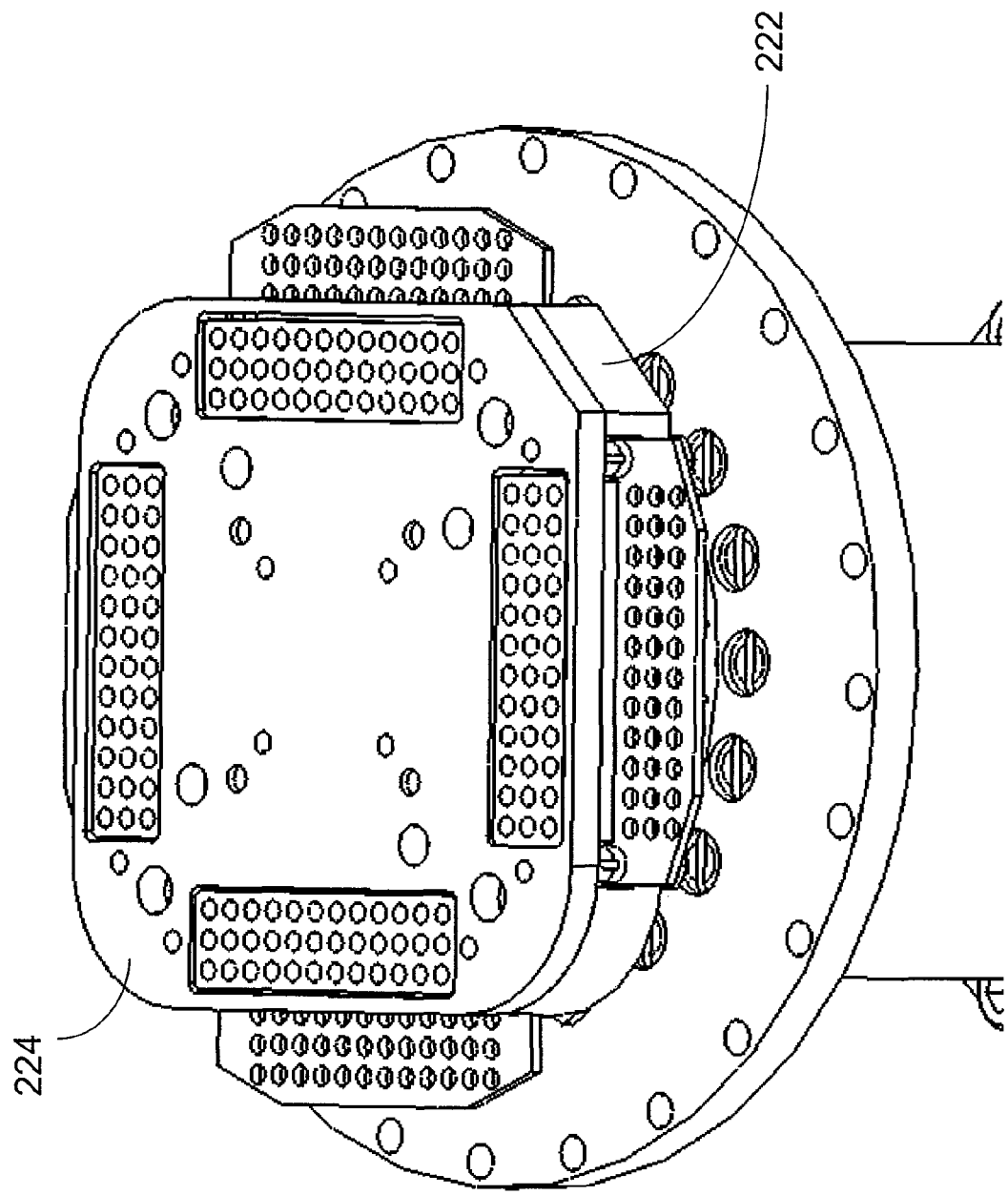
FIG. 30 is an isometric view showing a thermal backplane of the device sample holder assembly positioned over and in contact with the pedestal and upper set of circuit boards according to one illustrative embodiment.

FIG. 30 shows the thermal backplane 224 of the device sample holder assembly 24 positioned over the pedestal 222 and set of distinct portions 227a-227d of the upper circuit board 227.

Figure 31:
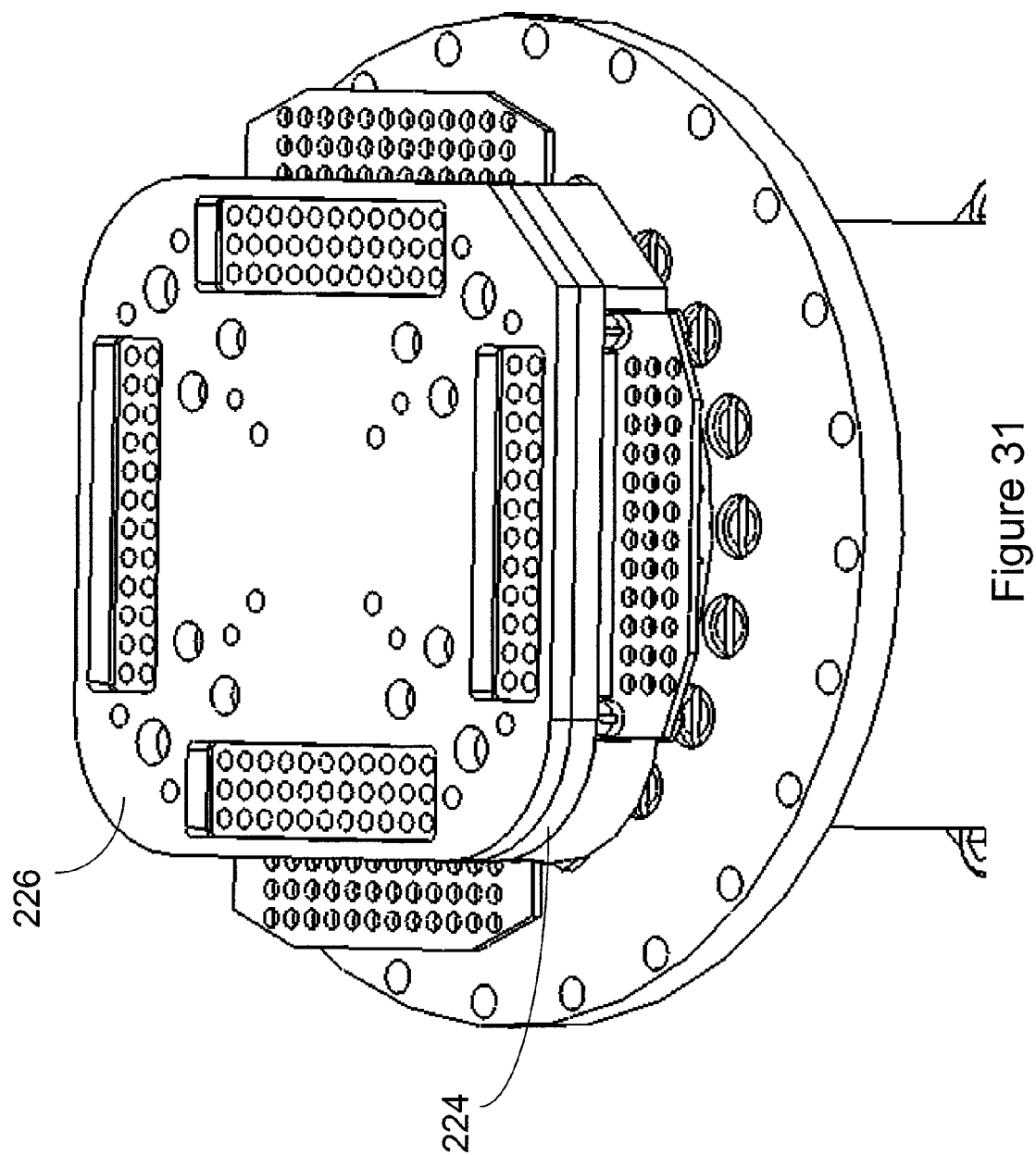
FIG. 31 is an isometric view showing a base of the device sample holder assembly positioned over the thermal backplane according to one illustrative embodiment.

FIG. 31 shows the base 226 positioned over the thermal backplane 224.

Figure 32:
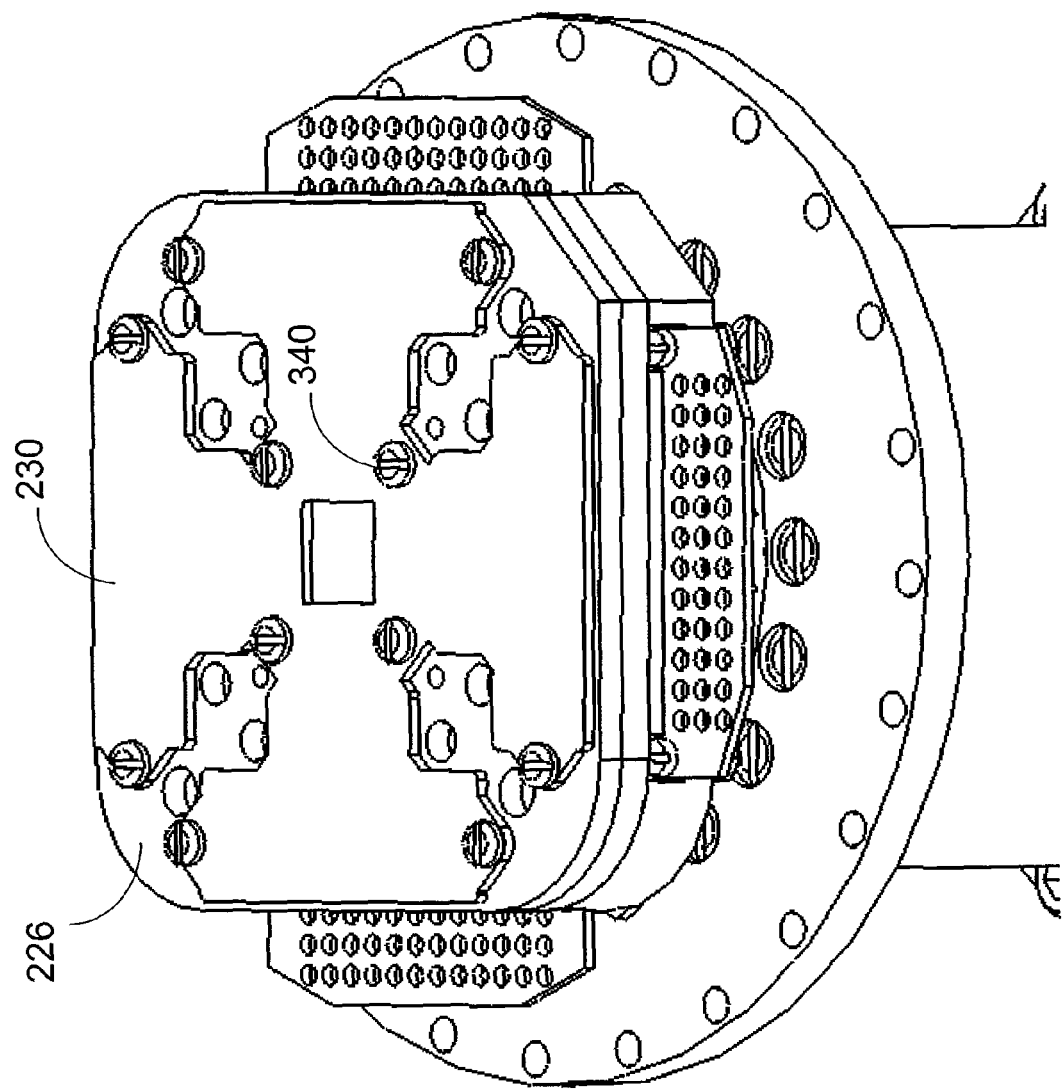
FIG. 32 is an isometric view showing a circuit board of the device sample holder assembly having four portions or arms positioned over the base according to one illustrative embodiment, as well as showing fasteners that secure the circuit board to the thermal backplane.

FIG. 32 shows a device sample holder circuit board 230, having four portions or arms 230a-230d positioned over the base 226. The portions or arms 230a-230d of the device sample holder circuit board 230 are aligned with respective ones of the portions or arms 227a-227d of the upper circuit board 227, such that through-holes of the device sample holder circuit board 230 each align with respective ones of the sockets 265. A number of fasteners 340 (only one called out in the Figure) couple the device sample holder circuit board 230 through the base 226 to the thermal backplane 224 for thermally sinking and mechanically fixing. As previously noted, the fasteners 340 may be gold-plated high-purity copper to provide good thermal conductivity. The headers are already in place at this point and used for alignment with the sockets 265.

Figure 33:
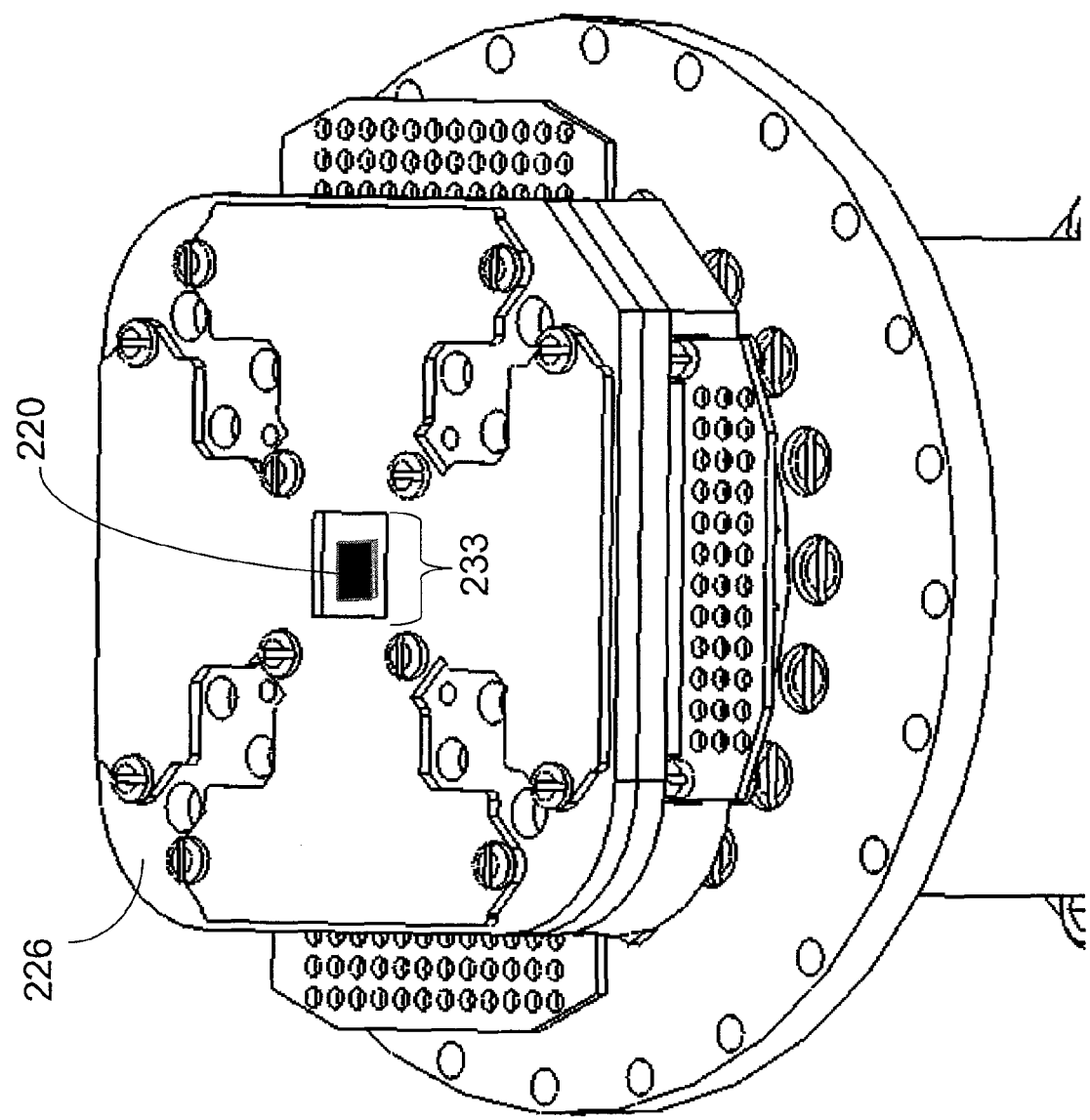
FIG. 33 is an isometric view showing a device sample, for example a superconducting quantum processor, positioned on the base according to one illustrative embodiment.

FIG. 33 shows a device sample 220, for example a superconducting quantum processor, positioned on the base 226 in the opening 233 of the device sample holder circuit board 230. The device sample 220 may be secured, for example, using a varnish, an epoxy, an adhesive, mechanical springs, mechanical clamps, and/or mechanical spring clamps. Any or all of these securing means may provide some thermalization of the device sample 220.

In some embodiments, thermalization of the device sample 220 may be realized, at least in part, by a substantially non-superconducting connection established between the device sample 220 and a substantially non-superconducting metal carried by the device sample holder circuit board 230. For example, a substantially non-superconducitng pad may be carried on the device sample 220, and a substantially non-superconducting metal that has been thermalized (by, for example, a thermalizing bolt or screw that is coupled through the base 226 to the thermal backplane 224) may be carried by the device sample holder circuit board 230. Respective ends of substantially non-superconducting wire may be bonded to the non-superconducting pad carried by the device sample 220 and the thermalized non-superconducting metal carried by the device sample holder circuit board 230, establishing a thermal path therebetween and improving thermalization of the device sample 220.

Figure 34:
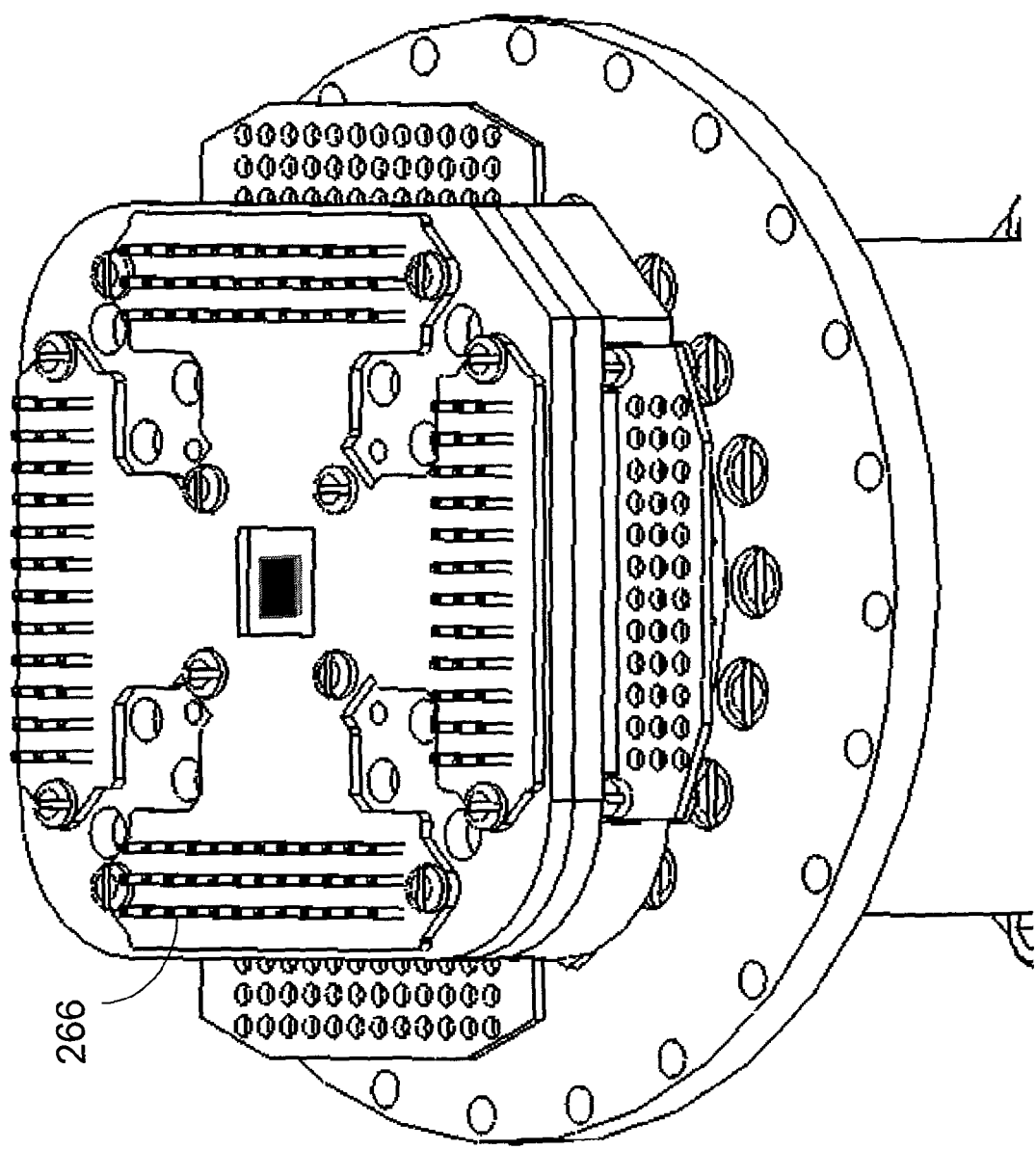
FIG. 34 is an isometric view showing a set of pins extending from an upper surface of the portions or arms of the second circuit board according to one illustrative embodiment.

FIG. 34 shows a respective set of headers or pins 266 (only one called out in the Figure) extending from an upper surface of each of the portions or arms 230a-230d of the device sample holder circuit board 230. As previously noted, the pins 266 extend through the device sample holder circuit board 230 to make electrical contact with respective ones of the sockets 265, which are in turn electrically superconductingly coupled to the through-holes 264 to which the metal powder filter assembly 22 (FIGS. 10A and 10B) is attached (e.g., soldered).

Figure 35:
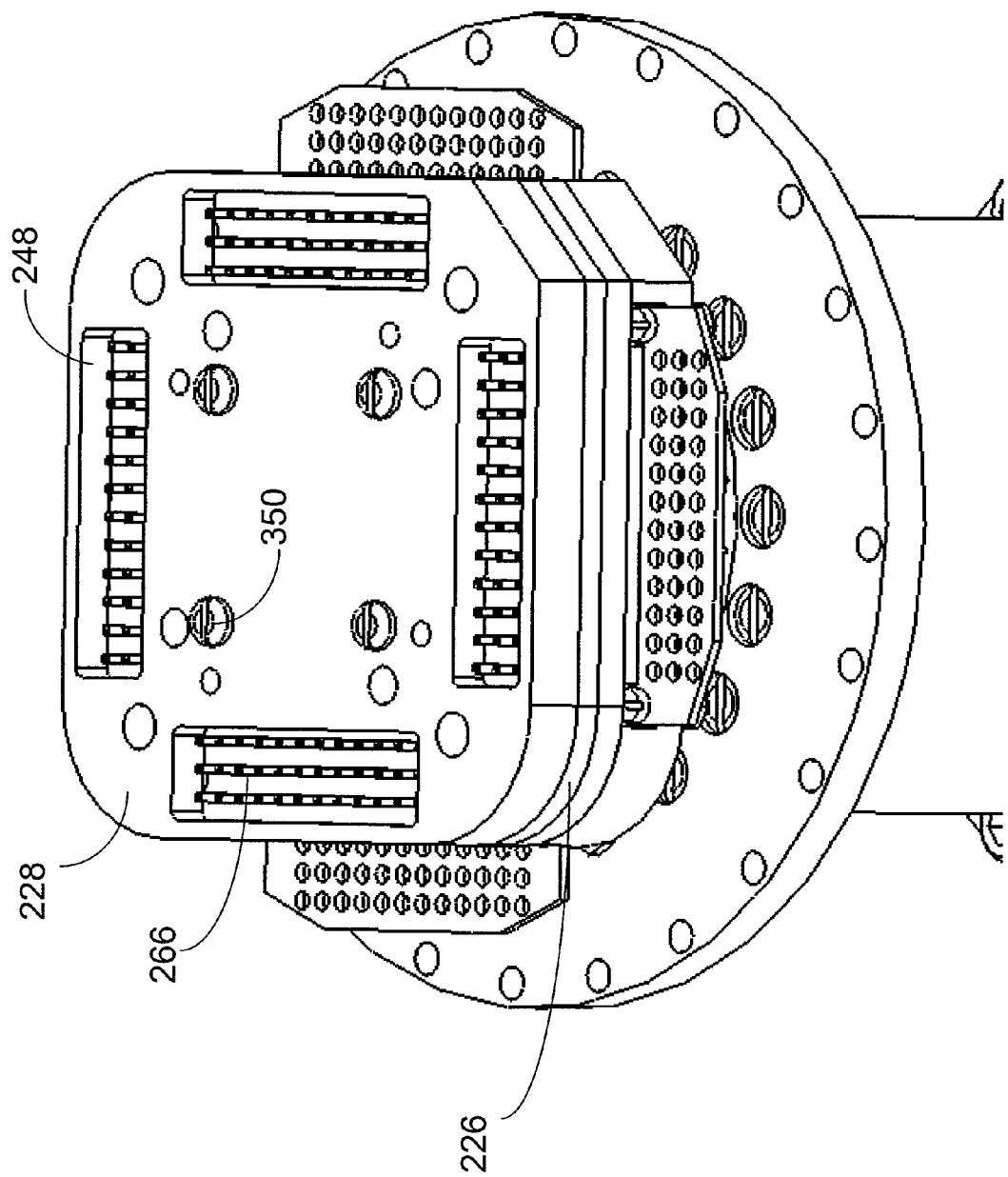
FIG. 35 is an isometric view showing the lid secured over the base and device sample by fasteners according to one illustrative embodiment.

FIG. 35 shows the lid 228 secured to the base 226 by fasteners 350. The slots 248 of the lid 228 are aligned to expose the pins 266 that extend from the upper surface of the device sample holder circuit board 230. The lid 228 fully encloses the device sample holder circuit board 230 and device sample 220, creating an enclosed superconducting shield to provide a stable magnetic environment. The device sample 220 may be enclosed in the three orthogonal directions.

Figure 36:
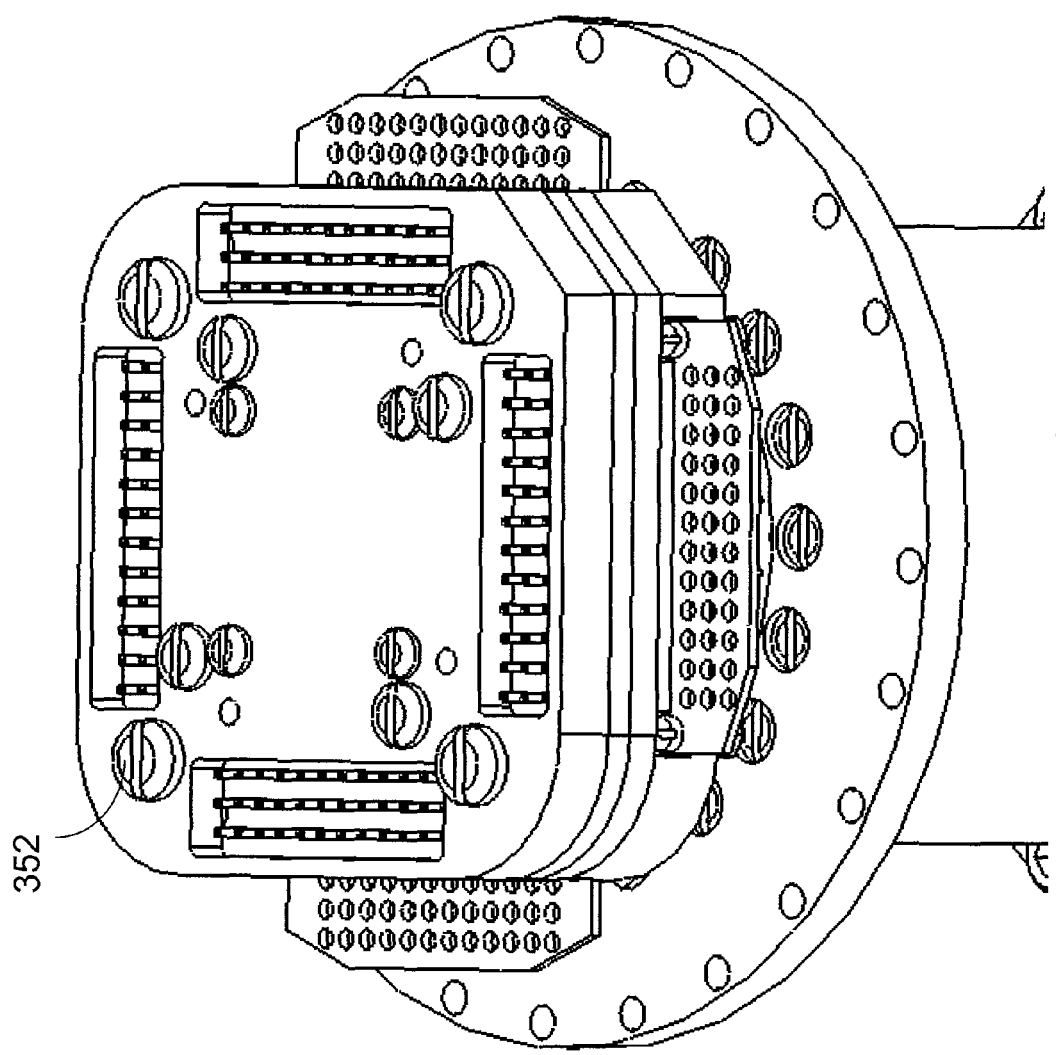
FIG. 36 is an isometric view showing fasteners further securing the various components of the device sample holder assembly to the pedestal according to one illustrative embodiment.

FIG. 36 shows additional fasteners 352 (only one called out in the Figure) securing the device sample holder assembly 24 (e.g., thermal backplane 224, base 226, lid 228, and device sample holder circuit board 230) to the pedestal assembly 23 (e.g., pedestal 222 and pedestal circuit board assembly 223) together, thereby providing a good thermally conductive path therebetween and good seals at the interfaces. As previously noted, the additional fasteners 352 may be gold-plated high-purity copper to provide a good thermally conductive path.

FIG. 37 shows the top hat or cover 280 having a flange 354 secured to the top plate or adapter 320 by fasteners 356 received through fastening holes 328. Alternatively, blind holes can be provided in the lid with bolts entering from below. The top hat or cover 280 may advantageously prevent noise from entering the system. The fasteners 356 are spaced sufficiently close together to ensure good physical contact between the top or adapter plate 320 and the top hat 280, and to ensure a good thermally conductive path. Additionally, as previously noted, the fasteners 356 may be gold-plated high-purity copper to provide good thermal conductivity. The top-hat 280 may optionally contain a feature of a narrow thin tube that allows contained space to be evacuated without allowing E&M noise to enter shielded contained environment. In some embodiments, at least a portion of the top-hat 280 may be filled with a metal powder/epoxy mixture.

An exemplary signal path is described immediately below. Other signal paths are possible.

Cables 201 enter the refrigerated environment 12 (FIG. 1) and come through the 1K connection box 18, after which the wires 204 in the cables 201 become superconducting.

The cables 201 are split into two groups (e.g., seventy-two cables per group), which are referenced herein as main arteries for convenience. Each of the main arteries passes down a respective large groove 302 on the outer surface of the lumped element filter assembly 20 (FIGS. 2 and 3B). The individual cables 201 then fan out, and wrap around the metal powder filter assembly 22 (FIG. 2) for thermalization (i.e., good thermal conduction). Adhesive tape may hold the cables 201 against the metal powder filter assembly 22. Underneath the adhesive tape, the cables 201 are grouped into sets (e.g., twenty-two per set), the cables in each set corresponding to a respective one of the lumped element filters 26 (e.g., twenty-two per plate) carried by each of the lumped element filter plates 30a-30f (FIG. 3A).

The cables 201 are then routed back toward the lumped element filter assembly 22, fitted in the smaller grooves 302 (FIG. 3B). As the cables 201 travel up the small groove 302, they enter into the lumped element filter plates 30a-30f one by one via holes 301 (FIG. 3B). Each cable 201 is soldered to a dielectric medium substrate 40 of a respective one of the lumped element filters 26 (FIGS. 3B and 4). The signal is transferred radially inward, through the superconducting aluminum air core inductors 42 (FIG. 4).

The filtered signal output by the lumped element filters 26 is picked up by cables 201 that extend downward through the central passage 34 of the lumped element filter assembly 20. Each of the cables 201 is routed via the ground circuit board 110 (FIG. 7) to a respective one of the longitudinal passages 60 of the metal powder filter assembly 22. The superconducting wires 204 in the cables 201 pass through respective ones of the metal powder filter structures in the longitudinal passages 60, which further filters the signals (FIG. 10C-10E).

The wires emerge from the metal powder filter assembly 22 into cables 201 which are electrically coupled to the lower and upper circuit boards 225, 227, respectively, of the pedestal circuit board assembly (FIG. 13B). The upper circuit board 227 is electrically coupled to the device sample holder circuit board 230. The device sample holder circuit board 230 may be electrically coupled to the device sample 220 via wire bonds.

In some embodiments, electrical signals that are coupled to the device sample 220 may subsequently be coupled from device sample 220 by a return path that is distinct from the input path. In some embodiments, the device sample 220 may be electrically coupled via wire bonds to return paths carried by the device sample holder circuit board 230, and return signals may be coupled from device sample holder circuit board 230 to return paths carried by at least one of the lower and upper circuit boards 225 and 227. Return signals may then be coupled into the pedestal 222, where the return signals may be effectively grounded. Thus, in some embodiments it can be advantageous to ensure that return signals are carried away from the device sample holder assembly 24 before being grounded; otherwise, return signals that are coupled into the lid 228 and/or base 226 of the device sample holder assembly 24 may produce unwanted noise in the environment of the device sample 220.

As an alternative, some embodiments may employ just a superconducting wire with an appropriate cladding or sheathing as a low-pass filter. High frequency components run on the surface of a superconducting wire due to the skin-depth effect. The high frequency components of the signal could be dissipated in a resistive or grounded cladding or sheathing. For example, a niobium superconductor may carry the DC component of the signal, while a resistive (i.e., non-superconducting) material (e.g., copper nickel) may dissipate the high frequency components.

In some embodiments, the metal powder filters may be replaced by an RF shield, providing higher density. In some embodiments, coaxial filters may be passed through a signal large hole in a metal powder filter assembly, rather than through individual passages 60. Some embodiments may employ different materials for the metal powder filter assembly 22. For example, some embodiments may employ an epoxy, for instance a metal powder/epoxy mixture to form an assembly similar to portions 28a and 28b. Other epoxies and/or powders may be employed, as long as the signal line is coupled (e.g., inductively, capacitively, etc.) to the dissipative powder particles. Some embodiments may seal the base with plugs (e.g., TEFLON plugs), or may use the coaxial filter itself to seal the base. Some embodiments may seal the base with a circuit board, either soldered directly to the base or with by soldering stronger wires to the coil tips to reinforce the connections. Some embodiments may employ heavier wire or may basket-weave the wire through one or more thin circuit boards to keep the wires centered in the passages. Some embodiments may place the loss on high density flexible circuit board wires. Some embodiments may employ tungsten or a similar material (e.g., very low $T_c$—intrinsically lossy, where $T_c$ looks like a normal metal at and above approximately 1 GHz). Some embodiments may employ lithography using high $T_c$ wiring as a solution.

The above described embodiments provide superconducting electrical connections while also providing high thermal conductivity between the various components, even though materials at superconducting temperatures are typically thermally insulating or have poor thermal conductivity. There is essentially little or no convection, and while there is some radiation, conduction is the principal means of heat transfer in the system. A variety of approaches and structures are utilized to realize such characteristics. For example, all contacting surfaces may be lapped and polished to enhance thermal conductivity and enable complete electrically conductive enclosure. Contacting surfaces may also be gold-plated (ASTM B 488, Type II, Grade A, Class 2) to further enhance thermal conductivity.

Advantageously, the various components, including the electronics, exclude the use of substantially ferromagnetic materials. Thus, there is no use of steel fasteners, nickel or chrome plating, or stainless steel. It is noted that copper nickel is paramagnetic and may be used. Thus, throughout this specification and the appended claims, the term "non-magnetic" is used to describe a material that is substantially non-ferromagnetic. Materials should have no or minimal iron impurities. For example, capacitors may be ceramic while inductors may be custom-made air-core aluminum wire inductors. Aluminum coils may be particularly difficult to solder. Consequently, it may be advantageous to employ ultrasonic soldering or use of an aggressive flux in soldering techniques to create a good superconducting joint.

Low temperature glues may be employed, for example Emerson and Cummings 1266 or 2850ST glues.

Some embodiments may employ cooling fins, for example, with gold or gold-plated connections for transferring heat thereto. In some embodiments, gold-plating may, for example, have a thickness of approximate 1.5-2.5 microns.

Some embodiments may employ resistive wiring (e.g. superconducting material such as Niobium with a non-superconducting cladding such as copper and/or copper nickel) to provide some filtering, thereby reducing the need for discrete filters such as the lumped element filter structures 20 and/or metal powder filter structures. The use of coaxial cables both as lead-in inputs to the lumped element filters 26, as well as the use of coaxial shields on the lines between various stages (e.g., lumped element filter assembly 20, metal powder filter assembly 22, pedestal assembly 23, and/or device sample holder assembly 24) may advantageously reduce cross talk. Some embodiments may, however, employ twisted pair wire. Some embodiments may provide for some or all the filtering to occur on the device sample 220. Some embodiments may locate the metal powder filters before the lumped element filtering in the signal path. Some filters may be located in the 1K connection box 18 (FIG. 1).

Some embodiments may employ differential wiring.

In some embodiments, signal lines or cables 201 may be realized by conductive traces on at least one printed circuit board, such as a flexible printed circuit board. Further details on I/O systems implementing flexible printed circuit boards may be found in U.S. Provisional Application Ser. No. 60/981,764, filed 22 Oct. 2007, entitled "Systems, Methods and Apparatus for Electronic Filters," and U.S. Provisional Patent Application Ser. No. 60/988,708 filed 16 Nov., 2007 and entitled "Modular Input/Output System and Devices Incorporating Printed Circuit Board Components."

The lumped element filtering may employ a superconducting printed circuit board process, differential filtering with back-to-back boards or twisted pair inductors.

Some embodiments may employ on- or near-device sample control, for example, moving some or all of the room temperature electronics to the device sample 220 or some other refrigerated component or section (e.g., 77K section, 4K section, etc.). Further descriptions of such systems are found in U.S. patent application Ser. No. 11/950,276. Such may also eliminate or reduce the amount of room temperature wires or cable. Such may advantageously reduce noise levels and consequently reduce the need for filtering. Some embodiments may employ laser emblazon to attach the device sample 220, in lieu of wire bonding. Some embodiments may employ flip-chip techniques, for example a ball grid array or solder bumps to attach the device sample 220 or a separate control chip, in lieu of wire bonding. Some embodiments may employ a separate control chip. Some embodiments may use flexible fingers or prongs or spring contacts (e.g., pre-stressed metal prongs) to make attachments. The device sample and a separate control chip may be connected using a plug-in socket and pin approach, similar to the 2-prong fork and stick approach described above, or at least one zero insertion force socket. Some embodiments may employ probe cards. Such may include a keyed location for the device sample in a twenty-four probe card arrangement. Device samples may be thermalized using metallization of the back or the device sample and/or a plurality of needle contacts (e.g., gold tipped needles). Probe card based device sample packaging may employ Tungsten-Rhenium alloys for the needles. Circuit boards in the device sample holder assembly 24 may be formed from a variety of materials, and insulator thickness may be minimized by using a circuit board made of metal rather than resistive or insulative material (e.g., metal substrate with insulated components formed or placed thereon.) The device sample holder assembly may be composed of multiple layers of superconducting materials, thermalizing (i.e., highly thermally conductive) material. Plated layers may be employed and/or multiple components may be combined into one layer, thereby reducing complexity and the total number of layers.

Throughout this specification and the appended claims, reference is often made to a refrigeration system, such as refrigeration system 12. As previously discussed, refrigeration system 12 may include a dilution refrigerator. In various embodiments, refrigeration system 12 may include at least one component selected from the group consisting of: pulse tube cryocoolers, cryogenic cycle refrigerators, adsorption pumps, gas-gap heat switches, evaporation pots, condensation surfaces, liquid helium-3 coolant, liquid helium-4 coolant, and a mixture of liquid helium-3 coolant and liquid helium-4 coolant. In some embodiments, the present systems, methods and apparatus may be combined with the refrigeration systems described above. In other embodiments, the present systems, methods and apparatus may be used with other forms of refrigeration systems.

As will be apparent to those skilled in the art, the various embodiments described above can be combined to provide further embodiments. Aspects of the present systems, devices, and methods can be modified, if necessary, to employ systems, methods, apparatus and concepts of the various patents, applications and publications to provide yet further embodiments of the systems, devices, and methods. For example, the various systems, devices, and methods may include a different number of metal or dielectric layers than set out in the illustrated embodiments, such as three or more metal layers and two or more insulating dielectric layers alternating with the metal layers, the layers may be disposed in a different order or area, or the embodiments may omit some elements, and/or employ additional elements.

All of the U.S. patents, U.S. patent application publications, U.S. patent applications, foreign patents, foreign patent applications and non-patent publications referred to in this specification including, but not limited to: U.S. Provisional Patent Application Ser. No. 60/881,358, filed Jan. 18, 2007, entitled "Input/Output System And Devices For Use With Superconducting Based Computing Systems"; U.S. Pat. No. 6,838,694; US Patent Publication No. 2005-0082519; US Patent Publication No. 2006-0225165; U.S. Provisional Patent Application Ser. No. 60/872,414, filed Jan. 12, 2007, entitled "System, Devices and Methods for Interconnected Processor Topology"; U.S. Provisional Patent Application Ser. No. 60/956,104, filed Aug. 16, 2007, entitled "Systems, Devices, And Methods For Interconnected Processor Topology"; U.S. Provisional Patent Application Ser. No. 60/986,554, filed Nov. 8, 2007, entitled "Systems, Devices and Methods for Analog Processing"; US Patent Publication No. 2006-0225165; US Patent Publication No. 2006-0147154; U.S. Provisional Application Ser. No. 60/981,764, filed 22 Oct. 2007, entitled "Systems, Methods and Apparatus for Electronic Filters"; U.S. Provisional Patent Application Ser. No. 60/988,708 filed Nov. 16, 2007, entitled "Modular Input/Output System and Devices Incorporating Printed Circuit Board Components"; U.S. patent application Ser. No. 11/950,276; and U.S. Nonprovisional Patent Application Ser. No. 12/016,709, filed Jan. 18, 2008 and entitled "SYSTEMS, METHODS, AND APPARATUS FOR ELECTRICAL FILTERS" are incorporated herein by reference, in their entirety and for all purposes. Aspects of the embodiments can be modified, if necessary, to employ systems, circuits and concepts of the various patents, applications and publications to provide yet further embodiments.

These and other changes can be made to the present systems, devices, and methods in light of the above description. In general, in the following claims, the terms used should not be construed to limit the systems, devices, and methods to the specific embodiments disclosed in the specification and the claims, but should be construed to include all possible embodiments along with the full scope of equivalents to which such claims are entitled. Accordingly, the systems, devices, and methods are not limited by the disclosure, but instead its scope is to be determined entirely by the following claims.

We claim:

1. An input/output system for use with a superconducting device sample, the input/output system comprising:
    a number of superconducting lumped element filters;
    a number of metal powder filters;
    a pedestal;
    a device sample holder selectively mountable to and dismountable from the pedestal, wherein at least a portion of the device sample holder is superconductingly electrically coupled to the superconducting device sample; and
    a first set of electrical signal paths, wherein at least a portion of each of the electrical signal paths is superconducting and each of the electrical signal paths in the first set of electrical signal paths passes through at least one of the superconducting lumped element filters and through at least one of the metal powder filters, and each of the electrical signal paths provides electrical communication with at least a portion of the superconducting device sample.

2. The system of claim 1 wherein the superconducting device sample includes a superconducting processor.

3. The system of claim 2 wherein the superconducting processor includes a superconducting quantum processor.

4. An input/output system for use with a superconducting device sample in a refrigeration system, the input/output system comprising:
    a first set of electrical signal paths, wherein at least a portion of each of the electrical signal paths is formed by a material that is superconducting below a critical temperature and at least a portion of each of the electrical signal paths is thermally conductively coupleable to a cold surface in the refrigeration system;
    at least one filter assembly that filters a range of electrical signal frequencies, wherein each of the electrical signal paths in the first set of electrical signal paths passes through and is filtered by the at least one filter assembly and wherein at least a portion of the at least one filter assembly is thermally conductively coupleable to a cold surface in the refrigeration system; and
    a support structure that provides thermalization of the superconducting device sample, wherein the support structure includes a non-superconducting portion and a superconducting printed circuit board carried on and thermally conductively coupled to the non-superconducting portion, wherein each of the electrical signal paths in the first set of electrical signal paths is superconductingly electrically coupled to the superconducting printed circuit board of the support structure, and wherein the superconducting device sample is superconductingly electrically coupled to the superconducting printed circuit board of the support structure and the superconducting device sample is thermally conductively coupled to the non-superconducting portion of the support structure, and wherein the non-superconducting portion of the support structure is thermally conductively coupleable to a cold surface in the refrigeration system.

5. The system of claim 4 wherein the at least one filter assembly includes at least one superconducting filter device that provides lumped element filtering.

6. The system of claim 5 wherein the at least one superconducting filter device that provides lumped element filtering is included in a first filter assembly, and wherein the at least one filter assembly includes a second filter assembly comprising at least one superconducting filter device that provides metal powder filtering.

7. The system of claim 6 wherein each superconducting filter device in the first filter assembly is superconductingly electrically coupled in series with a respective superconducting filter device in the second filter assembly.

8. The system of claim 5 wherein the at least one superconducting filter device that provides lumped element filtering comprises:
    a dielectric medium including a first face and a second face;
    at least one superconducting inductor;
    a continuous superconducting signal path that includes at least one superconducting trace on the first face of the dielectric medium, wherein the at least one superconducting inductor is superconductingly coupled in series with the continuous superconducting signal path such that the continuous superconducting signal path includes the at least one superconducting inductor;
    at least one capacitor coupled in parallel with the continuous superconducting signal path; and
    a ground signal path carried by the second face of the dielectric medium;

wherein the dielectric medium, the at least one superconducting trace, the at least one superconducting inductor, the at least one capacitor, and the ground signal path each include substantially non-magnetic materials.

9. The system of claim 4 wherein the at least one filter assembly includes at least one superconducting filter device that provides metal powder filtering.

10. The system of claim 9 wherein the at least one superconducting filter device that provides metal powder filtering comprises:
- a longitudinal passage extending through at least a portion of a substantially non-superconducting, substantially non-magnetic metal;
- a conductive wire that is superconducting below a critical temperature received in the longitudinal passage; and
- an epoxy mixture comprising an epoxy and a metal powder that is substantially non-superconducting and substantially non-magnetic, wherein at least a portion of the longitudinal passage is filled with the epoxy mixture and the conductive wire is secured in place by the epoxy mixture inside the longitudinal passage.

11. The system of claim 4 wherein the superconducting device sample includes a superconducting processor.

12. The system of claim 11 wherein the superconducting processor includes a superconducting quantum processor.

13. The system of claim 4 wherein the at least one filter assembly provides at least one of lumped element filtering and metal powder filtering.

14. The system of claim 13 wherein the at least one filter assembly provides both lumped element filtering and metal powder filtering.

15. The system of claim 4, further comprising:
- a pedestal formed of a substantially non-superconducting, non-magnetic material, wherein the pedestal is physically coupleable to a cold surface in the refrigeration system to establish a thermally conductive connection therebetween, and wherein the support structure is selectively mountable to and dismountable from the pedestal.

16. The system of claim 15, further comprising:
- at least one bolt that is substantially non-superconducting and substantially non-magnetic, wherein the at least one bolt is physically coupled to the non-superconducting portion of the support structure, the superconducting printed circuit board, and the pedestal to establish a thermally conductive connection therebetween.

17. The system of claim 4 wherein the support structure further comprises a lid overlying both the superconducting device sample and at least a portion of the superconducting printed circuit board.

18. The system of claim 4 wherein the superconducting device sample is thermally conductively coupled to the non-superconducting portion of the support structure by at least one substance or device selected from the group consisting of: varnish, epoxy, adhesive, mechanical springs, mechanical clamps, and mechanical spring clamps.

19. The system of claim 4, further comprising:
- a second set of electrical signal paths, wherein at least a portion of each of the electrical signal paths is formed by a material that is superconducting below a critical temperature and at least a portion of each of the electrical signal paths is thermally conductively coupleable to a cold surface in the refrigeration system, and wherein each electrical signal path in the second set of electrical signal paths is superconductingly electrically coupled to the superconducting device sample.

20. The system of claim 19 wherein each electrical signal path in the second set of electrical signal paths is superconductingly electrically coupled to the superconducting device sample via the superconducting printed circuit board.

* * * * *